US012051763B2

(12) United States Patent
Hung et al.

(10) Patent No.: US 12,051,763 B2
(45) Date of Patent: Jul. 30, 2024

(54) GERMANIUM-CONTAINING PHOTODETECTOR AND METHODS OF FORMING THE SAME

(71) Applicant: Taiwan Semiconductor Manufacturing Company Limited, Hsinchu (TW)

(72) Inventors: Jyh-Ming Hung, Dacun Township (TW); Tzu-Jui Wang, Fengshan (TW); Kuan-Chieh Huang, Hsinchu (TW); Jhy-Jyi Sze, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/358,257

(22) Filed: Jul. 25, 2023

(65) Prior Publication Data

US 2023/0369360 A1 Nov. 16, 2023

Related U.S. Application Data

(62) Division of application No. 17/227,432, filed on Apr. 12, 2021, now Pat. No. 11,837,613.

(Continued)

(51) Int. Cl.

*H01L 31/18* (2006.01)
*H01L 23/00* (2006.01)

(Continued)

(52) U.S. Cl.

CPC .......... *H01L 31/1808* (2013.01); *H01L 24/08* (2013.01); *H01L 27/1461* (2013.01);

(Continued)

(58) Field of Classification Search

None

See application file for complete search history.

(56) References Cited

U.S. PATENT DOCUMENTS 6,075,253 A * 6/2000 Sugiyama ............. H01L 31/028 257/466
2004/0089914 A1* 5/2004 Mouli ............... H01L 27/14601 257/510

(Continued)

FOREIGN PATENT DOCUMENTS

CN 106229324 A 12/2016
CN 107871794 A * 4/2018 ....... H01L 31/02005

(Continued)

OTHER PUBLICATIONS

Taiwan Patent Office; Application No. 110118880; Office Action mailed Jun. 10, 2022, 9 pages.

(Continued)

*Primary Examiner* — Scott B Geyer
(74) *Attorney, Agent, or Firm* — The Marbury Law Group, PLLC

(57) ABSTRACT

A photovoltaic cell includes a germanium-containing well embedded in a single crystalline silicon substrate and extending to a proximal horizontal surface of the single crystalline silicon substrate, wherein germanium-containing well includes germanium at an atomic percentage greater than 50%. A silicon-containing capping structure is located on a top surface of the germanium-containing well and includes silicon at an atomic percentage greater than 42%. The silicon-containing capping structure prevents oxidation of the germanium-containing well. A photovoltaic junction may be formed within, or across, the trench by implanting dopants of a first conductivity type and dopants of a second conductivity type.

20 Claims, 43 Drawing Sheets

Related U.S. Application Data

(60) Provisional application No. 63/031,933, filed on May 29, 2020.

(51) Int. Cl.
*H01L 27/146* (2006.01)
*H01L 31/103* (2006.01)
*H01L 31/105* (2006.01)

(52) U.S. Cl.
CPC .. *H01L 27/14634* (2013.01); *H01L 27/14643* (2013.01); *H01L 27/14689* (2013.01); *H01L 31/103* (2013.01); *H01L 31/105* (2013.01); *H01L 2224/08145* (2013.01)

(56) References Cited

U.S. PATENT DOCUMENTS

| | | | | |
|---|---|---|---|---|
| 2005/0184354 | A1* | 8/2005 | Chu | H01L 31/101 257/458 |
| 2007/0170536 | A1* | 7/2007 | Hsu | H01L 31/1808 257/458 |
| 2009/0101909 | A1* | 4/2009 | Chen | H01L 31/1808 257/65 |
| 2010/0006961 | A1* | 1/2010 | Yasaitis | H01L 31/18 257/431 |
| 2010/0151619 | A1* | 6/2010 | Yasaitis | H01L 27/1443 438/93 |
| 2011/0037133 | A1* | 2/2011 | Su | H01L 31/1808 257/E31.127 |
| 2011/0049568 | A1* | 3/2011 | Lochtefeld | H01L 21/02381 257/190 |
| 2011/0147870 | A1* | 6/2011 | Ang | H01L 27/1203 257/E31.127 |
| 2012/0025082 | A1* | 2/2012 | Rafferty | H01L 31/03529 257/431 |
| 2013/0001723 | A1* | 1/2013 | Meade | G02B 6/12004 257/E31.127 |
| 2014/0027826 | A1* | 1/2014 | Assefa | H01L 31/022408 257/E27.122 |
| 2016/0211402 | A1* | 7/2016 | Joo | H01L 31/1808 |
| 2018/0090489 | A1* | 3/2018 | Bi | H01L 29/66666 |
| 2018/0090631 | A1* | 3/2018 | Chen | H01L 31/1812 |
| 2018/0261636 | A1* | 9/2018 | Liu | H01L 31/1808 |
| 2018/0358488 | A1* | 12/2018 | Yamashita | H01L 31/02363 |
| 2019/0051691 | A1 | 2/2019 | Hayashi | |
| 2020/0075792 | A1* | 3/2020 | Zhu | H01L 31/105 |
| 2021/0058042 | A1* | 2/2021 | Na | H03F 3/085 |
| 2021/0249464 | A1* | 8/2021 | Hsu | H01L 31/02363 |
| 2021/0320217 | A1* | 10/2021 | Levy | H01L 31/028 |
| 2021/0351306 | A1* | 11/2021 | Adusumilli | H01L 31/107 |

FOREIGN PATENT DOCUMENTS

| | | |
|---|---|---|
| KR | 2013-0052986 | 5/2013 |
| KR | 2020-0012816 | 2/2020 |
| TW | 201351621 A | 12/2013 |
| TW | 201904042 A | 1/2019 |

OTHER PUBLICATIONS

Korean Patent and Trademark Office, Application No. 10 2021 0069444, First Examination Report mailed Jan. 18, 2023, 5 pages.

* cited by examiner

GERMANIUM-CONTAINING PHOTODETECTOR AND METHODS OF FORMING THE SAME

RELATED APPLICATIONS

This application is a divisional application of U.S. application Ser. No. 17/227,432 entitled "Germanium-Containing Photodetector and Method of Forming the Same," filed on Apr. 12, 2021, which claims priority to U.S. Provisional Patent Application No. 63/031,933 entitled "Germanium-Containing Photodetector and Method of Forming the Same," filed on May 29, 2020, the entire contents of both of which are hereby incorporated by reference for all purposes.

BACKGROUND

Semiconductor image sensors may be used to sense electromagnetic radiation such as visible range light, infrared radiation, and/or ultraviolet light. Complementary metal-oxide-semiconductor (CMOS) image sensors (CIS) and charge-coupled device (CCD) sensors may be used in various applications such as digital cameras or cameras integrated in mobile devices. These devices utilize an array of pixels (which may include photodiodes and transistors) to detect radiation using photogeneration of electron-hole pairs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
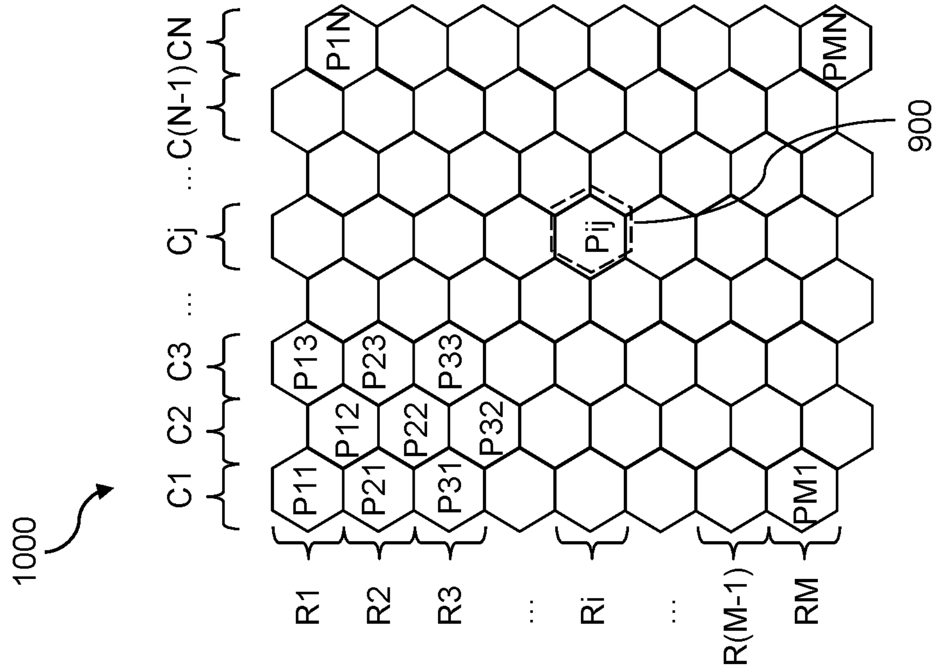
FIG. 1B is a plan view of a second configuration for an array of pixels of an image sensor according to another embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It is presumed that elements having the same reference numeral have a same material composition.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, the structures and methods of the present disclosure may be used to manufacture a germanium-based photodetector and/or an image sensor incorporating array of germanium-based photodetectors. Specifically, the structures and methods of the present disclosure may be used to manufacture a germanium-based photodetector formed on a silicon substrate, i.e., a germanium-in-silicon (GiS) photodetector and/or an image sensor including an array of GiS photodetectors. Such a photodetector or an image sensor may provide high quantum efficiency at near-infrared (NIR) spectrum for various sensing applications.

Generally, silicon-based photodetectors display low sensitivity in the infrared range due to low quantum efficiency. Silicon-based photodetector provides poor optical performance in wavelength ranges greater than 1,000 nm due to low absorption of photons. Germanium provides higher absorption of photons in infrared wavelength ranges, but manufacture of complementary metal oxide semiconductor (CMOS) devices on a germanium substrate pose many challenges.

According to an aspect of the present disclosure, a germanium-based photodetector may be formed within a silicon substrate to provide use of standard CMOS manufacturing processes on the silicon substrate. According to an aspect of the present disclosure, a germanium-containing material portion including germanium or a silicon-germanium alloy may be passivated by enclosing walls of a silicon substrate around a trench, and by an overlying silicon-containing capping structure, which may include silicon nitride or crystalline silicon.

Embodiments of the present disclosure provide a controlled height for the germanium-containing material portion relative to a top surface of silicon substrate. For example, a dielectric material layer may be formed with a controlled thickness, and a chemical mechanical planarization may be used to form the germanium-containing material portion with a top surface at the height of the top surface of the dielectric mask layer. The germanium-containing material portion may be formed in a crystalline phase. The germanium-containing material portion may be single crystalline with epitaxial alignment with the single crystalline silicon material in the silicon substrate. In some embodiments, selective epitaxial growth process may be used to maintain epitaxial alignment between the germanium-containing material portion and the single crystalline silicon material of the silicon substrate.

The silicon-containing capping structure may include silicon. In one embodiment, the silicon material of the silicon-containing capping structure may be formed as a single crystalline silicon material to enhance effectiveness as a passivation structure, i.e., as a diffusion barrier structure. Alternatively, the silicon-containing capping structure may include silicon nitride.

Figure 1A:
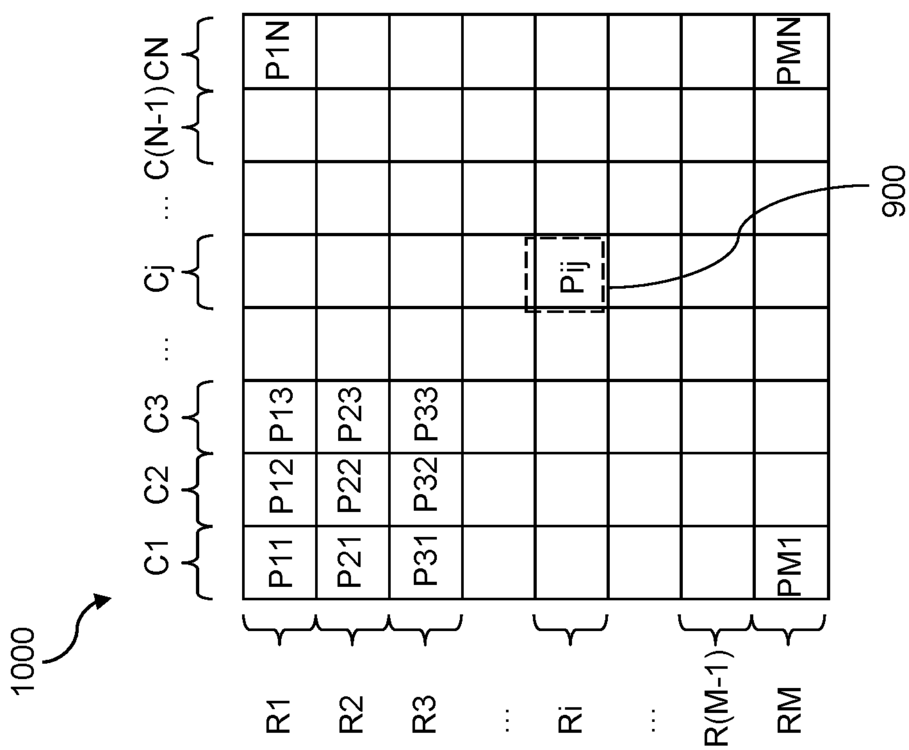
FIG. 1A is a plan view of a first configuration for an array of pixels of an image sensor according to an embodiment of the present disclosure.

FIG. 1A is a plan view of a first configuration for an array of pixels of an image sensor according to an embodiment of the present disclosure. FIG. 1B is a plan view of a second configuration for an array of pixels of an image sensor according to another embodiment of the present disclosure. Referring to FIGS. 1A and 1B, a first configuration for an array 1000 of pixels 900 of an image sensor and a second configuration of an array 1000 of pixels 900 of an image sensor are illustrated in a respective plan view. The image sensor may be a backside illuminated (BSI) image sensor device. However, for simplicity, embodiments of the disclosure are discussed as used in a front-side illuminated (FSI) image sensor.

Each pixel 900 represents a smallest unit area for the purpose of generating an image from the image sensor. The region including the array 1000 of pixels 900 is herein referred to as a pixel array region. The pixels 900 in the pixel array region may be arranged in rows and columns. For example, the pixel array region may include M rows and N columns, in which M and N are integers in a range from 1 to 216, such as from 28 to 214. The rows of pixels 900 may be consecutively numbered with integers that range from 1 to M, and the columns of pixels 900 may be consecutively numbered with integers that range from 1 to N. A pixel $P_{ij}$ refers to a pixel 900 in the i-th row and in the j-th column.

Each pixel 900 includes at least one photodetector that is configured to detect radiation of a given wavelength range. Each pixel 900 may include a plurality of photodetectors configured to detect radiation of a respective wavelength range, which may be different from each of the plurality of photodetectors. In one embodiment, each pixel 900 may include a plurality of subpixels, each of which including a respective combination of a photodetector and an electronic circuit configured to detect radiation that impinged into the photodetector. For example, a pixel 900 may include a subpixel configured to detect radiation in a red wavelength range (such as a range from 635 nm to 700 nm), a subpixel configured to detect radiation in a green wavelength range (such as a range from 520 nm to 560 nm), and a subpixel configured to detect radiation in a blue wavelength range (such as a range from 450 nm to 490 nm). Such subpixels are referred to as a red subpixel, green subpixel, and a blue subpixel, respectively.

Generally, a pixel 900 generates information regarding the impinging radiation for a unit detection area. A subpixel generates information regarding the intensity of the impinging radiation within a specific wavelength range as detected within a region of the unit detection area. A monochromatic pixel 900 may include only a single subpixel. A pixel 900 configured to detect spectral distribution of impinging radiation includes multiple subpixels having at least two different detection wavelength ranges. Photodetectors in a pixel array region may include photodiodes, complimentary metal-oxide-semiconductor (CMOS) image sensors, charged coupling device (CCD) sensors, active sensors, passive sensors, other applicable sensors, or a combination thereof.

A subpixel within an image sensor may be formed using a germanium-containing well formed within a single crystalline silicon substrate as will be described below. While various exemplary structures described below describe only a single subpixel region including a photodetector region including a single germanium-based photodetector and a sensing circuit region containing a sensing circuit for the germanium-based photodetector, it is understood that multiple instances of the subpixel region may be arranged to provide a two-dimensional array of subpixels for an image sensor. Further, it is understood that additional subpixels, such as subpixels that include silicon-based photodetectors, may be optionally incorporated into the image sensor. Thus, embodiments in which instances of the various exemplary structures are multiplied to provide an image sensor including an array of pixels are expressly contemplated for each exemplary structure described below.

Figure 2A:
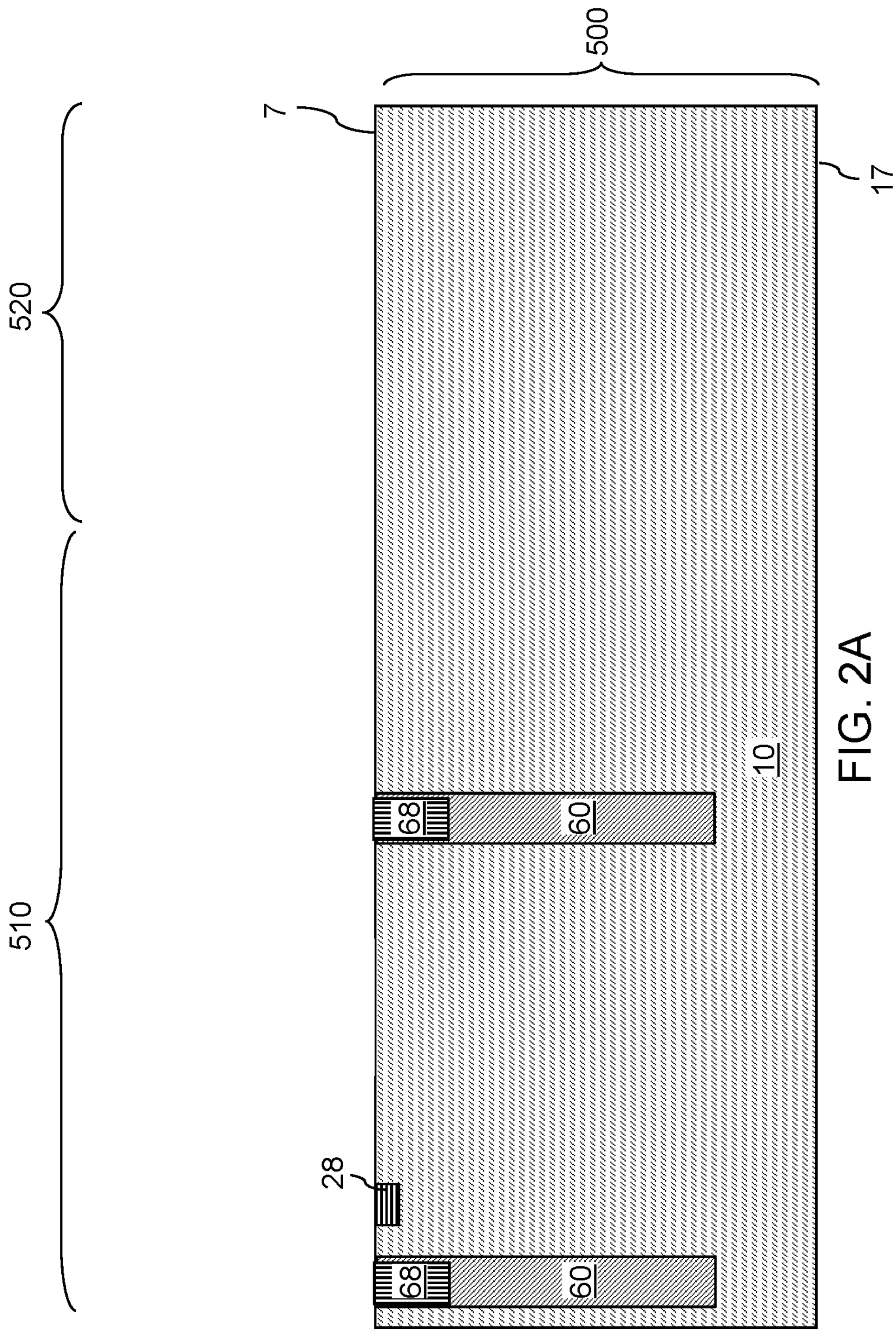
FIG. 2A-2K are sequential vertical cross-sectional views of a first exemplary structure during formation of a pixel of an image sensor according to a first embodiment of the present disclosure.

FIG. 2A-2K are sequential vertical cross-sectional views of a first exemplary structure during formation of a pixel of an image sensor according to a first embodiment of the present disclosure. Referring to FIG. 2A, a first exemplary structure according to a first embodiment of the present disclosure is illustrated. The first exemplary structure includes a semiconductor substrate 500 that includes a single crystalline silicon substrate 10. The single crystalline silicon substrate 10 may have a pair of major horizontal surfaces. The major horizontal surface located on the top side is herein referred to as a proximal horizontal surface 7. The major horizontal surface located on the backside is herein referred to as a distal horizontal surface 17. The single crystalline silicon substrate 10 may be single crystalline, and may have a doping of a suitable conductivity type, which may be p-type or n-type. In one embodiment, the single crystalline silicon substrate 10 may have a doping of a first conductivity type, and may include dopants of the first conductivity type at an atomic concentration in a range from $1.0\times10^{13}/cm^3$ to $1.0\times10^{17}/cm^3$, although lesser and greater dopant concentrations may also be used.

The first exemplary structure includes a photodetector region 510 in which a germanium-base photodetector is to be subsequently formed, and a sensing circuit region 520 in which a sensing circuit for the germanium-based photodetector is to be subsequently formed. In one embodiment, a masked ion implantation processes may be performed to form various doped regions having various depths. For example, a second-conductivity-type doped well 60 having a doping of the second conductivity type may be formed by ion implantation. The second-conductivity-type doped well 60 may be formed to laterally surround an enclosed region of the single crystalline silicon substrate 10. The second conductivity type is the opposite of the first conductivity type. For example, if the first conductivity type is p-type, the second conductivity type is n-type, and vice versa. The depth of the second-conductivity-type doped well 60 may be in a range from 1 micron to 2 microns, although lesser and greater depths may also be used. The second-conductivity-type doped well 60 may include dopants of the second conductivity type at an atomic concentration in a range from $1.0\times10^{15}/cm^3$ to $1.0\times10^{18}/cm^3$, although lesser and greater dopant concentrations may also be used.

Doped well contact regions 68 having a doping of the second conductivity type may be formed in an upper portion of the second-conductivity-type doped well 60 by performing a masked ion implantation process. The doped well contact regions 68 may be heavily doped to reduce contact resistance. The doped well contact regions 68 may include dopants of the second conductivity type at an atomic concentration in a range from $1.0\times10^{19}/cm^3$ to $1.0\times10^{22}/cm^3$, although lesser and greater dopant concentrations may also be used.

A first doped photodiode contact region 28 having a doping of the first conductivity type may be formed under the proximal horizontal surface 7 of the single crystalline silicon substrate 10 within the area enclosed by the second-conductivity-type doped well 60. The first doped photodiode contact region 28 may be heavily doped to reduce contact resistance. The first doped photodiode contact region 28 may include dopants of the first conductivity type at an atomic concentration in a range from $1.0\times10^{19}/cm^3$ to $1.0\times10^{22}/cm^3$, although lesser and greater dopant concentrations may also be used.

Figure 2B:
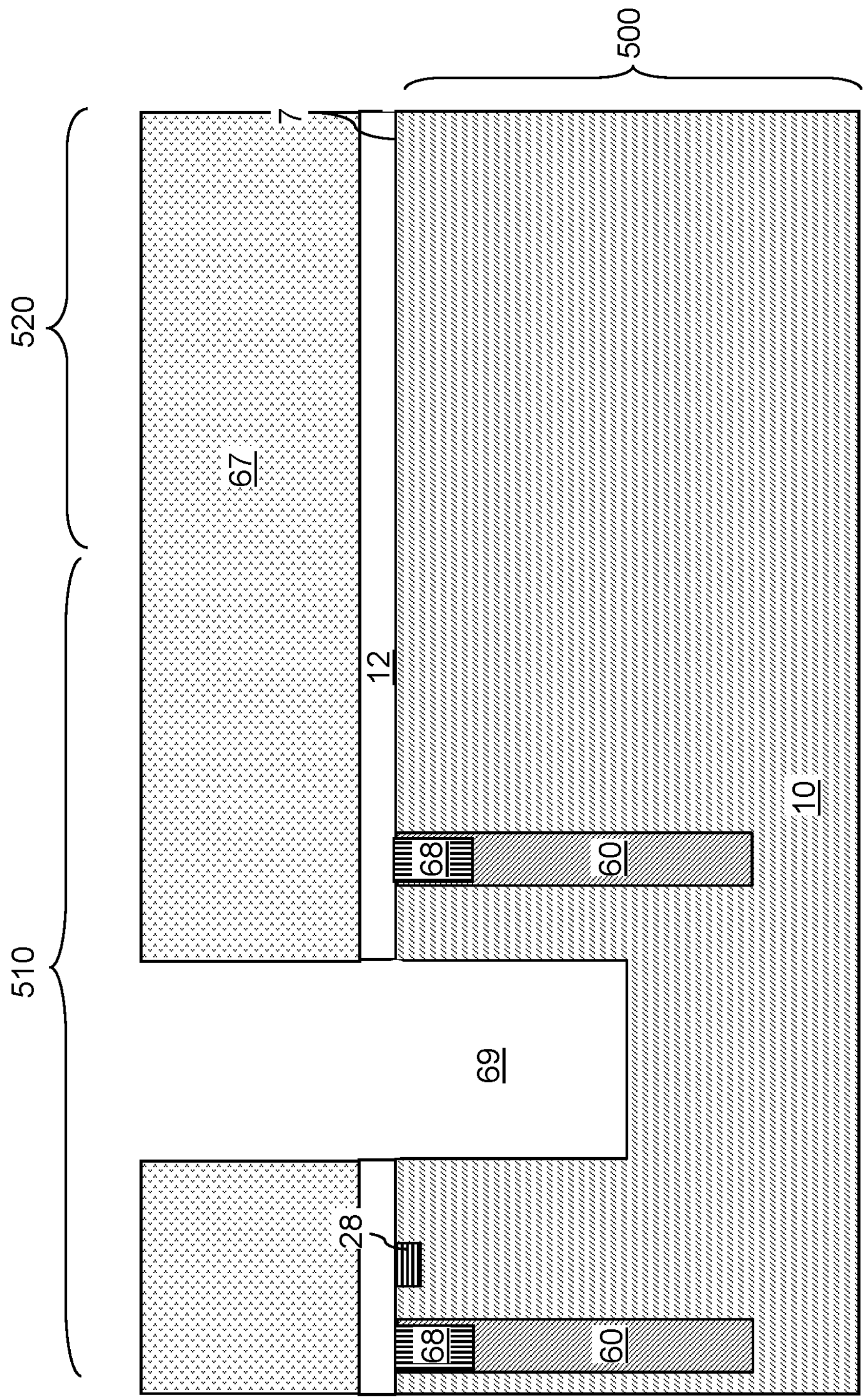

Referring to FIG. 2B, a dielectric mask layer 12 may be formed on the proximal horizontal surface 7 of the single crystalline silicon substrate 10. The dielectric mask layer 12 includes a dielectric material such as silicon oxide. Other suitable materials are within the contemplated scope of disclosure. The dielectric mask layer 12 may be formed by deposition of a silicon oxide layer or by thermal oxidation of a surface of portion of the single crystalline silicon substrate 10. The thickness of the dielectric mask layer 12 may be in a range from 50 nm to 300 nm, such as from 80 nm to 150 nm, although lesser and greater thicknesses may also be used.

A photoresist layer 67 may be applied over the dielectric mask layer 12. The photoresist layer 67 may be lithographically patterned to form an opening within the area laterally enclosed by the second-conductivity-type doped well 60. An anisotropic etch process may be performed to transfer the pattern of the opening in the photoresist layer 67 through the dielectric mask layer 12 and into an upper portion of the single crystalline silicon substrate 10. A trench 69 may be formed in the upper portion of the single crystalline silicon substrate 10. The trench 69 is laterally enclosed by, and is laterally spaced inward from, the second-conductivity-type doped well 60. The depth of the trench 69 may be greater than, the same as, or less than, the depth of the second-conductivity-type doped well 60. In one embodiment, the depth of the trench 69 may be in a range from 0.5 micron to 10 microns, such as from 1 micron to 6 microns, although lesser and greater depths may also be used. The lateral dimension of the trench 69 may be in a range from 0.5 micron to 30 microns, such as from 1 micron to 15 microns, although lesser and greater lateral dimensions may also be used. The lateral dimension of the trench 69 may be the diameter or the major axis of the horizontal cross-sectional shape of the trench 69 in embodiments in which the trench 69 has a circular or an elliptical horizonal cross-sectional shape, or may be the length of a side of a rectangular shape in embodiments in which the horizontal cross-sectional shape of the trench 69 is the rectangular shape. The photoresist layer 67 may be subsequently removed, for example, by ashing.

Figure 2C:
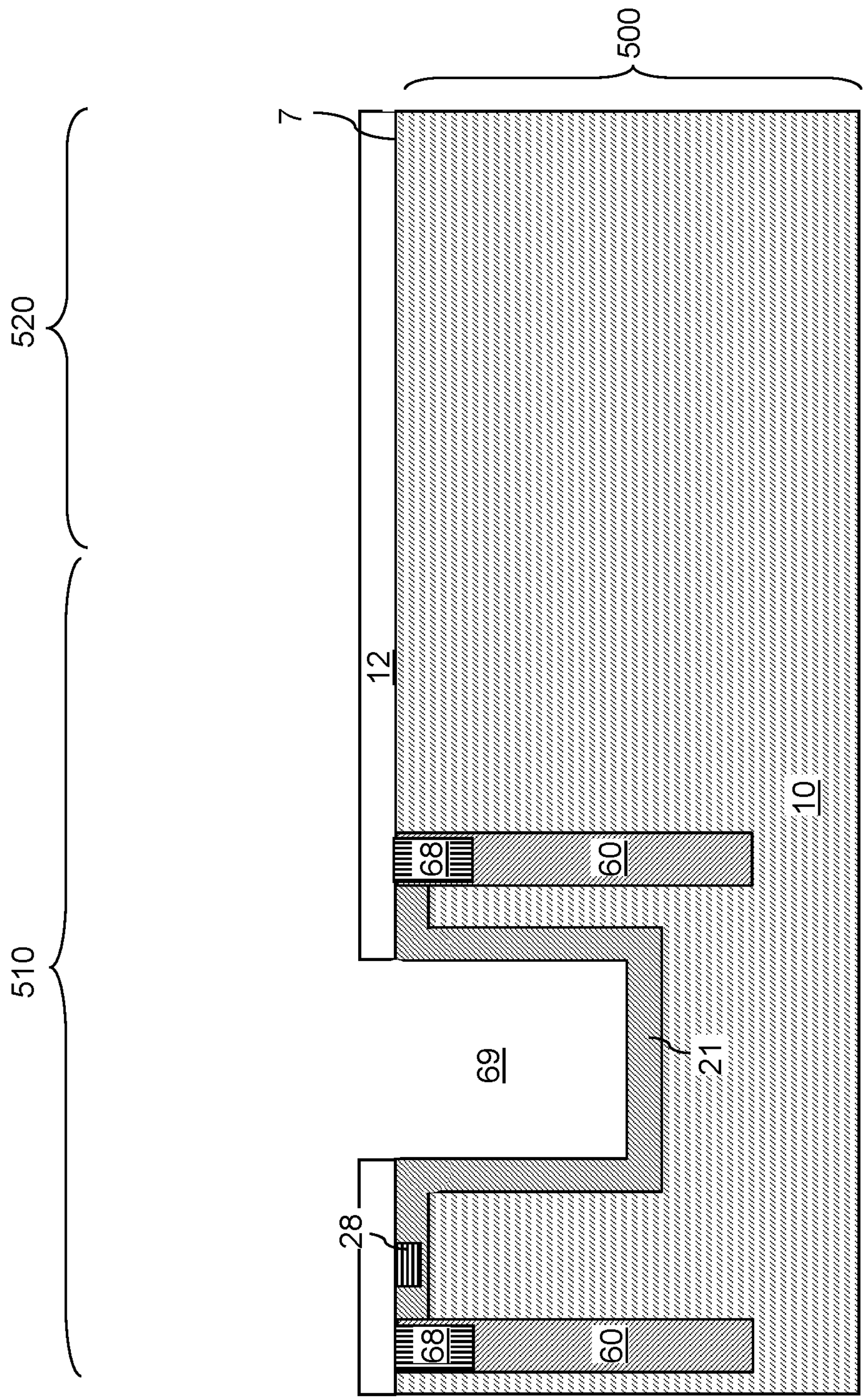

Referring to FIG. 2C, dopants of the first conductivity type may be implanted around the region of the trench 69. The dopants of the first conductivity type are implanted at least within the area laterally enclosed by the second-conductivity-type doped well 60. A multiple angled ion implantation processes may be performed to implant the dopants of the first conductivity type through sidewalls of the trench 69. Further, the dopants of the first conductivity type may be implanted into surface portion of the single crystalline silicon substrate 10 that underlies the proximal horizontal surface 7 of the single crystalline silicon substrate 10. In addition, the dopants of the first conductivity type may be implanted into a horizontal portion of the single crystalline silicon substrate 10 that underlies the bottom surface of the trench 69. A first-conductivity-type silicon region 21 may be formed within the single crystalline silicon substrate 10. The first-conductivity-type silicon region 21 is connected to the first doped photodiode contact region 28, which is the contact region for the first-conductivity-type silicon region 21. The lateral width of the first-conductivity-type silicon region 21 around each sidewall of the trench 69 may be in a range from 100 nm to 1,000 nm, although lesser and greater lateral dimensions may also be used. The thickness of the horizontal portion of the first-conductivity-type silicon region 21 underneath the bottom surface of the trench 69 may be in a range from 100 nm to 1,000 nm, although lesser and greater thicknesses may also be used.

Figure 2D:
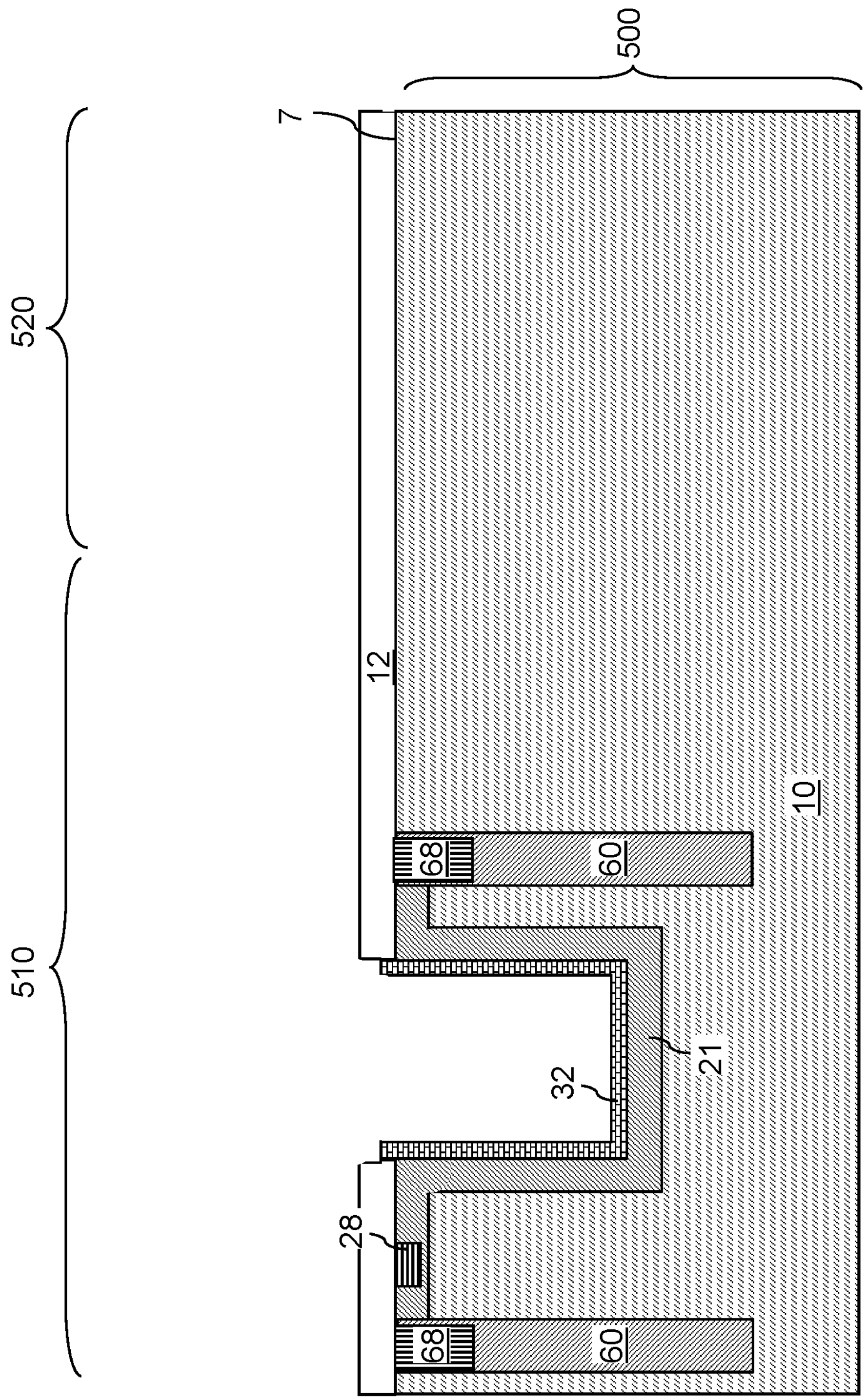

Referring to FIG. 2D, in some embodiments a silicon liner 32 may be optionally grown from physically exposed surfaces of the first-conductivity-type silicon region 21, which are surfaces of the trench 69. The silicon liner 32 may be grown by a selective silicon epitaxy process that grows epitaxial silicon only from physically exposed semiconductor surfaces and does not grow silicon from dielectric surfaces. The silicon liner 32 may include epitaxially grown silicon, i.e., single crystalline silicon in epitaxial alignment with the single crystalline silicon material of the single crystalline silicon substrate 10. The silicon liner 32 may be intrinsic, or may have a low level of doping. For example, the atomic concentration of dopants within the silicon liner 32 may be in a range from $1.0\times10^{13}/cm^3$ to $1.0\times10^{16}/cm^3$, although lesser and greater dopant concentrations may also be used. The conductivity type of the silicon liner 32, in embodiments in which the silicon liner 32 is not intrinsic, may be the first conductivity type or the second conductivity type. The thickness of the silicon liner 32 may be in a range from 5 nm to 200 nm, such as from 10 nm to 100 nm, although lesser and greater thicknesses may also be used. The silicon liner 32, if present, may function as a buffer between a germanium-containing material to be subsequently deposited and the first-conductivity-type silicon region 21.

Figure 2E:
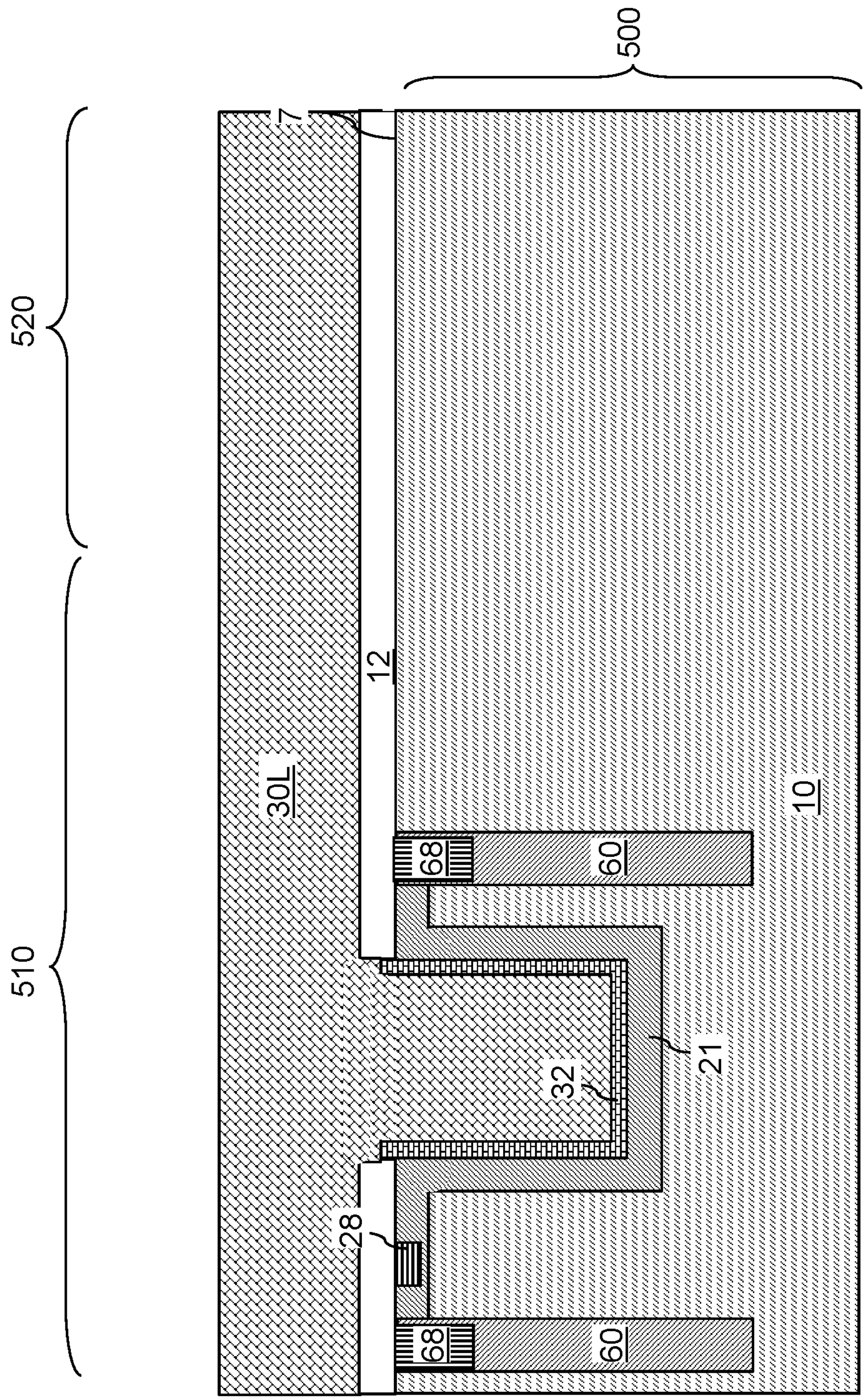

Referring to FIG. 2E, a germanium-containing material may be grown from the physically exposed surfaces of the silicon liner 32 in embodiments that include the silicon liner 32 or from the physically exposed surfaces of the first-conductivity-type silicon region 21 in embodiments that do not include the silicon liner 32. The germanium-containing material includes germanium at an atomic percentage greater than 50%. In one embodiment, the germanium-containing material may include doped or undoped germanium such that the atomic percentage of germanium is at least 99%, and is essentially free of silicon. In another embodiment, the germanium-containing material may include a silicon-germanium alloy in which the atomic percentage of germanium is greater than 50%, and the atomic percentage of silicon is less than 50%, such as from 5% to 30%. A germanium-containing material layer 30L may be formed by the deposited germanium-containing material.

The germanium-containing material layer 30L may be formed by a selective deposition process or a non-selective deposition process. A selective deposition process is a process in which the germanium-containing material is grown from physically exposed semiconductor surfaces such as the physically exposed surfaces of the silicon liner 32 or the physically exposed surfaces of the first-conductivity-type silicon region 21. In this embodiment, a germanium-containing reactant (such as germane or digermane) may be flowed into a process chamber containing the first exemplary structure concurrently with, or alternately with, flow of an etchant gas such as hydrogen chloride. Generally, a semiconductor material (such as a germanium-containing material) has a higher growth rate on semiconductor surfaces than on dielectric surfaces. The flow rates and the deposition temperature may be controlled such that the net deposition rate (i.e., the deposition rate less the etch rate) is positive on semiconductor surfaces, and is negative on dielectric surfaces during the selective deposition process. In this embodiment, growth of the germanium-containing material occurs only on semiconductor surfaces. A non-selective deposition process is a deposition process in which the germanium-containing material grows from all physically exposed surfaces. In this embodiment, the deposition process may use a germanium-containing reactant without use of an etchant gas.

In one embodiment, the selective deposition process or the non-selective deposition process that is used to deposit the germanium-containing material layer 30L may be an epitaxial deposition process, i.e., a deposition process that provides alignment of crystallographic structure of the deposited germanium-containing material to the crystalline structure at the physically exposed surfaces of the underlying material portions. Thus, the portion of the germanium-containing material layer 30L that is deposited in the trench 69 may be epitaxially aligned to the crystalline structure of the silicon liner 32 (in embodiments in which the silicon liner 32 is included) and/or the crystalline structure of the first-conductivity-type silicon region 21. In embodiments in which a selective epitaxial deposition process is used to deposit the germanium-containing material layer 30L, the material of the germanium-containing material layer 30L grows from the physically exposed surfaces of the silicon liner 32 or the first-conductivity-type silicon region 21. In such embodiments, the entirety of the germanium-containing material layer 30L may be single crystalline and may be in epitaxial alignment with the single crystalline silicon material of the single crystalline silicon substrate 10. In embodiments in which a non-selective epitaxial deposition process is used to deposit the germanium-containing material layer 30L, the material of the germanium-containing material layer 30L grows from the physically exposed surfaces of the silicon liner 32 (in embodiments in which the silicon liner 32 is included) or the first-conductivity-type silicon region 21, and from the physically exposed surfaces of the dielectric mask layer 12. In this embodiment, only the portion of the germanium-containing material layer 30L that grows from the physically exposed surfaces of the silicon liner 32 (in embodiments in which the silicon liner 32 is included) or the first-conductivity-type silicon region 21 may be single crystalline, and the portions of the germanium-containing material layer 30L that grows from the physically exposed surfaces of the dielectric mask layer 12 may be polycrystalline.

Generally, an epitaxial deposition process may be performed to grow a single crystalline germanium-containing material inside the trench 69. At least the portion of the germanium-containing material layer 30L that grows within the trench 69 may be single crystalline, and may be formed with epitaxial alignment with the single crystalline silicon material of the single crystalline silicon substrate 10. In this embodiment, the entirety of the portion of the germanium-containing material layer 30L located within the trench 69 may be single crystalline.

The germanium-containing material layer 30L may be intrinsic, or may have a low level of doping. For example, the atomic concentration of dopants within the germanium-containing material layer 30L may be in a range from $1.0\times10^{13}/cm^3$ to $1.0\times10^{18}/cm^3$, although lesser and greater dopant concentrations may also be used.

Figure 2F:
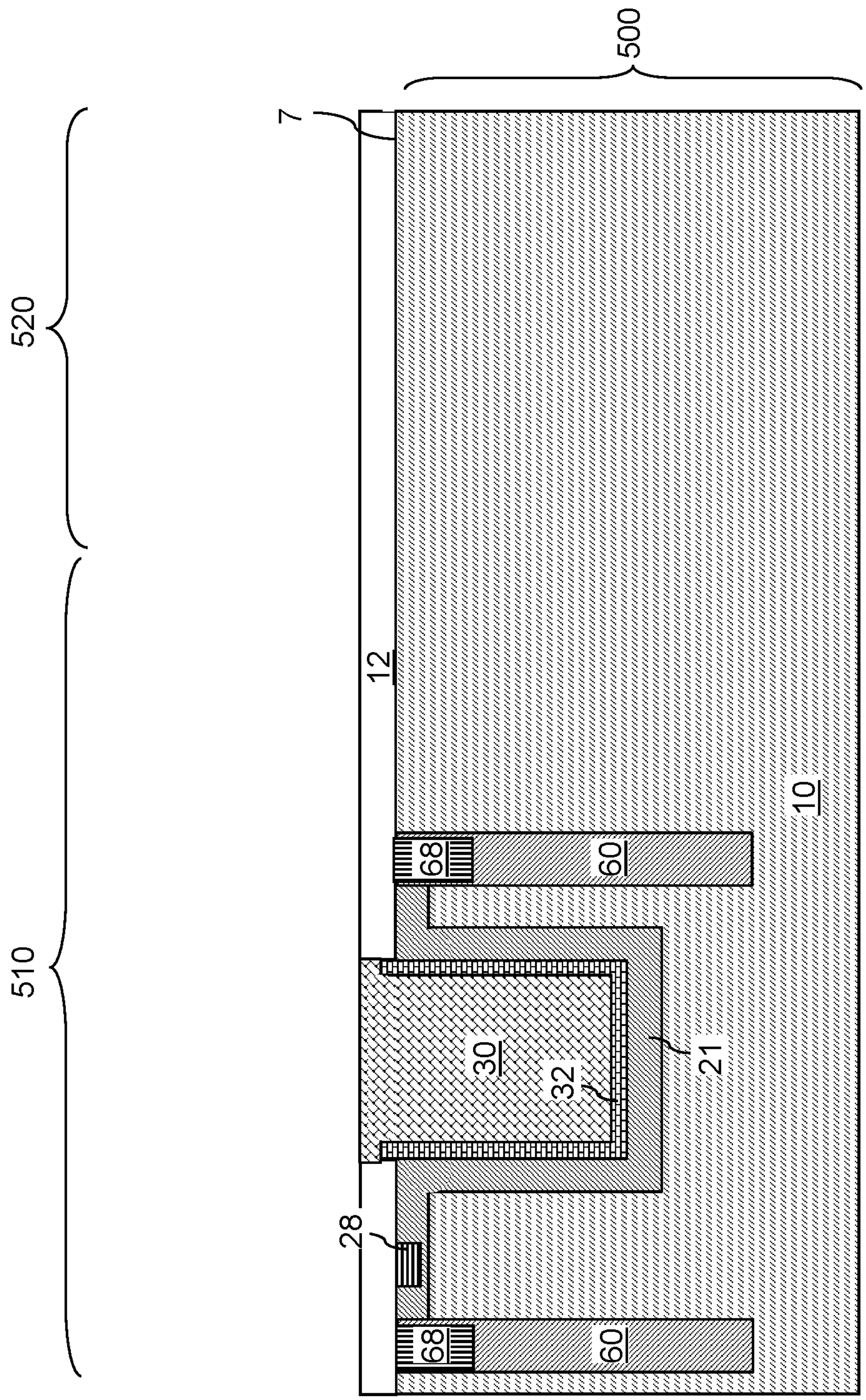

Referring to FIG. 2F, excess portions of the germanium-containing material may be removed from above the horizontal plane including the top surface of the dielectric mask layer 12. In one embodiment, a chemical mechanical planarization (CMP) process may be performed to remove portions of the germanium-containing material layer 30L located above the horizontal plane including the top surface of the dielectric mask layer 12. A remaining portion of the germanium-containing material layer 30L located within the trench 69 comprises a germanium-containing material portion, which is herein referred to as a germanium-containing well 30. The germanium-containing well 30 may have a top surface within the same horizontal plane as the top surface of the dielectric mask layer 12.

While the present disclosure is described using an embodiment in which the germanium-containing well 30 is formed as a single crystalline germanium-containing material portion, the germanium-containing well 30 may be formed as a polycrystalline material portion or as an amorphous material portion albeit at a reduced efficiency. Such variations are expressly contemplated herein.

Figure 2G:
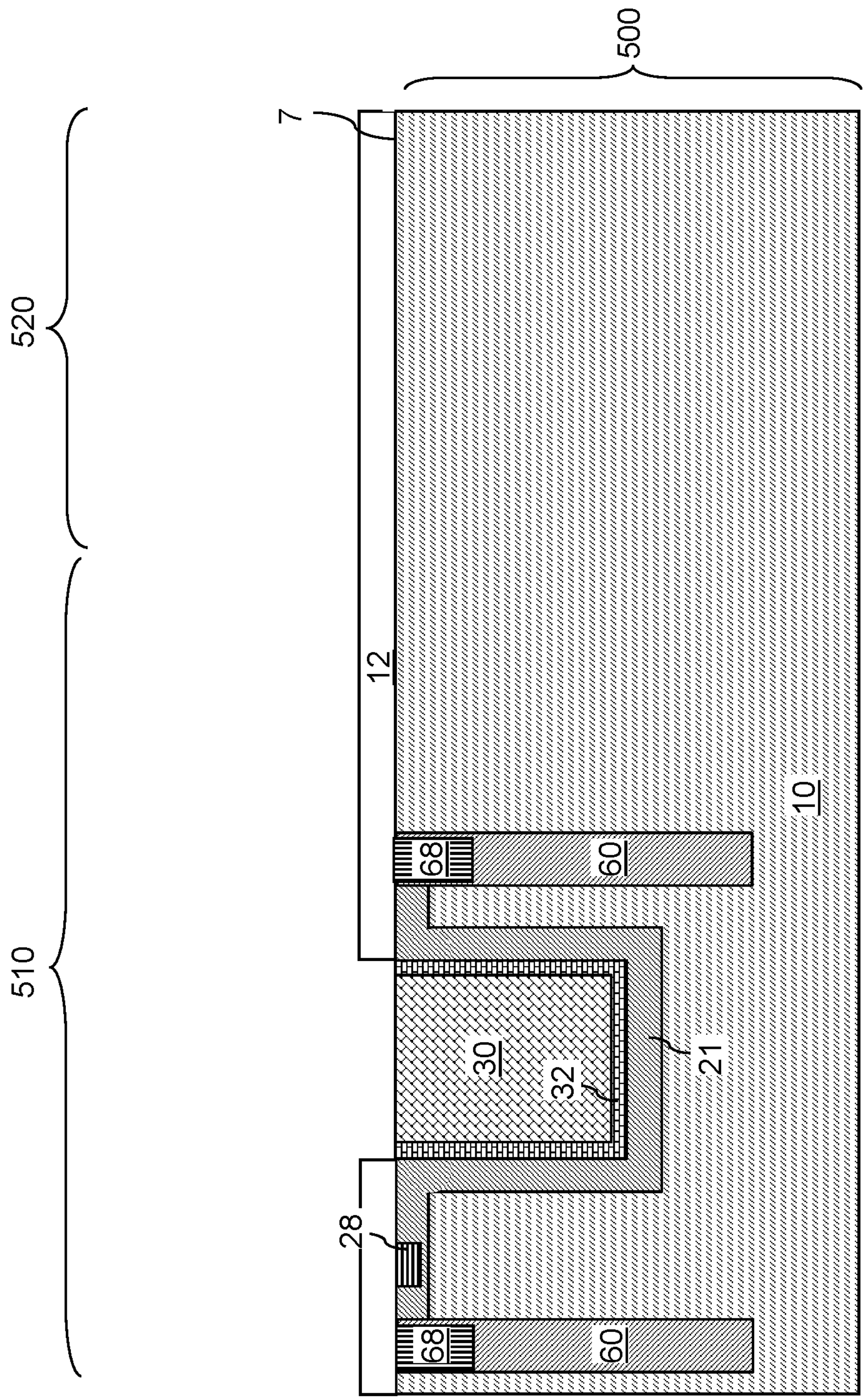

Referring to FIG. 2G, a remaining portion of the germanium-containing material may be vertically recessed within an opening in the dielectric mask layer 12. Specifically, the germanium-containing well 30 and optionally an upper portion of the optional silicon liner 32 may be vertically recessed, for example, by performing a recess etch process. In such embodiments, the vertical recess distance may be greater than, the same as, or less than, the thickness of the dielectric mask layer 12. Regardless of the vertical recess distance, the germanium-containing well 30 does not contact the dielectric mask layer 12, and the material of the germanium-containing well 30 does not contact any oxygen-containing material (such as silicon oxide) of the dielectric mask layer 12. In embodiments in which a silicon liner 32 is not used, the vertical recess distance may be greater than the thickness of the dielectric mask layer 12 to prevent direct contact between the germanium-containing well 30 and the dielectric mask layer 12.

Figure 2H:
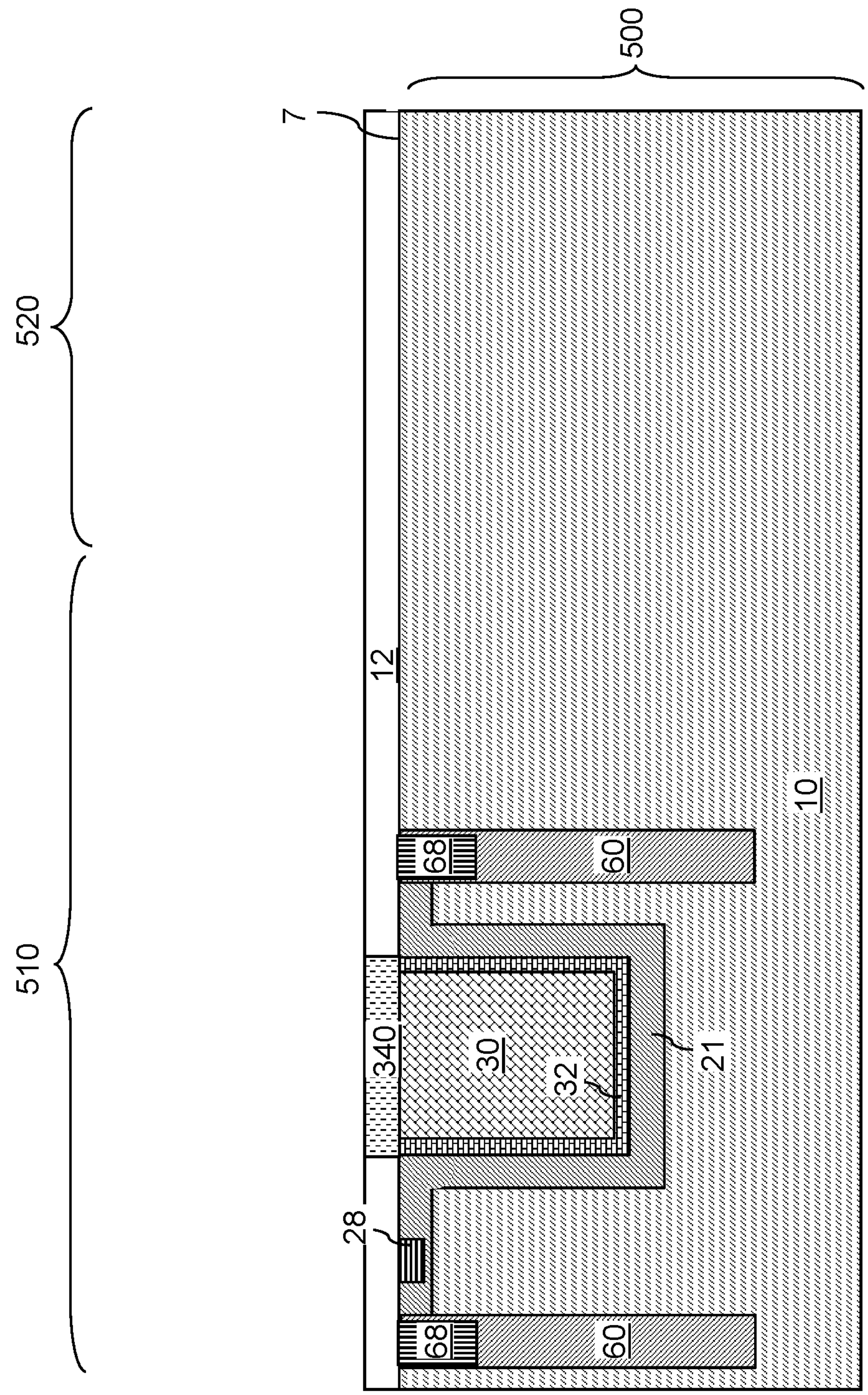

Referring to FIG. 2H, a silicon-containing capping material may be deposited on the physically exposed top surface of the germanium-containing well 30. In embodiments in which a silicon liner 32 is present, the silicon-containing capping material may be deposited on the top surface of the silicon liner 32. The silicon-containing capping material may include, and/or may consist essentially of, a silicon-containing material that may prevent diffusion of oxygen. For example, the silicon-containing capping material may include, and/or may consist essentially of, silicon or silicon nitride.

In one embodiment, a selective epitaxy process may be performed to grow silicon from the top surface of the germanium-containing well 30. In this embodiment, a passivation silicon region 340 including single crystalline silicon may be formed over the germanium-containing well 30. Alternatively, a selective or non-selective silicon deposition process may be performed under conditions that forms polycrystalline silicon. In this embodiment, the passivation silicon region 340 may include, and/or may consist essentially of, polysilicon.

If a selective silicon deposition process (which may, or may not, be an epitaxial deposition process) is used, the passivation silicon region 340 may be formed only inside the opening in the dielectric mask layer 12. In this embodiment, a planarization process is not necessary, and the top surface of the passivation silicon region 340 may be located at, below, or above, the horizontal plane including the top surface of the dielectric mask layer 12. If a non-selective silicon deposition process is used, a planarization process such as a chemical mechanical planarization process may be performed to remove portions of the deposited silicon material from above the horizontal plane including the top surface of the dielectric mask layer 12. In this embodiment, the top surface of the passivation silicon region 340 may be located within the same horizontal plane as the top surface of the dielectric mask layer 12.

In one embodiment, the passivation silicon region 340 as formed may include intrinsic silicon or lightly doped silicon, i.e., silicon including electrical dopants at an atomic concentration in a range from $1.0\times10^{13}/cm^3$ to $1.0\times10^{17}/cm^3$. The conductivity type of doping in the passivation silicon region 340 may be the first conductivity type or the second conductivity type. Generally, the passivation silicon region 340 may be formed as a single crystalline silicon portion, a polysilicon portion, a microcrystalline silicon portion, or an amorphous silicon portion depending on the deposition conditions.

Figure 2I:
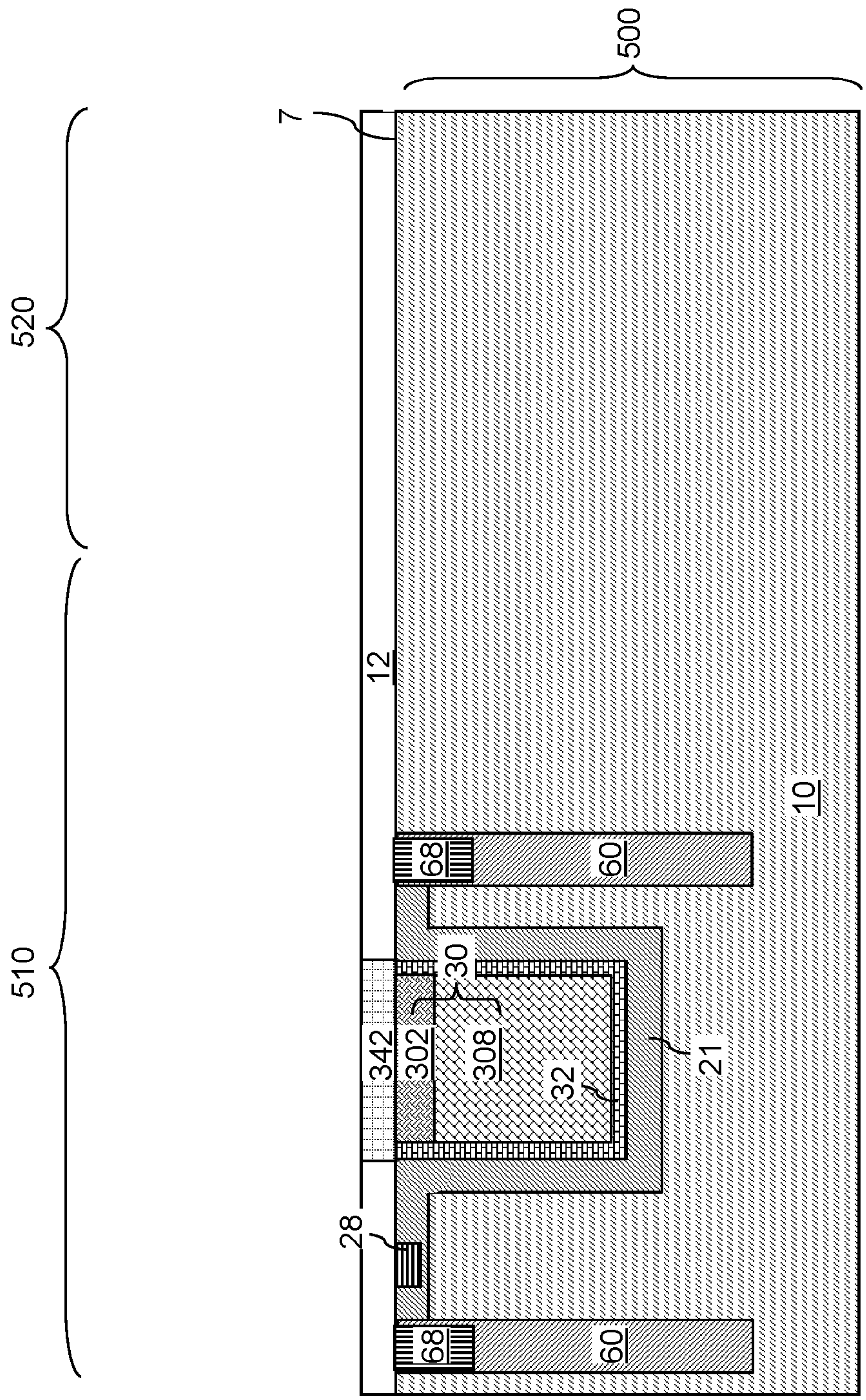

Referring to FIG. 2I, dopants of the second conductivity type may be implanted into the passivation silicon region 340 and an upper portion of the germanium-containing well 30. The implanted portion of the germanium-containing well 30 may be converted into a second-conductivity-type germanium-containing region 302, and the passivation silicon region 340 may be converted into a second-conductivity-type silicon region 342. The atomic concentration of electrical dopants of the second conductivity type in the second-conductivity-type germanium-containing region 302 and the second-conductivity-type silicon region 342 may be in a range from $1.0\times10^{18}/cm^3$ to $1.0\times10^{21}/cm^3$, although lesser and greater atomic concentrations may also be used. The thickness of the second-conductivity-type germanium-containing region 302 may be in a range from 50 nm to 500 nm, although lesser and greater thicknesses may also be used. The thickness of the second-conductivity-type germanium-containing region 302 may be in a range from 50 nm to 300 nm, although lesser and greater thicknesses may also be used.

The unimplanted portion of the germanium-containing well 30 is herein referred to as an intermediate germanium-containing region 308. The intermediate germanium-containing region 308 may be intrinsic or may have a doping with an atomic concentration of dopants in a range from $1.0\times10^{13}/cm^3$ to $1.0\times10^{18}/cm^3$. The intermediate germanium-containing region 308 contacts the second-conductivity-type germanium-containing region 302, and is laterally surrounded by the first-conductivity-type silicon region 21. The combination of the second-conductivity-type germanium-containing well 302 and the intermediate germanium-containing region 308 constitutes a germanium-containing well 30.

The first-conductivity-type silicon region 21, the intermediate germanium-containing region 308, and the second-conductivity-type germanium-containing region 302 collectively form a p-i-n type photovoltaic junction, i.e., a photovoltaic junction including a p-doped region, an n-doped region, and an intermediate semiconductor region located between the p-doped region and the n-doped region and including an intrinsic semiconductor material or a lightly-doped semiconductor material. In one embodiment, the first conductivity type may be p-type and the second conductivity type may be n-type. In another embodiment, the first conductivity type may be n-type and the first conductivity type may be p-type. The photovoltaic junction may be formed across the trench 69, i.e., may spatially extend across the boundary of the trench 69 due to the presence of the first-conductivity-type silicon region 21 outside the trench 69. The intermediate germanium-containing region 308 is located within the trench 69, and functions as the intermediate semiconductor region including an intrinsic semiconductor material or a lightly-doped semiconductor material.

In an alternative embodiment, the intermediate germanium-containing region 308 may have a doping of the second conductivity type, and the photovoltaic junction may include a p-n junction formed between the intermediate germanium-containing region 308 and the first-conductivity-type silicon region 21. In this embodiment, the intermediate germanium-containing region 308 may include dopants of the second conductivity type at an atomic concentration in arrange from $1.0\times10^{17}/cm^3$ to $1.0\times10^{20}/cm^3$, although lesser and greater atomic concentrations may also be used. In embodiments in which the silicon liner 32 is not included, the p-n junction may be formed at the sidewall and the bottom surface of the trench 69. In embodiments in which the silicon liner 32 is included, the silicon liner 32 may be intrinsic, may be p-doped, or may be n-doped. Generally, the photovoltaic junction may comprise a p-i-n junction or a p-n junction formed across the germanium-containing well 30 and the single crystalline silicon substrate 10 that contains the first-conductivity-type silicon region 21.

Figure 2J:
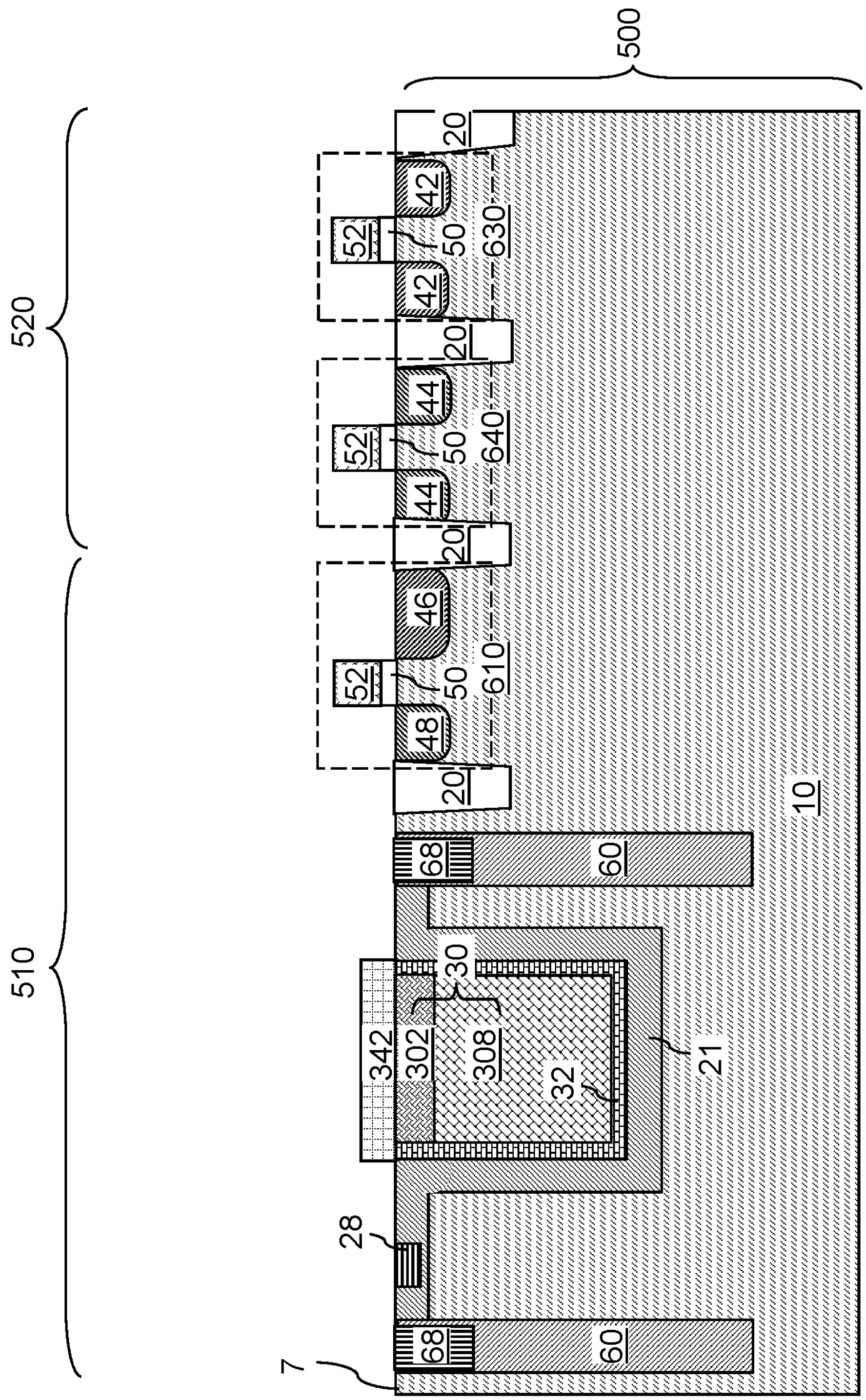

Referring to FIG. 2J, the dielectric mask layer 12 may be removed, for example, by performing a wet etch process. In embodiments in which the dielectric mask layer 12 includes silicon oxide, a wet etch process using dilute hydrofluoric acid may be performed to remove the dielectric mask layer 12.

Shallow trench isolation structures 20 may be formed in an upper portion of the single crystalline silicon substrate 10. The shallow trench isolation structures 20 may include a dielectric fill material such as silicon oxide, and provide electrical isolation from semiconductor devices to be subsequently formed. Various field effect transistors (610, 630, 640) may be formed in the photodetector region 510 and in the sensing circuit region 520. For example, a transfer transistor 610 may be formed in the photodetector region 510, and p-type field effect transistors 630 and n-type field effect transistors 640 may be formed in the sensing circuit region 520. Each of the field effect transistors (610, 630, 640) may include a respective gate dielectric 50, a respective gate electrode 52, and a respective pair of a source region and a drain region. The source regions and the drain regions are collectively referred to as source/drain regions. For example, the p-type field effect transistors 630 may include p-doped source/drain regions 42, and the n-type field effect transistors 640 may include n-doped source/drain regions 44. The transfer transistor 610 may include a source region 48 to be electrically connected to the second-conductivity-type germanium-containing region 302, and a floating drain region 46. The second-conductivity-type germanium-containing region 302 and the floating drain region 46 may have a doping of the second conductivity type. Various doped wells may be formed in the sensing circuit region 520 as needed. While the present disclosure illustrates only two field effect transistors in the sensing circuit region 520, it is understood that a full set of field effect transistors for providing a sensing circuit for a subpixel may be formed in the sensing circuit region 520. The field effect transistors in the sensing circuit region 520 may include transistors such as a reset transistor, a source follower transistor, and a select transistor. Any sensing circuit for sensing stored electrical charges in the second-conductivity-type germanium-containing region 302 may be formed.

Figure 2K:
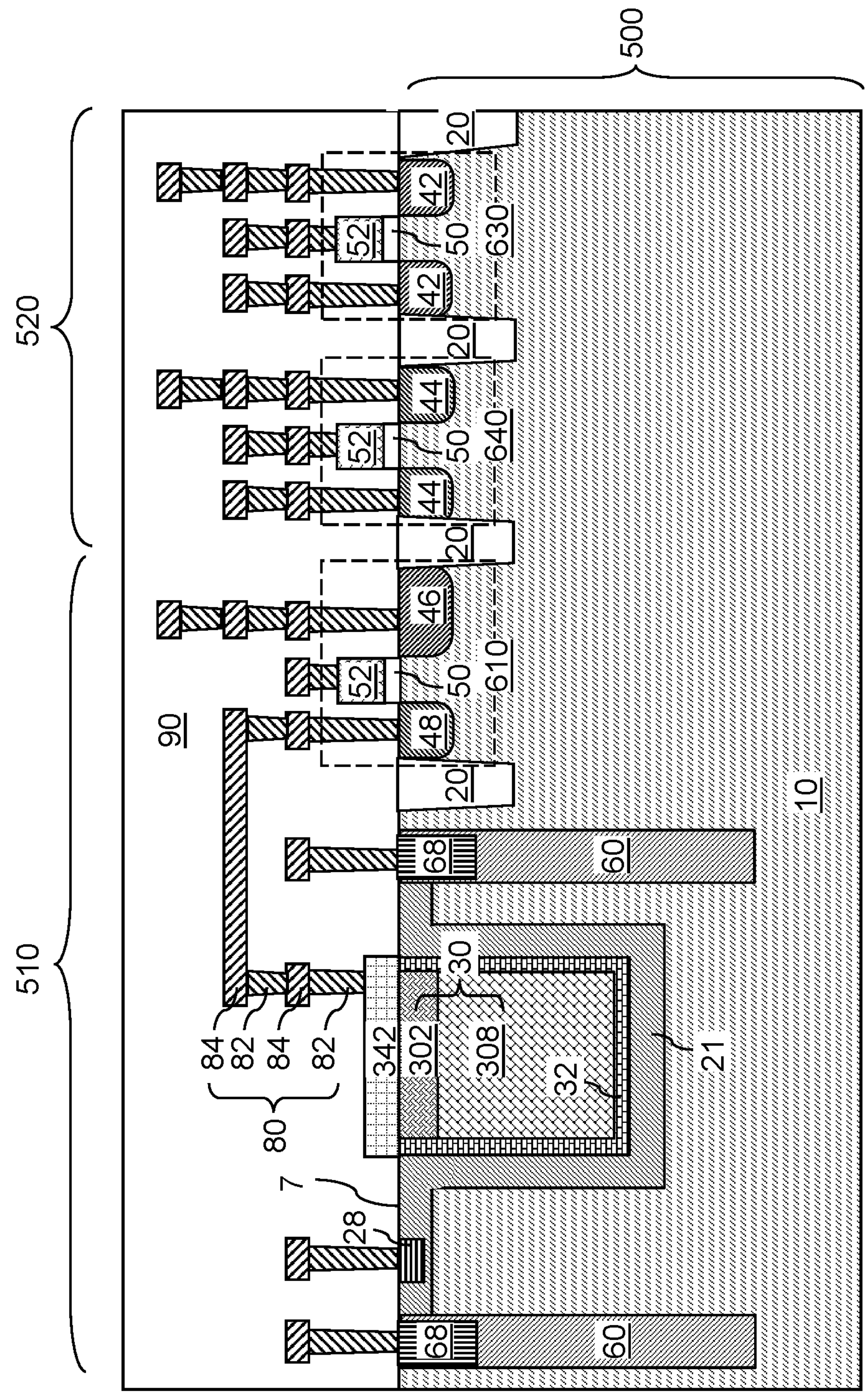

Referring to FIG. 2K, dielectric material layers 90 and metal interconnect structures 80 may be formed over the field effect transistors (610, 630, 640) and the second-conductivity-type silicon region 342. Each of the dielectric material layers 90 includes a respective interlayer dielectric (ILD) material such as undoped silicate glass, a doped silicate glass, organosilicate glass, and/or a porous dielectric material. The dielectric material layers 90 may include dielectric liners such as silicon nitride dielectric liners, dielectric metal oxide dielectric liners, silicon carbide dielectric liners, and/or silicon oxynitride dielectric liners. The metal interconnect structures 80 may include metal via structures 82 and metal line structures 84. The second-conductivity-type silicon region 342 may be electrically connected to the source region 48 of the transfer transistor 610 by a subset of the metal interconnect structures 80.

Figure 2L:
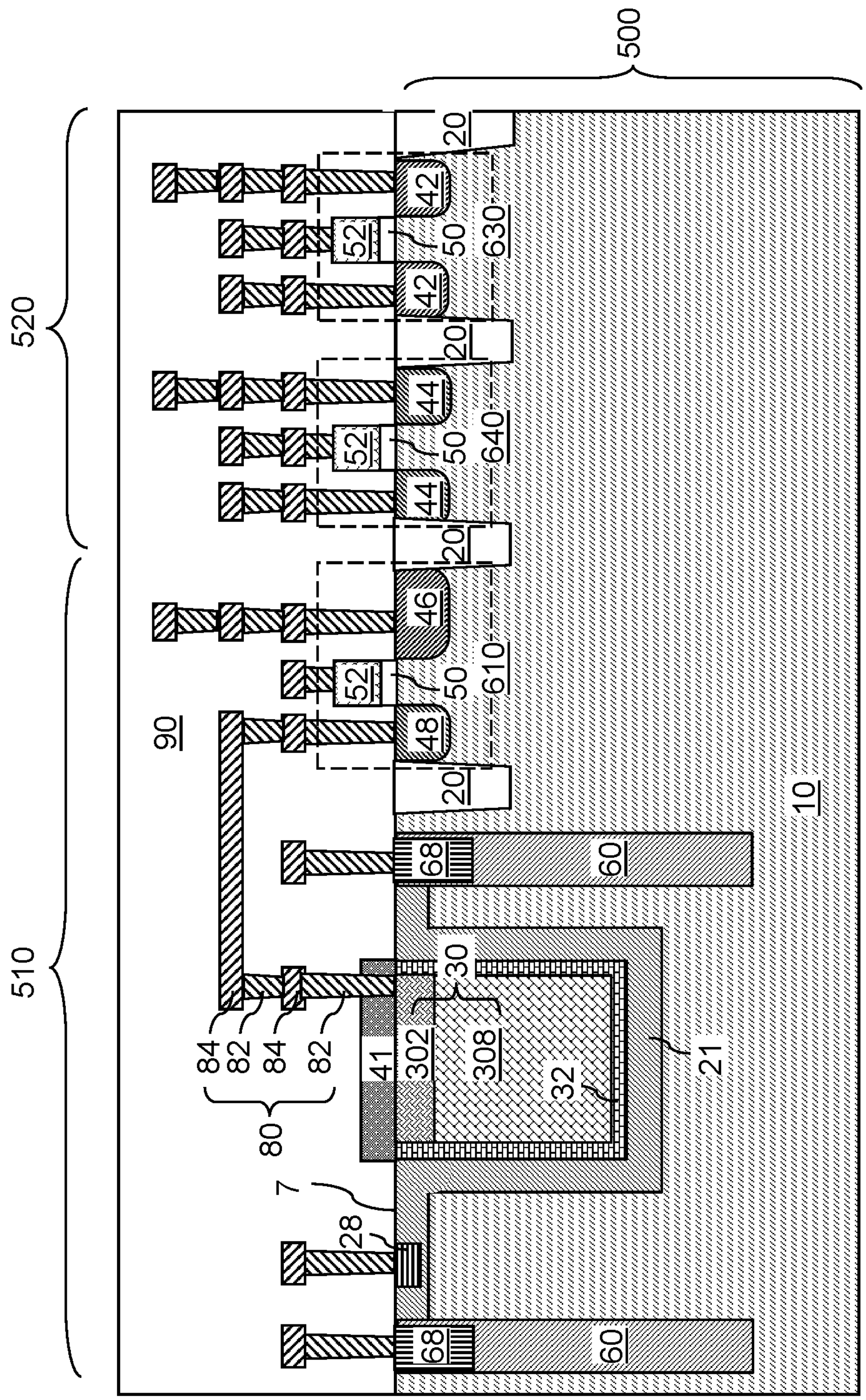
FIG. 2L is a vertical cross-sectional view of an alternative configuration of the first exemplary structure according to the first embodiment of the present disclosure.

FIG. 2L is a vertical cross-sectional view of an alternative configuration of the first exemplary structure according to the first embodiment of the present disclosure. Referring to FIG. 2L, an alternative configuration of the first exemplary structure may be derived from the first exemplary structure of FIG. 2H by using silicon nitride as the material for a silicon-containing capping structure. A silicon nitride capping structure 41 including, and/or consisting essentially of, silicon nitride may be formed on the top surface of the germanium-containing well 30.

Subsequently, the processing steps of FIG. 2I may be performed to convert an upper portion of the germanium-containing well 30 into a second-conductivity-type germanium-containing region 302. The processing steps of FIGS. 2J and 2K may be subsequently performed. A metal via structure 82 may be formed through the silicon nitride capping structure 41 (that includes silicon nitride) to contact the second-conductivity-type germanium-containing region 302.

Generally, a silicon-containing capping structure (342 or 41) may be located on a top surface of the germanium-containing well 30. The silicon-containing capping structure (342 or 41) includes a silicon-containing diffusion barrier material, which may be silicon or silicon nitride. If the silicon-containing capping structure (342 or 41) include silicon (comprising the second-conductivity-type silicon region 342), the atomic percentage of silicon in the silicon-containing capping structure (comprising a second-conductivity-type silicon region 342) may be greater than 98%, and may be greater than 99%, the balance being electrical dopants of the second conductivity type. If the silicon-containing capping structure (comprising a silicon nitride capping structure 41) includes silicon nitride, the atomic percentage of silicon may be about $3/7 \times 100\%$, which is about 42.8%. Generally, the silicon-containing capping structure (342 or 41) of the embodiments of the present disclosure may include silicon at an atomic percentage greater than 42%.

Figure 3A:
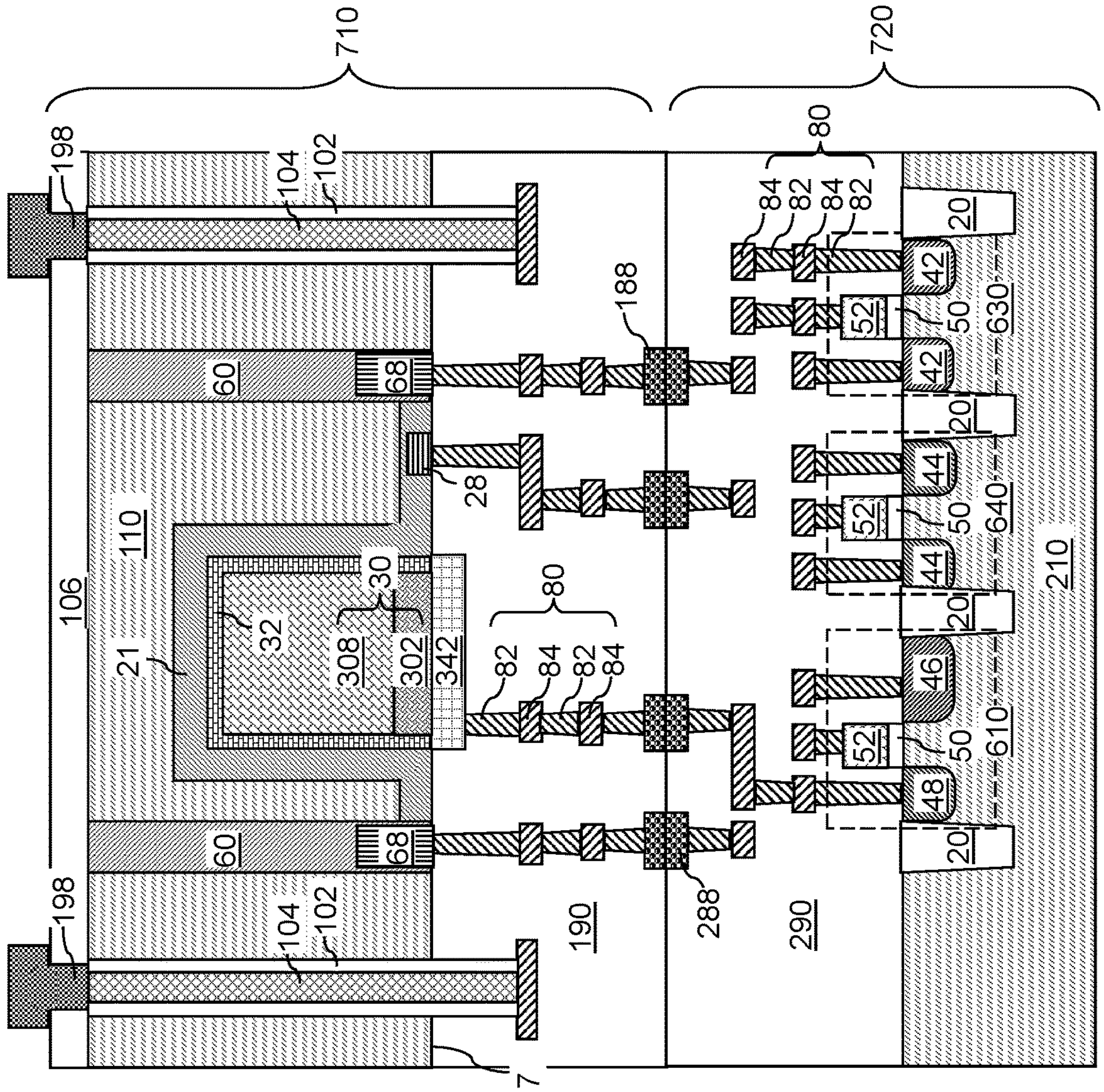
FIGS. 3A and 3B are vertical cross-sectional views of configurations of a second exemplary structure including a pixel of an image sensor according to a second embodiment of the present disclosure.
Figure 3B:
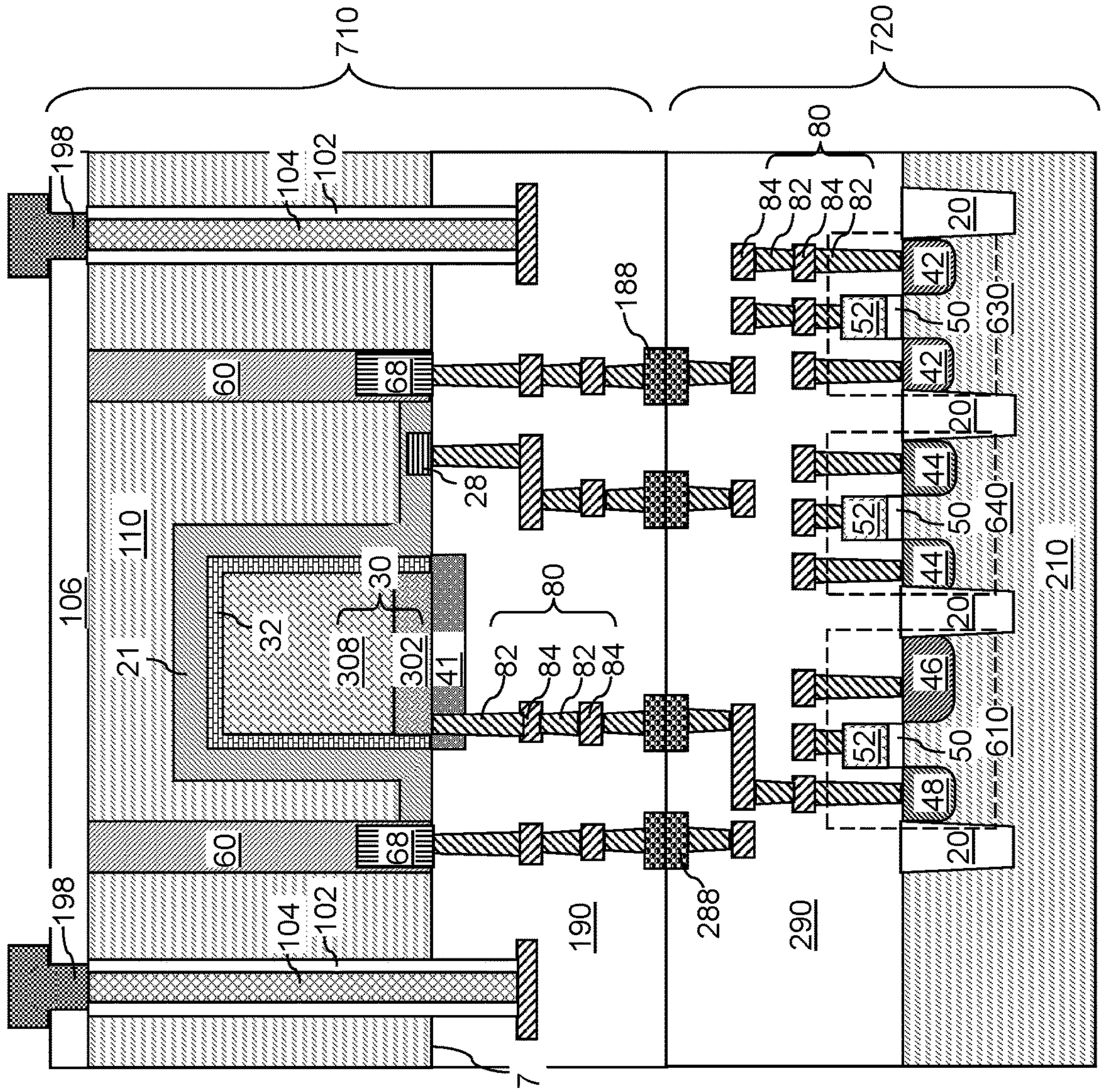

FIGS. 3A and 3B are vertical cross-sectional views of configurations of a second exemplary structure including a pixel of an image sensor according to a second embodiment of the present disclosure. FIG. 3A illustrates a configuration in which the silicon-containing capping structure comprises a second-conductivity-type silicon region 342, and FIG. 3B illustrates a configuration in which the silicon-containing capping structure comprises a silicon nitride capping structure 41.

In the second exemplary structures, the photovoltaic junction of each subpixel may be formed in a first semiconductor substrate 110. The first semiconductor substrate 110 may be a single crystalline silicon substrate that may be the same as the single crystalline silicon substrate 10 as described above. First dielectric material layers 190 containing a first subset of the metal interconnect structures 80 may be formed over the first semiconductor substrate 110. First bonding pads 188 may be formed on the first dielectric material layers 190. Through-substrate via structures 104 laterally surrounded by a respective insulating spacer 102 may be formed in the first semiconductor substrate 110.

The sensing circuit of each subpixel may be formed on a second semiconductor substrate 210, which may be a silicon substrate. In this embodiment, the transfer transistor 610 for the photodetector may be formed on the second semiconductor substrate 210. Second dielectric material layers 290 containing a second subset of the metal interconnect structures 80 may be formed over the second semiconductor substrate 210. Second bonding pads 288 may be formed on the second dielectric material layers 290.

A first wafer including the first semiconductor substrate 110 and the first dielectric material layers 190 may be bonded to a second wafer including the second semiconductor substrate 210 and the second dielectric material layers 290 by wafer-to-wafer bonding. For example, the first bonding pads 188 and be aligned to, and disposed upon, the second bonding pads 288, and metal-to-metal bonding may be induced on each mating pair of a first bonding pad 188 and a second bonding pad 288. Subsequently, the backside of the first semiconductor substrate 110 may be thinned to physically expose top surfaces of the through-substrate via structures 104. A backside dielectric layer 106 may be formed on the backside of the first semiconductor substrate 110, and external bonding pads 198 may be formed through the backside dielectric layer 106 on a backside surface of a respective one of the through-substrate via structures 104. The bonded assembly of the first wafer and the second wafer may be diced to provide bonded semiconductor dies. Each bonded semiconductor die may include a first semiconductor die 710 including diced portions of the first semiconductor substrate 110 and the first dielectric material layers 190, and a second semiconductor die 720 including diced portions of the second semiconductor substrate 210 and the second dielectric material layers 290.

Figure 4A:
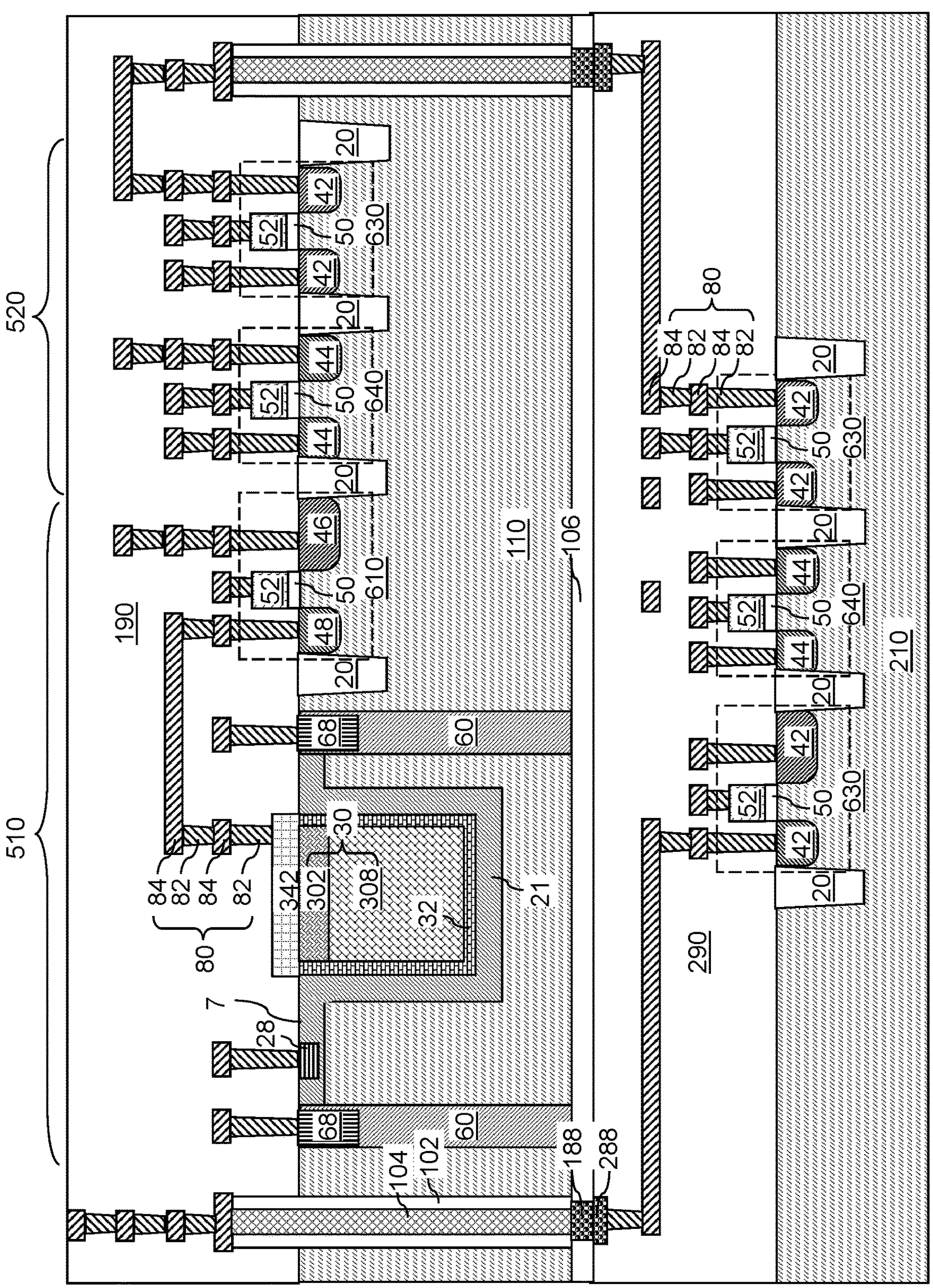
FIGS. 4A and 4B are vertical cross-sectional views of configurations of a third exemplary structure including a pixel of an image sensor according to a second embodiment of the present disclosure.
Figure 4B:
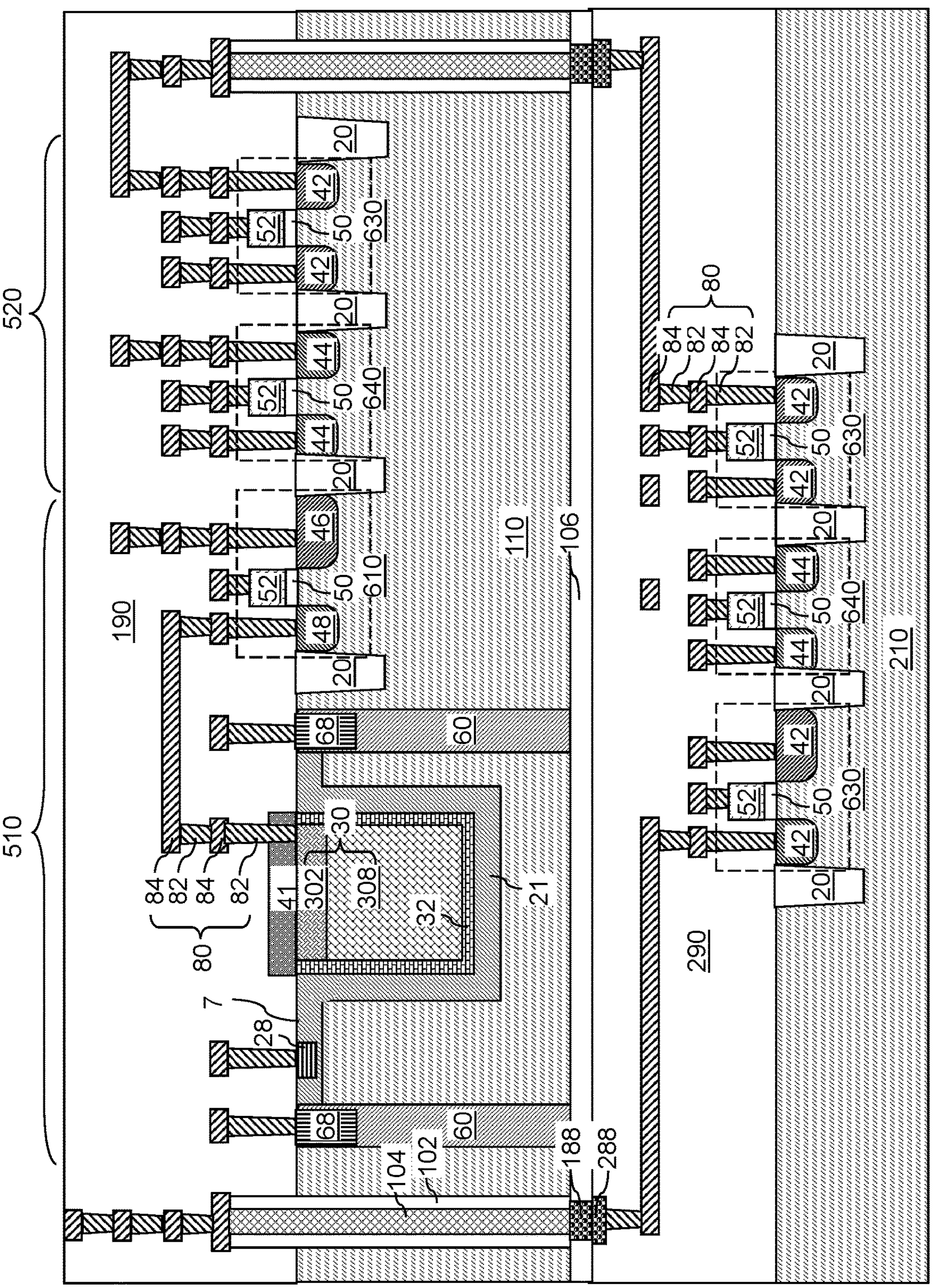

FIGS. 4A and 4B are vertical cross-sectional views of configurations of a third exemplary structure including a pixel of an image sensor according to a second embodiment of the present disclosure. FIG. 4A illustrates a configuration in which the silicon-containing capping structure comprises a second-conductivity-type silicon region 342, and FIG. 4B illustrates a configuration in which the silicon-containing capping structure comprises a silicon nitride capping structure 41.

In the third exemplary structures, the photovoltaic junction of each subpixel and at least a subset of the sensing circuit of each subpixel may be formed in a first semiconductor substrate 110, which is a single crystalline silicon substrate that may be the same as the single crystalline silicon substrate 10 as described above. First dielectric material layers 190 containing a first subset of the metal interconnect structures 80 may be formed over the first semiconductor substrate 110. Through-substrate via structures 104 laterally surrounded by a respective insulating spacer 102 may be formed in the first semiconductor substrate 110.

Additional semiconductor devices such as p-type field effect transistors 630 and n-type field effect transistors 640 may be formed on a second semiconductor substrate 210, which may be a silicon substrate. The additional semiconductor devices may, or may not, include components of a sensing circuit for a photovoltaic junction in the first semiconductor substrate 110. The additional semiconductor devices may include additional semiconductor devices that may be used in conjunction with the subpixels of an image sensor. For example, the additional semiconductor devices may include memory devices or logic devices that may support operation of the image sensor.

The devices on the first semiconductor substrate 110 and the devices on the second semiconductor substrate 210 may be connected to each other front-to-front, back-to-back, or front-to-back. The illustrated configurations include embodiments in which the backside of the first semiconductor substrate 110 is thinned, a backside dielectric layer 106 is deposited on the backside of the first semiconductor substrate 110, and first bonding pads 188 are formed through the backside dielectric layer 106 on bottom surfaces of the through-substrate via structures 104. The first bonding pads 188 are bonded to second bonding pads 288 provided in the second dielectric material layers 290 overlying the second semiconductor substrate 210.

Generally, any type of photovoltaic junction may be formed within, or around, the germanium-containing well 30. The photovoltaic junction may be a vertical p-i-n junction, a lateral p-i-n junction, a vertical p-n junction, or a lateral p-n junction. Further, the configuration of a pinned diode using an pinning layer or the configuration of a single-photon avalanche diode (SPAD) may also be used. While specific embodiments of the photovoltaic junction formed within, or around, a germanium-containing well 30 are described herein, it is to be understood that the scope of the present disclosure is not limited by any particular configuration of a photovoltaic junction provided that a germanium-containing well 30 is used as a component of a photovoltaic junction.

The germanium-containing material of the germanium-containing well 30 may be doped germanium or a doped silicon-germanium alloy including germanium at an atomic percentage greater than 50%. The germanium-containing well 30 may be completely encapsulated by a combination of the first-conductivity-type silicon region 21 and the silicon-containing capping structure (342 or 41), or by a combination of the silicon liner 32 and the silicon-containing capping structure (342 or 41). Thus, physical contact between the germanium-containing well 30 and the dielectric material layers 90 or any other oxygen-containing component within the first, second, and third exemplary structures may be avoided, and the germanium-containing well 30 may remain free of oxidation.

Referring to FIGS. 2A-4B and according to various embodiments of the present disclosure, a semiconductor structure including a photodetector is provided. The photodetector comprises: germanium-containing well 30 embedded within a single crystalline silicon substrate (10, 110) and extending to a proximal horizontal surface 7 of the single crystalline silicon substrate (10, 110), wherein the germanium-containing well 30 includes germanium at an atomic percentage greater than 50% (such as from 50% to 100%); and a silicon-containing capping structure (342 or 41) located on a top surface of the germanium-containing well 30 and including silicon atoms at an atomic percentage greater than 42%. A portion of the single crystalline silicon substrate (10, 110) that surrounds the trench 69 comprises a first-conductivity-type silicon region 21. The germanium-containing well 30 comprises a second-conductivity-type germanium-containing region 302.

In one embodiment, the photovoltaic junction may comprise a p-i-n junction (21, 308, 302); and the germanium-containing well 30 comprises an intermediate germanium-containing region 308 having an atomic concentration of dopants in a range from $1.0\times10^{13}/cm^3$ to $1.0\times10^{18}/cm^3$, contacting the second-conductivity-type germanium-containing region 302, and laterally surrounded by the first-conductivity-type silicon region 21.

In one embodiment, the semiconductor structure may comprise a single crystalline silicon liner 32 contacting an inner sidewall of the first-conductivity-type silicon region 21, laterally surrounding the germanium-containing well 30, and epitaxially aligned to the single crystalline silicon substrate (10, 110). In one embodiment, the germanium-containing well 30 comprises a single crystalline germanium-containing semiconductor material in epitaxial alignment with the single crystalline silicon liner 32 and the single crystalline silicon substrate (10, 110).

In one embodiment, the first-conductivity-type silicon region 21 continuously surrounds the germanium-containing well 30 and comprises a first horizontally-extending portion that contacts a bottom surface of the germanium-containing well 30 and a second horizontally-extending portion that extends outward from the germanium-containing well 30 under the proximal horizontal surface 7 of the single crystalline silicon substrate (10, 110).

The semiconductor structure may comprise: a sensing circuit located on the single crystalline silicon substrate (10, 110) or on a second semiconductor substrate 210 bonded to the single crystalline silicon substrate (10, 110) through dielectric material layers (190, 290) and bonding pads (188, 288) located within the dielectric material layers (190, 290); and metal interconnect structures 80 that provide electrical connection between the second-conductivity-type germanium-containing region 302 and the sensing circuit.

FIG. 5A-5F are sequential vertical cross-sectional views of a fourth exemplary structure during formation of a pixel of an image sensor according to a fourth embodiment of the present disclosure. The fourth exemplary structure illustrated in FIG. 5A includes a first semiconductor substrate 110, which may be a single crystalline silicon substrate. The first semiconductor substrate 110 may be the same as the single crystalline silicon substrate 10 in the first exemplary structure. A proximal horizontal surface 7 may be located on the top side of the first semiconductor substrate 110. A dielectric mask layer 12 may be formed on the proximal horizontal surface 7, and the a trench 69 may be formed in an upper portion of the first semiconductor substrate 110 through an opening in the dielectric mask layer 12. The fourth exemplary structure of FIG. 5A may be derived from the first exemplary structure of FIG. 2B by omitting formation of the first doped photodiode contact region 28, the second-conductivity-type doped well 60, and the doped well contact regions 68.

Figure 5A:
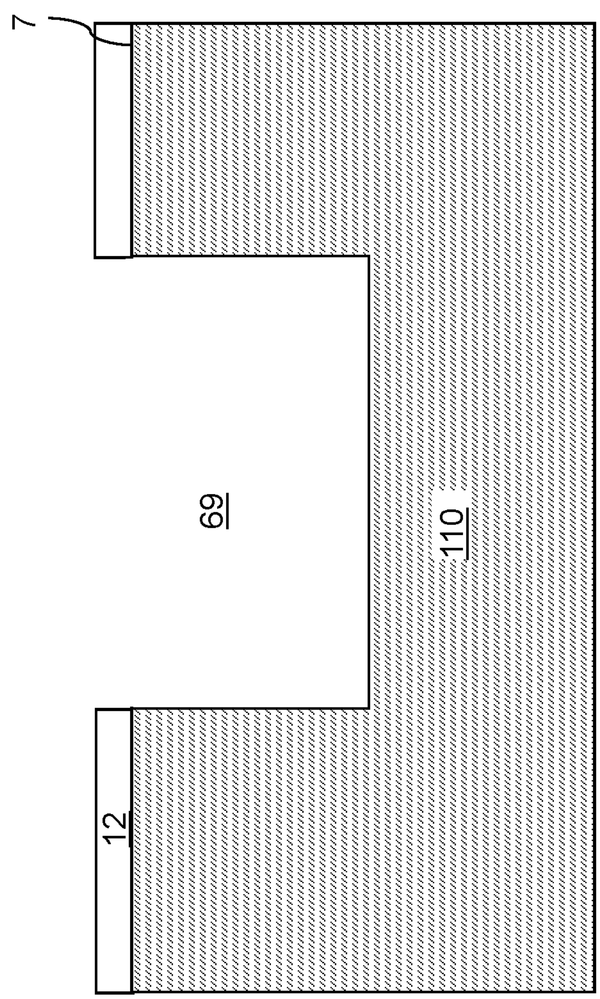
FIG. 5A-5F are sequential vertical cross-sectional views of a fourth exemplary structure during formation of a pixel of an image sensor according to a fourth embodiment of the present disclosure.
Figure 5B:
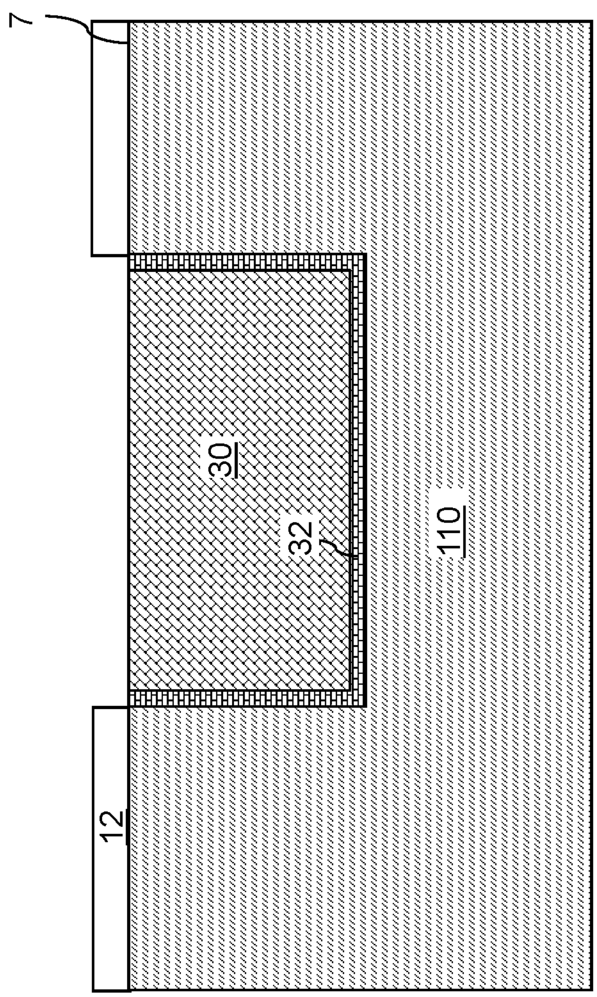

Referring to FIG. 5B, the processing steps of FIGS. 2D, 2E, 2F, and 2G may be sequentially performed to form a silicon liner 32 and a germanium-containing well 30. The silicon liner 32 may have the same thickness and the same material composition as in the first embodiment. The germanium-containing well 30 may have the same material composition and the same crystallinity as in the first embodiment. The germanium-containing well 30 may be single crystalline and epitaxially aligned to the single crystalline semiconductor substrate of the first semiconductor substrate 110, or may be polycrystalline or amorphous.

Figure 5C:
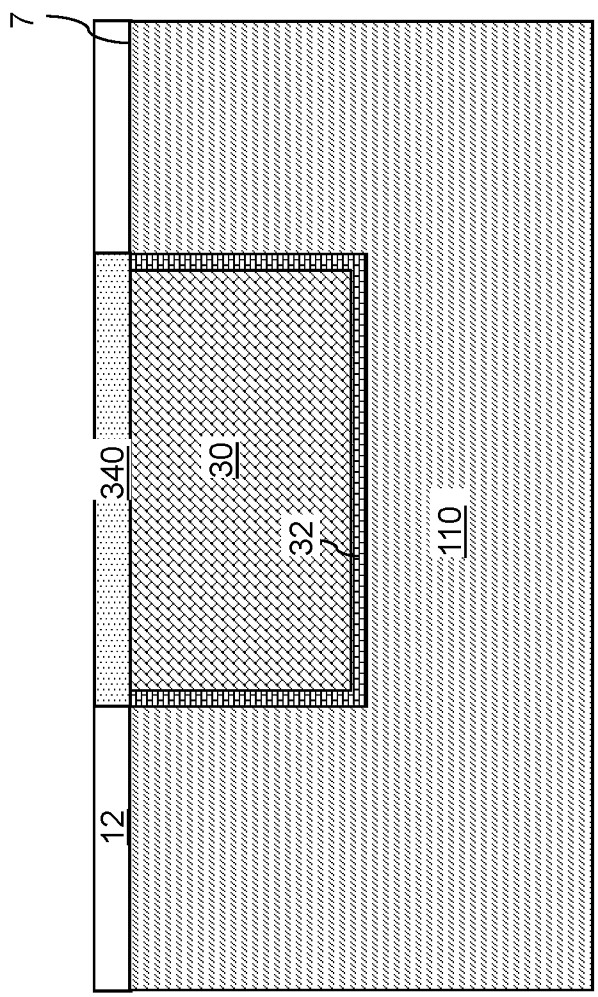

Referring to FIG. 5C, silicon may be deposited on the top surface of the germanium-containing well 30. In one embodiment, deposited silicon may include undoped silicon. As used herein, undoped silicon refers to silicon without intentionally introduced dopants during a deposition process. Thus, the level of electrical dopants in undoped silicon may at a residual level. For example, undoped silicon may be intrinsic, or may include electrical dopants at a dopant concentration less than $1.0\times10^{16}/cm^3$, such as from $1.0\times10^{12}/cm^3$ to $1.0\times10^{15}/cm^3$. Undoped silicon provides relatively high resistivity, and is effective in suppressing leakage current. Undoped silicon may be grown by a selective deposition process or a non-selective deposition process. In embodiments in which a non-selective deposition process is used, excess portions of the deposited undoped silicon material may be removed from above the horizontal plane including the top surface of the dielectric mask layer 12. Remaining portions of the deposited undoped silicon comprises a passivation silicon region 340. The top surface of the passivation silicon region 340 may be within the horizontal plane including the top surface of the dielectric mask layer 12. In embodiments in which undoped silicon is deposited using a selective deposition process, a planarization process may not be necessary. The passivation silicon region 340 functions as a silicon-containing capping structure for the germanium-containing well 30.

Figure 5D:
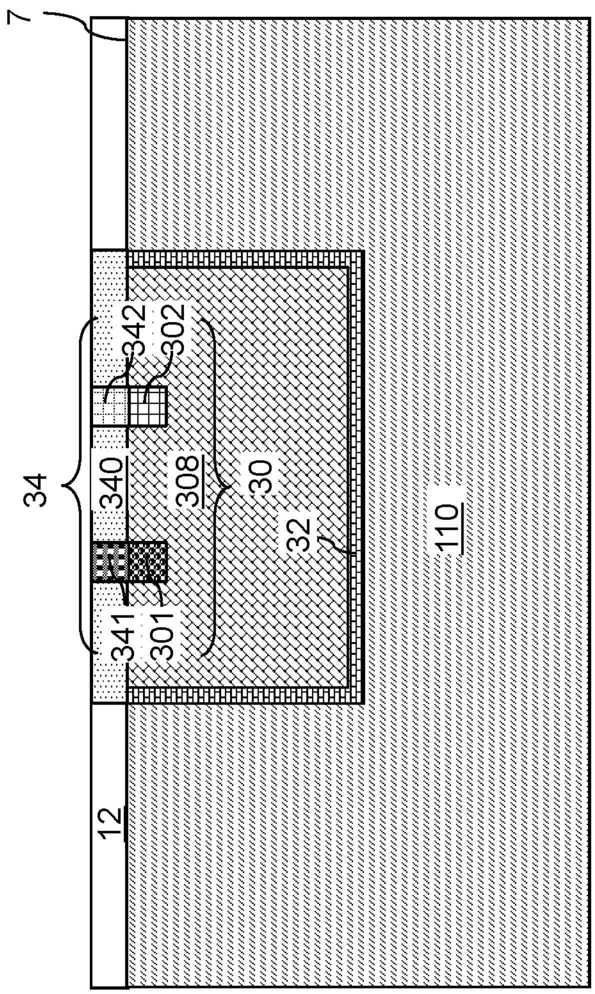

Referring to FIG. 5D, dopants of the first conductivity type may be implanted into a portion of the passivation silicon region 340 and an upper portion of the germanium-containing well 30 using a first masked ion implantation process. The implanted portion of the passivation silicon region 340 comprises a first-conductivity-type silicon region 341, and the implanted portion of the germanium-containing well 30 comprises a first-conductivity-type germanium-containing region 301. The first-conductivity-type silicon region 341 and the first-conductivity-type germanium-containing region 301 may be heavily doped. For example, each of the first-conductivity-type silicon region 341 and the first-conductivity-type germanium-containing region 301 may include electrical dopants of the first conductivity type at an atomic concentration in a range from $1.0\times10^{19}/cm^3$ to $2.0\times10^{21}/cm^3$.

Dopants of the second conductivity type may be implanted into another portion of the passivation silicon region 340 and another upper portion of the germanium-containing well 30 using a second masked ion implantation process. The implanted portion of the passivation silicon region 340 comprises a second-conductivity-type silicon region 342, and the implanted portion of the germanium-containing well 30 comprises a second-conductivity-type germanium-containing region 302. The second-conductivity-type silicon region 342 and the second-conductivity-type germanium-containing region 302 may be heavily doped. For example, each of the second-conductivity-type silicon region 342 and the second-conductivity-type germanium-containing region 302 may include electrical dopants of the second conductivity type at an atomic concentration in a range from $1.0\times10^{19}/cm^3$ to $2.0\times10^{21}/cm^3$.

The remaining portion of the passivation silicon region 340 may provide lateral isolation between the first-conductivity-type silicon region 341 and the second-conductivity-type silicon region 342. The combination of the passivation silicon region 340, the first-conductivity-type silicon region 341, and the second-conductivity-type silicon region 342 comprises a silicon capping structure 34, which is a silicon-containing capping structure.

The unimplanted portion of the germanium-containing well 30 is herein referred to as an intermediate germanium-containing region 308. The intermediate germanium-containing region 308 may be intrinsic or may have a doping with an atomic concentration of dopants in a range from $1.0\times10^{13}/cm^3$ to $1.0\times10^{18}/cm^3$. The intermediate germanium-containing region 308 provides lateral spacing between the first-conductivity-type germanium-containing region 301 and the second-conductivity-type germanium-containing region 302. The combination of the intermediate germanium-containing region 308, the first-conductivity-type germanium-containing region 301, and the second-conductivity-type germanium-containing region 302 comprises the germanium-containing well 30.

Figure 5E:
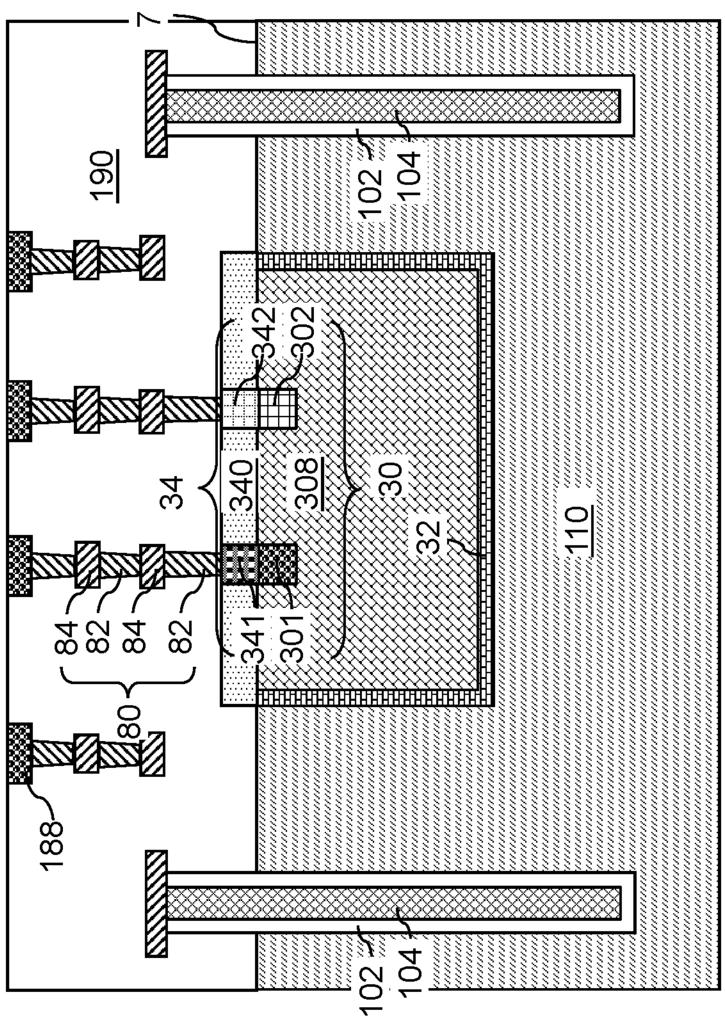

Referring to FIG. 5E, the dielectric mask layer 12 may be removed, for example, by performing an isotropic etch process such as a wet etch process. First dielectric material layers 190, through-substrate via structures 104, insulating spacers 102 that laterally surrounds the through-substrate via structures 104, metal interconnect structures 80, and first bonding pads 188 may be formed over the first semiconductor substrate 110.

Figure 5F:
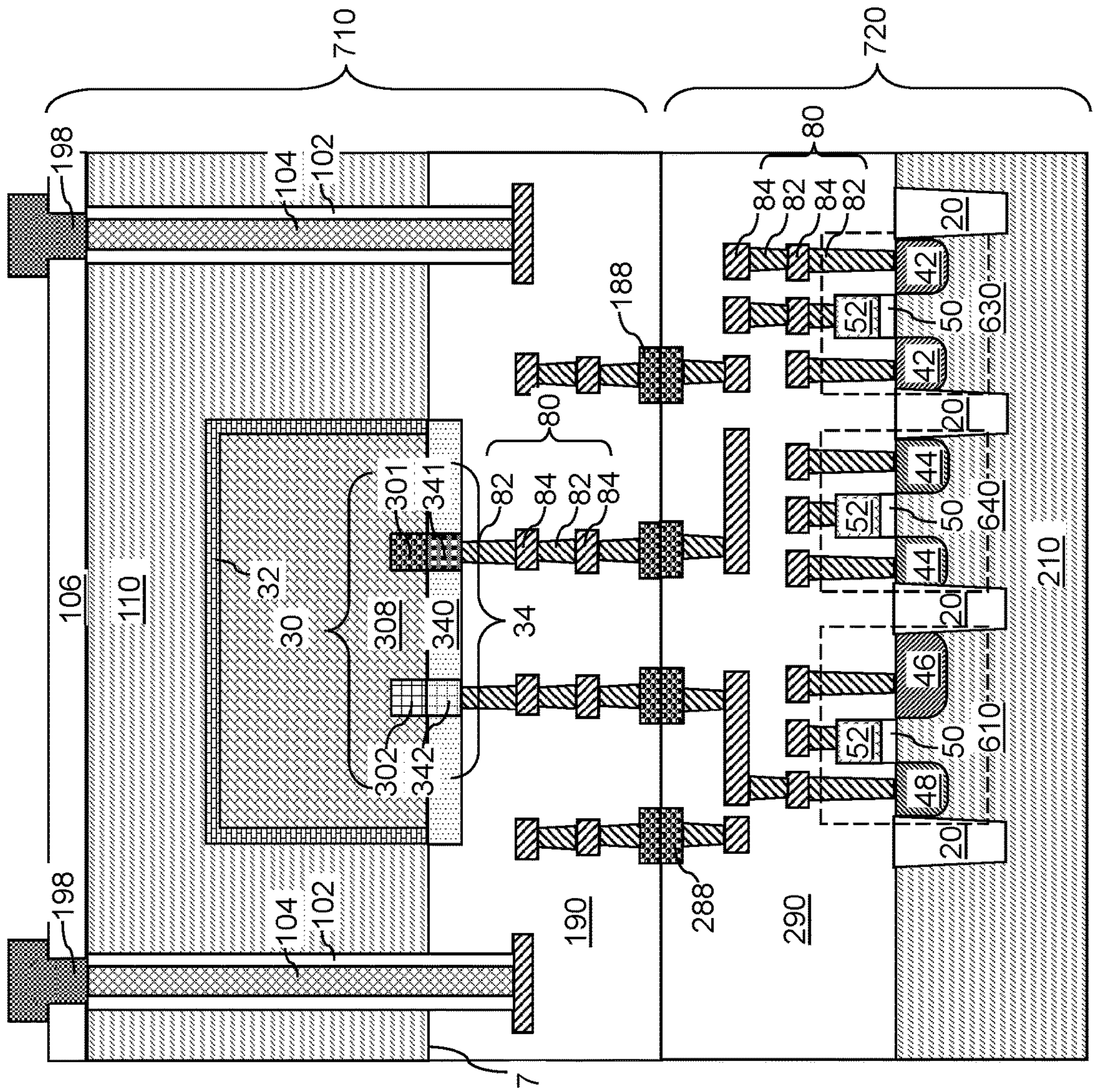

Referring to FIG. 5F, sensing circuits for photodetectors provided on the first semiconductor substrate 110 of FIG. 5E may be formed on a second semiconductor substrate 210. An array of sensing circuits may be formed for an array of photodetectors provided on the first semiconductor substrate 110 of FIG. 5F. For example, each sensing circuit for a photodetector may include a transfer transistor 610 including a source region 48 and a floating drain region 46, and additional field effect transistors that may include p-type field effect transistors 630 and n-type field effect transistors 640. The sensing circuit of FIG. 5F as provided on the second semiconductor substrate 210 may be the same as the sensing circuit of FIG. 2K as provided on the single crystalline silicon substrate 10. Metal interconnect structures 80 formed within second dielectric material layers 290 may be formed over the second semiconductor substrate 210 to provide electrical wiring to and from the various semiconductor devices on the second semiconductor substrate 210. Second bonding pads 288 may be formed on the second dielectric material layers 290.

A first wafer including the first semiconductor substrate 110 and the first dielectric material layers 190 may be bonded to a second wafer including the second semiconductor substrate 210 and the second dielectric material layers 290 by wafer-to-wafer bonding. For example, the first bonding pads 188 and be aligned to, and disposed upon, the second bonding pads 288, and metal-to-metal bonding may be induced on each mating pair of a first bonding pad 188 and a second bonding pad 288. Subsequently, the backside of the first semiconductor substrate 110 may be thinned to physically expose top surfaces of the through-substrate via structures 104. A backside dielectric layer 106 may be formed on the backside of the first semiconductor substrate 110, and external bonding pads 198 may be formed through the backside dielectric layer 106 on a backside surface of a respective one of the through-substrate via structures 104. The bonded assembly of the first wafer and the second wafer may be diced to provide bonded semiconductor dies. Each bonded semiconductor die may include a first semiconductor die 710 including diced portions of the first semiconductor substrate 110 and the first dielectric material layers 190, and a second semiconductor die 720 including diced portions of the second semiconductor substrate 210 and the second dielectric material layers 290.

Figure 6A:
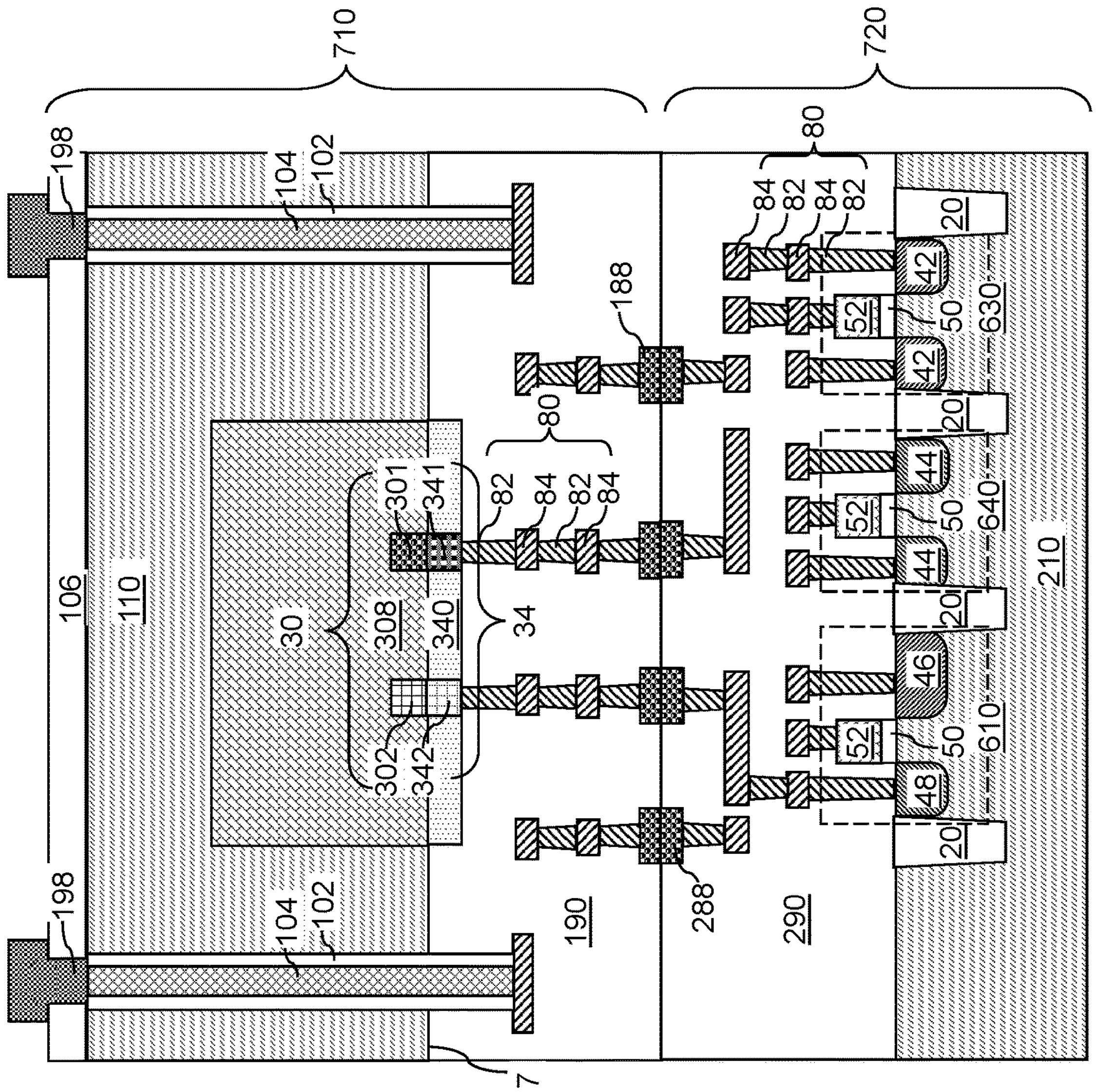
FIGS. 6A-6F are vertical cross-sectional views of alternative configurations of the fourth exemplary structure according to the fourth embodiment of the present disclosure.

FIGS. 6A-6F are vertical cross-sectional views of alternative configurations of the fourth exemplary structure according to the fourth embodiment of the present disclosure. Referring to FIG. 6A, a first alternative configuration of the fourth exemplary structure may be derived from the fourth exemplary structure of FIG. 5F by omitting formation of the silicon liner 32. In this embodiment, the germanium-containing well 30 may be formed directly on sidewalls and a horizontal surface of the trench 69. Thus, the germanium-containing well 30 may directly contact the single crystalline silicon substrate comprising the first semiconductor substrate 110.

Figure 6B:
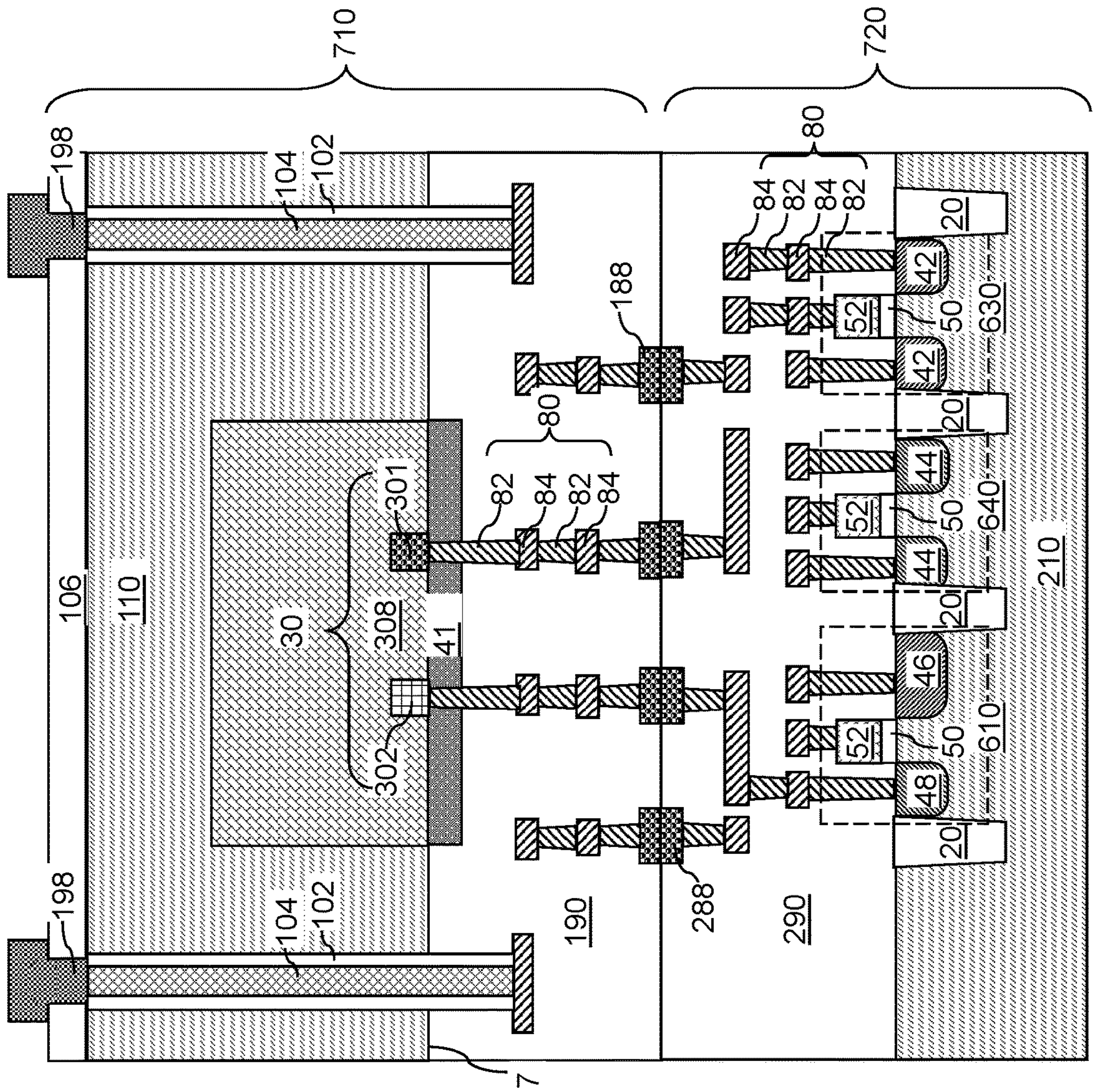

Referring to FIG. 6B, a second alternative configuration of the fourth exemplary structure may be derived from the first alternative configuration of the fourth exemplary structure of FIG. 6A by forming a silicon nitride capping structure 41 in lieu of a silicon capping structure 34. In this embodiment, each of the first-conductivity-type germanium-containing region 301 and the second-conductivity-type germanium-containing region 302 may be directly contacted by a respective one of the metal interconnect structures 80, such as a respective metal via structure 82.

Figure 6C:
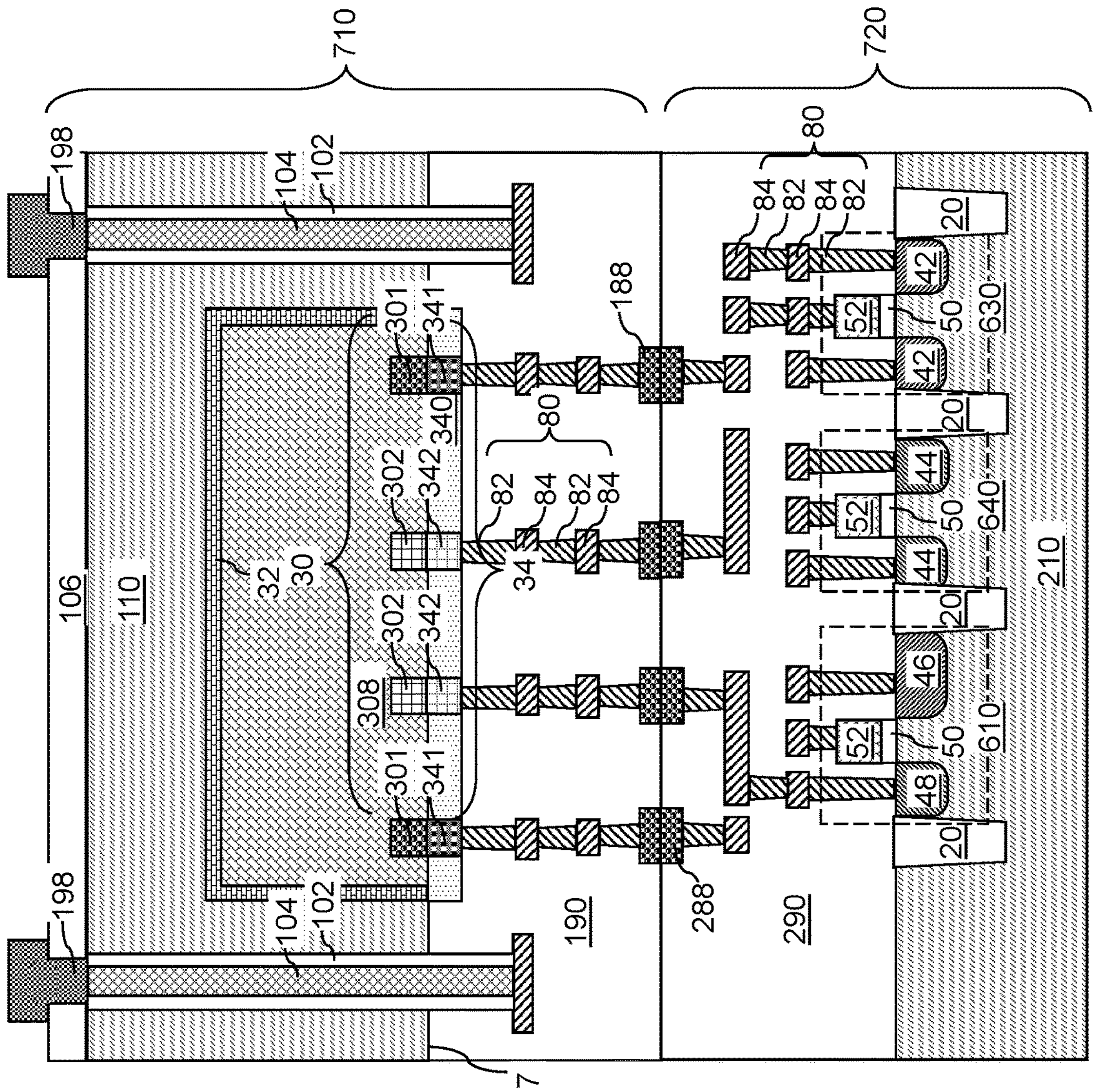

Referring to FIG. 6C, a third alternative configuration of the fourth exemplary structure may be derived from the fourth exemplary structure of FIG. 5F by forming a plurality of first-conductivity-type germanium-containing regions 301 and/or a plurality of second-conductivity-type germanium-containing region 302. In this embodiment, a plurality of first-conductivity-type silicon regions 341 and/or a plurality of second-conductivity-type silicon regions 342 may be formed.

Figure 6D:
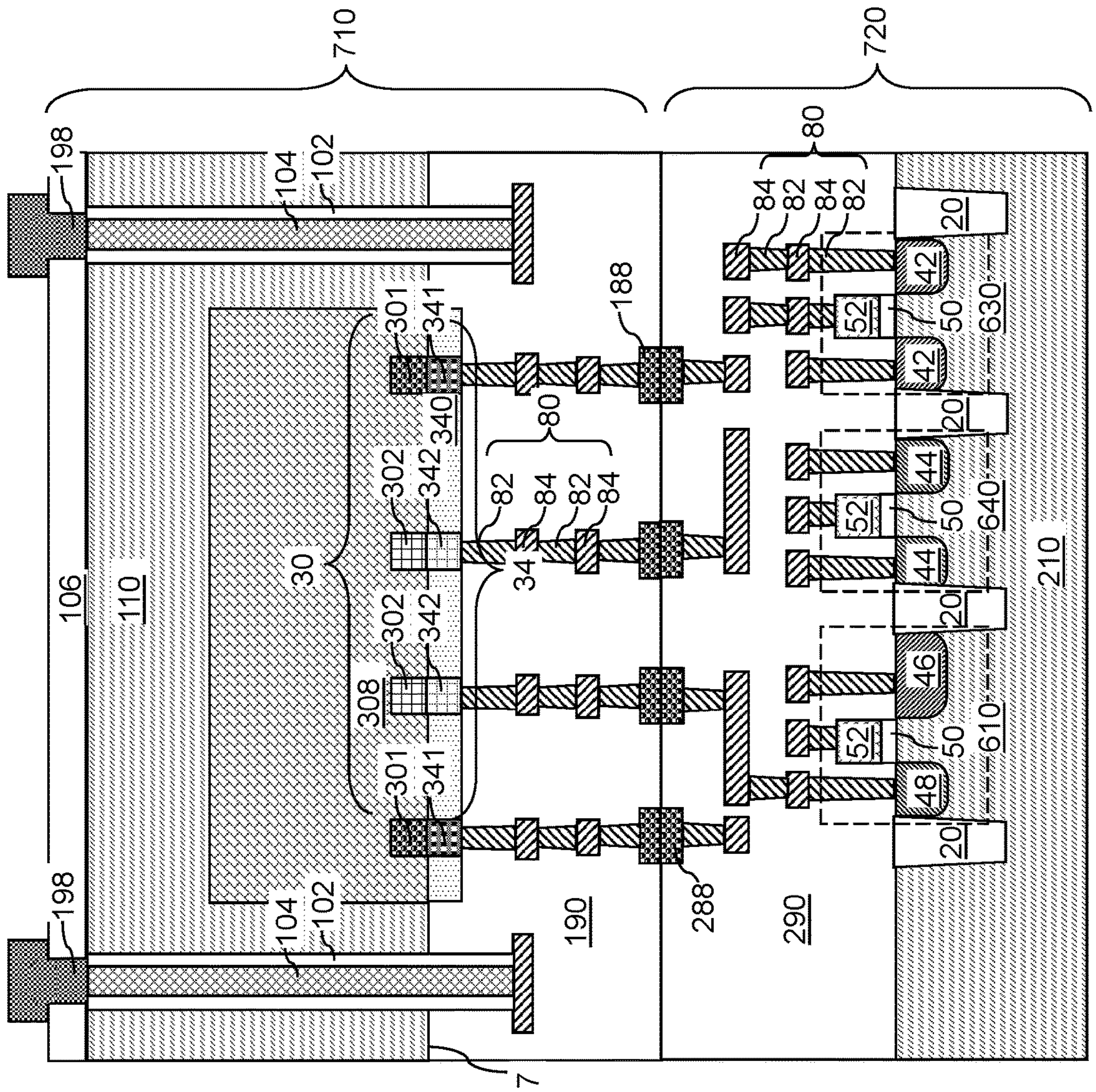

Referring to FIG. 6D, a fourth alternative configuration of the fourth exemplary structure may be derived from the first alternative configuration of the fourth exemplary structure of FIG. 6A by forming a plurality of first-conductivity-type germanium-containing regions 301 and/or a plurality of second-conductivity-type germanium-containing region 302. In this embodiment, a plurality of first-conductivity-type silicon regions 341 and/or a plurality of second-conductivity-type silicon regions 342 may be formed.

Figure 6E:
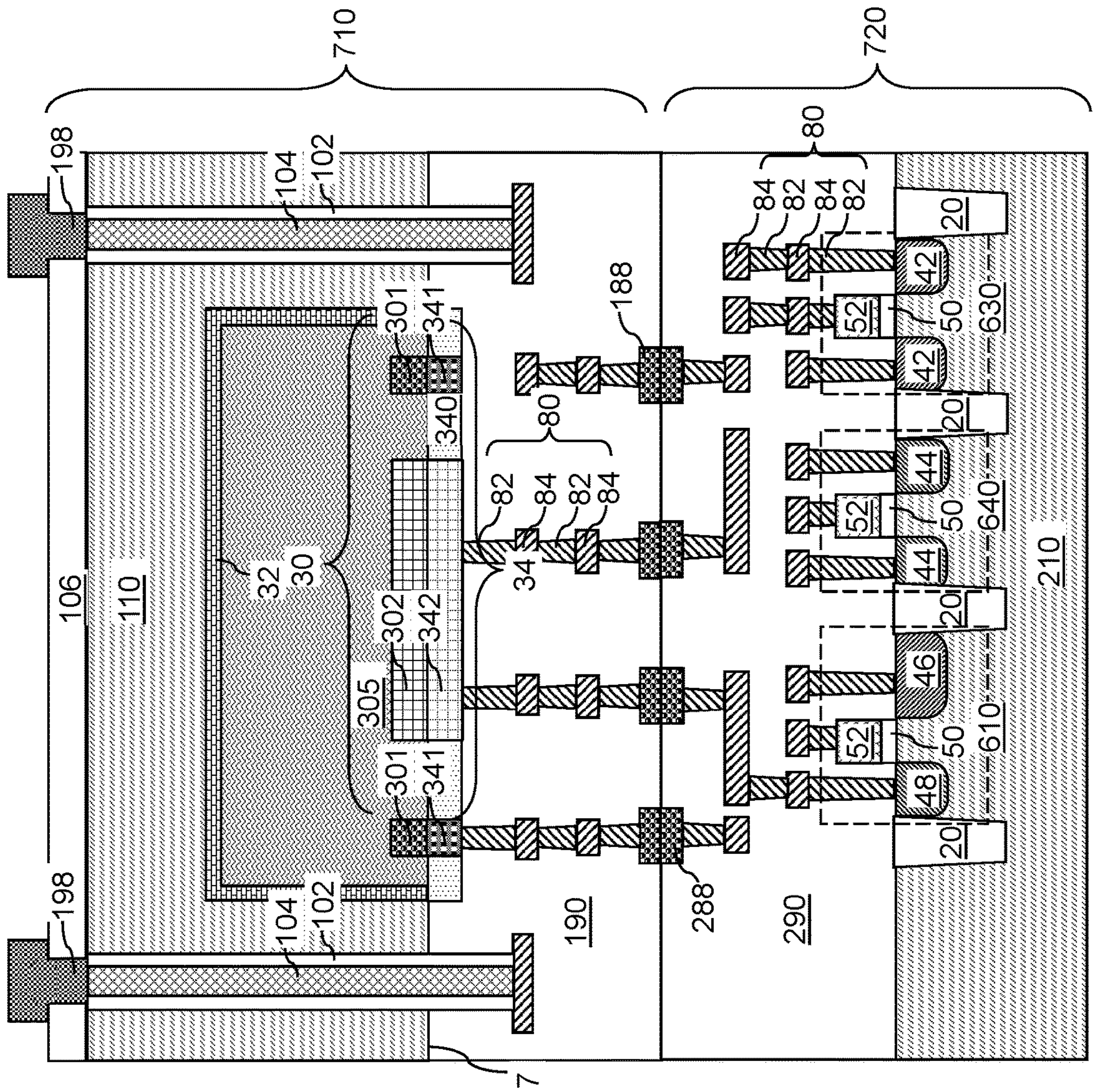

Referring to FIG. 6E, a fifth alternative configuration of the fourth exemplary structure may be derived from the fourth exemplary structure of FIG. 5F or from the third alternative configuration of the fourth exemplary structure of FIG. 6C by doping the intermediate germanium-containing region 308 with dopants of the first conductivity type to form an additional first-conductivity-type germanium-containing region 305. In this embodiment, the atomic concentration of dopants of the first conductivity type within the additional first-conductivity-type germanium-containing region 305 may be in a range from $1.0\times10^{17}/cm^3$ to $1.0\times10^{19}/cm^3$, although lesser and greater atomic concentrations may also be used. In this embodiment, the photovoltaic junction may be a p-n junction.

Figure 6F:
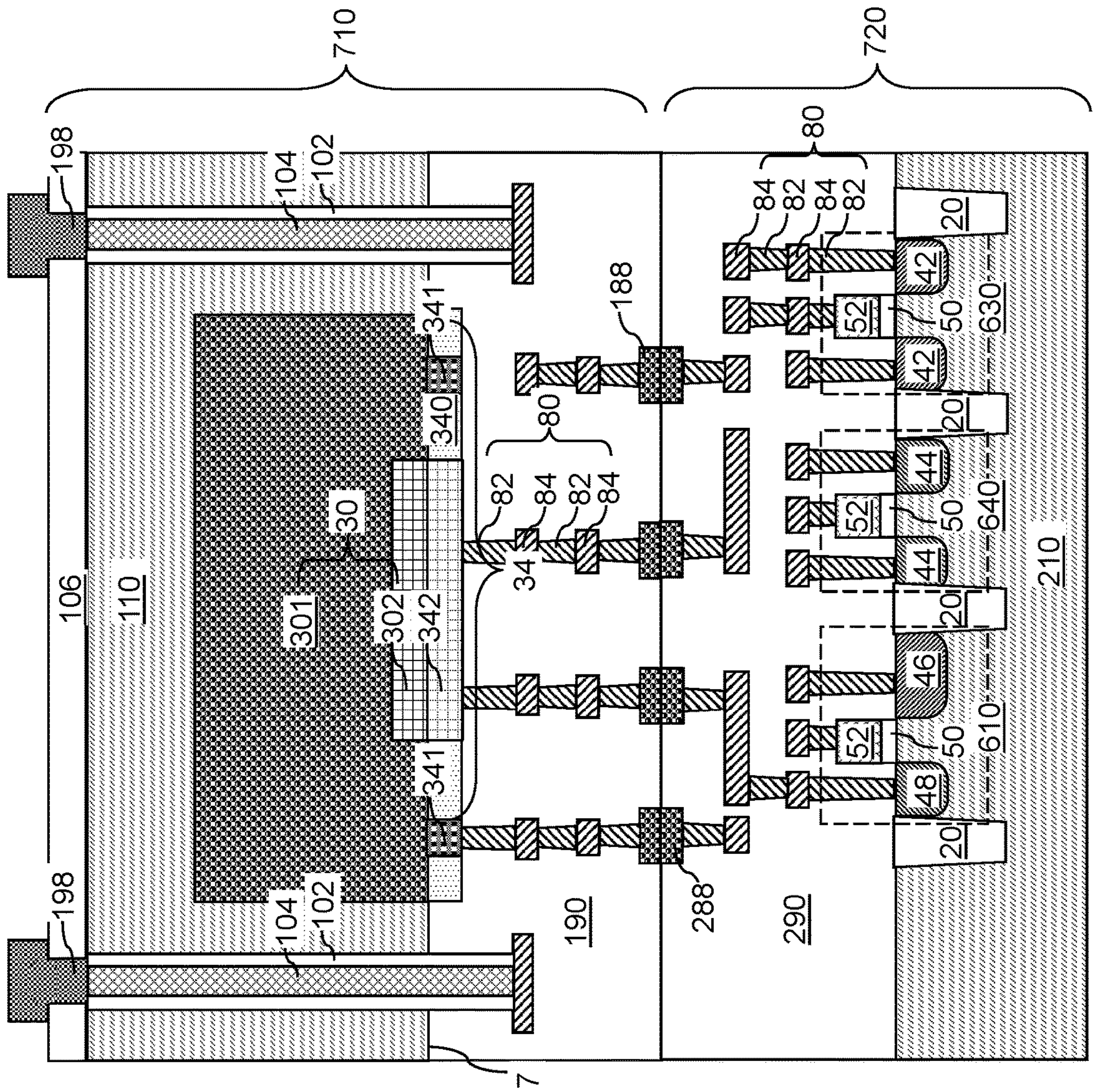

Referring to FIG. 6F, a sixth alternative configuration of the fourth exemplary structure may be derived from the fifth alternative configuration of the fourth exemplary structure of FIG. 6E by doping the intermediate germanium-containing region 308 with dopants of the first conductivity type at an atomic concentration on par with the atomic concentration of dopants of the first conductivity type in the first-conductivity-type germanium-containing regions 301. In this embodiment, the first-conductivity-type germanium-containing region 301 replaces the intermediate germanium-containing region 308. A p-n junction may be formed between the first-conductivity-type germanium-containing regions 301 and the second-conductivity-type germanium-containing region 302. The germanium-containing well 30 includes, and/or consists of, the first-conductivity-type germanium-containing regions 301 and the second-conductivity-type germanium-containing region 302.

Figure 7A:
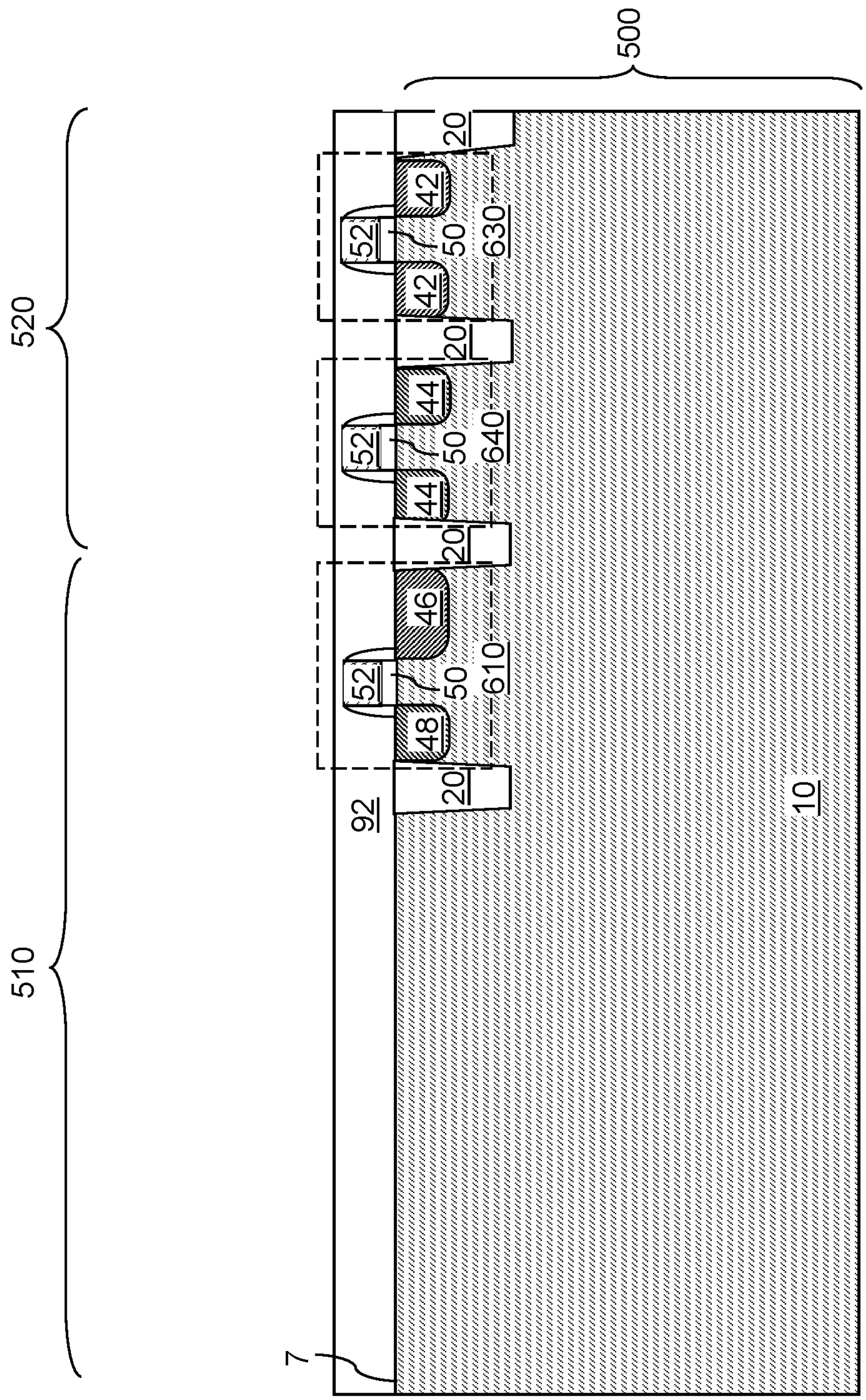
FIG. 7A-7G are sequential vertical cross-sectional views of a fifth exemplary structure during formation of a pixel of an image sensor according to a fifth embodiment of the present disclosure.

FIG. 7A-7G are sequential vertical cross-sectional views of a fifth exemplary structure during formation of a pixel of an image sensor according to a fifth embodiment of the present disclosure. Referring to FIG. 7A, a fifth exemplary structure according to a fifth embodiment of the present disclosure may be formed by providing a semiconductor substrate 500, which may include a single crystalline silicon substrate 10. The single crystalline silicon substrate 10 may be the same as in the first exemplary structure. Semiconductor devices for forming a sensing circuit may be formed on, and/or in, an upper portion of the single crystalline silicon substrate 10. For example, the semiconductor devices may include a transfer transistor 610, p-type field effect transistors 630, and n-type field effect transistors 640. The transfer transistor 610 may be formed in the photodetector region 510, and the p-type field effect transistors 630 and the n-type field effect transistors 640 may be formed in the sensing circuit region 520. The various field effect transistors (610, 630, 640) may be the same as in the first exemplary structure.

A dielectric material such as silicon oxide may be deposited over the semiconductor devices on the proximal horizontal surface of the single crystalline silicon substrate 10, and may be planarized to provide a dielectric mask layer 92 having a horizontal top surface. The thickness of the dielectric mask layer 92 may be greater than the height of the gate electrodes 52, and the dielectric mask layer 92 may cover the gate electrodes 52.

Figure 7B:
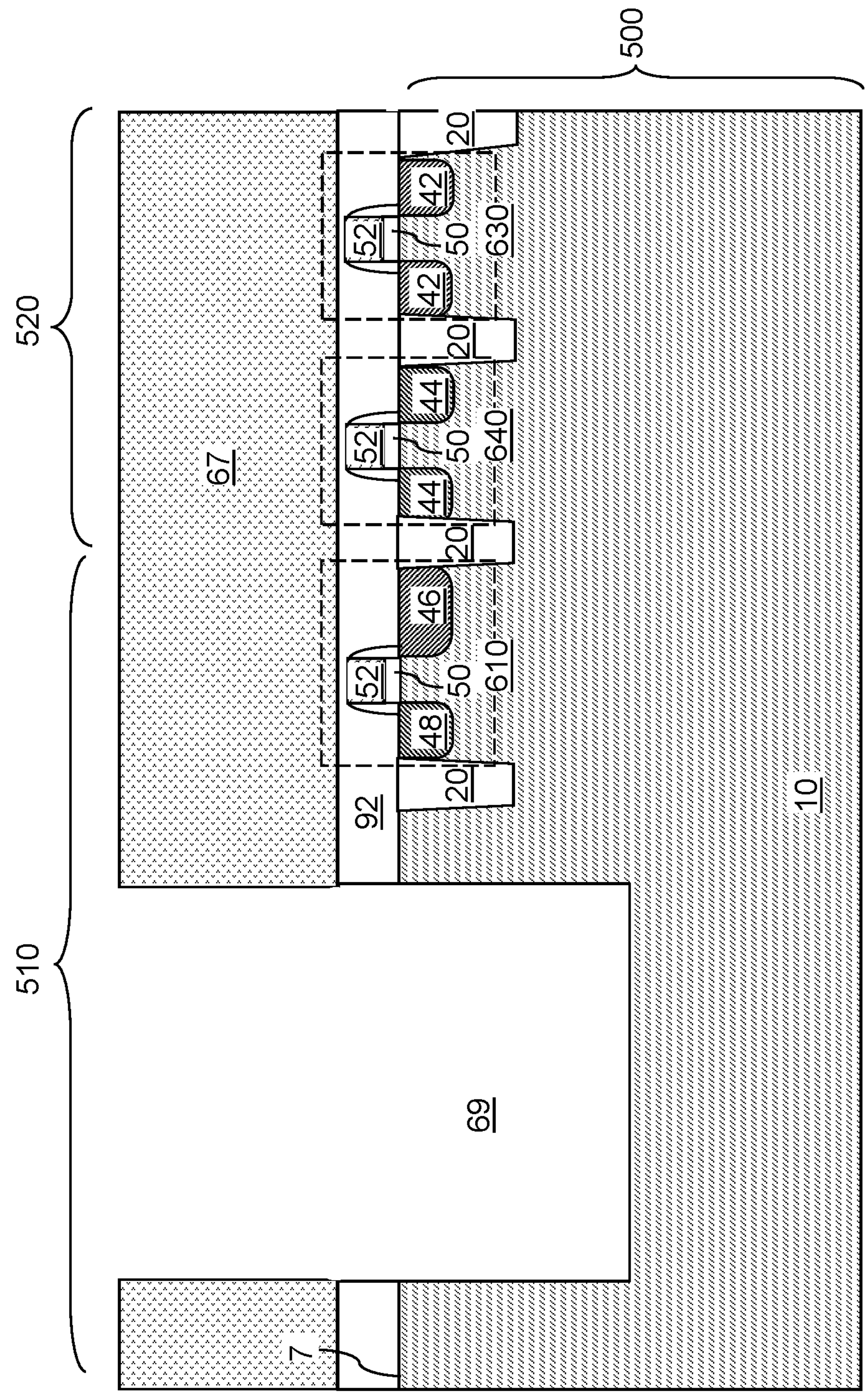

Referring to FIG. 7B, a photoresist layer 67 may be applied over the dielectric mask layer 92, and may be lithographically patterned to form an opening within the photodetector region 510. An anisotropic etch process may be performed to transfer the pattern of the opening in the photoresist layer 67 through the dielectric mask layer 92 and into an upper portion of the single crystalline silicon substrate 10. A trench 69 may be formed in the upper portion of the single crystalline silicon substrate 10. In one embodiment, the depth of the trench 69 may be in a range from 0.5 micron to 10 microns, such as from 1 micron to 6 microns, although lesser and greater depths may also be used. The lateral dimension of the trench 69 may be in a range from 0.5 micron to 30 microns, such as from 1 micron to 15 microns. The lateral dimension of the trench 69 may be the diameter or the major axis of the horizontal cross-sectional shape of the trench 69 in embodiments in which the trench 69 has a circular or an elliptical horizonal cross-sectional shape, or may be the length of a side of a rectangular shape in embodiments in which the horizontal cross-sectional shape of the trench 69 is the rectangular shape. The photoresist layer 67 may be subsequently removed, for example, by ashing.

Figure 7C:
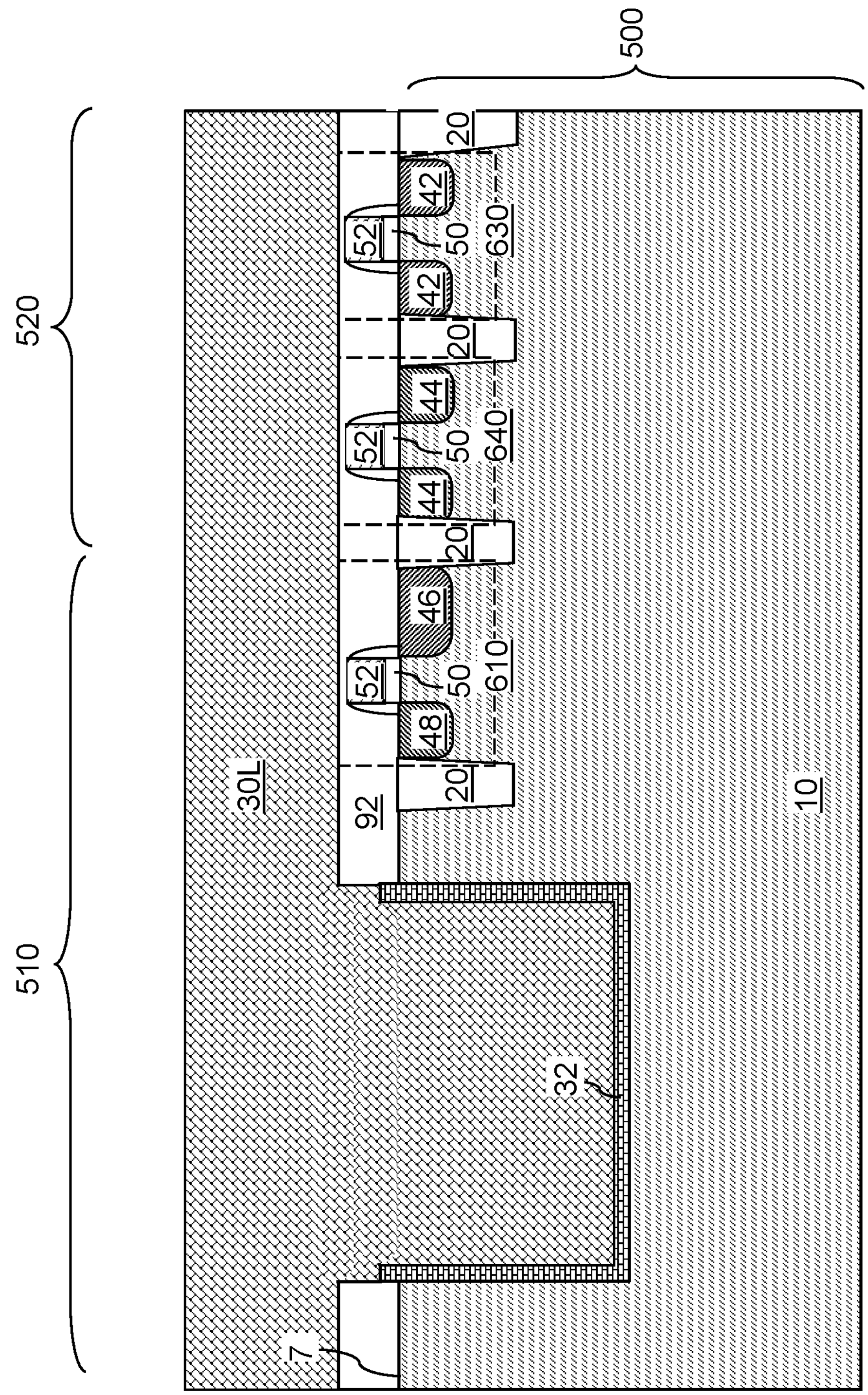

Referring to FIG. 7C, the processing steps of FIGS. 2D and 2E may be performed to form a silicon liner 32 and a germanium-containing material layer 30L. The silicon liner 32 may have the same thickness, the same crystallinity, and/or the same material composition as in the first exemplary structure. The germanium-containing material layer 30L may have the same crystallinity and the same material composition as in the first exemplary structure.

Figure 7D:
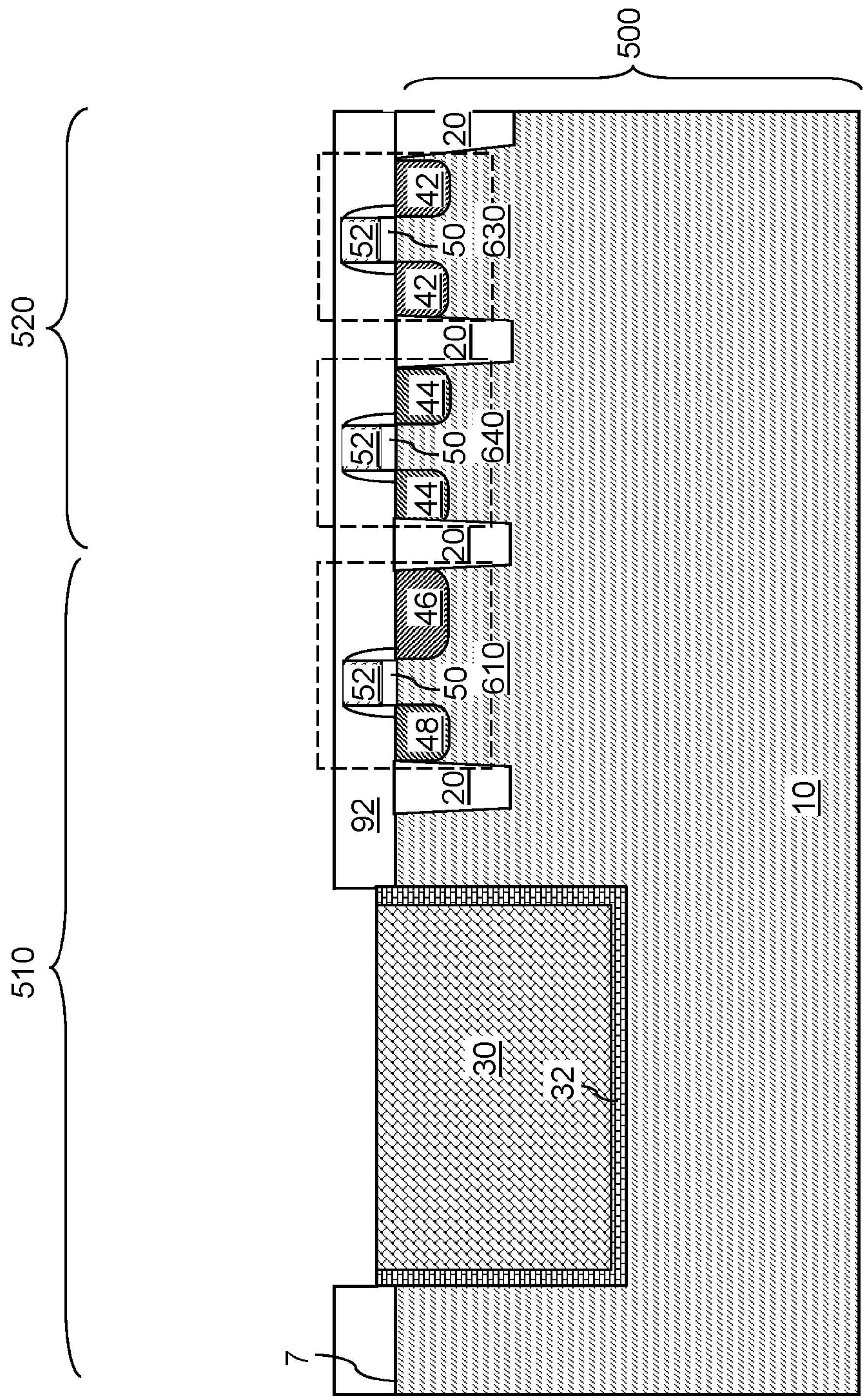

Referring to FIG. 7D, the processing steps of FIGS. 2F and 2G may be performed to form a germanium-containing well 30.

Figure 7E:
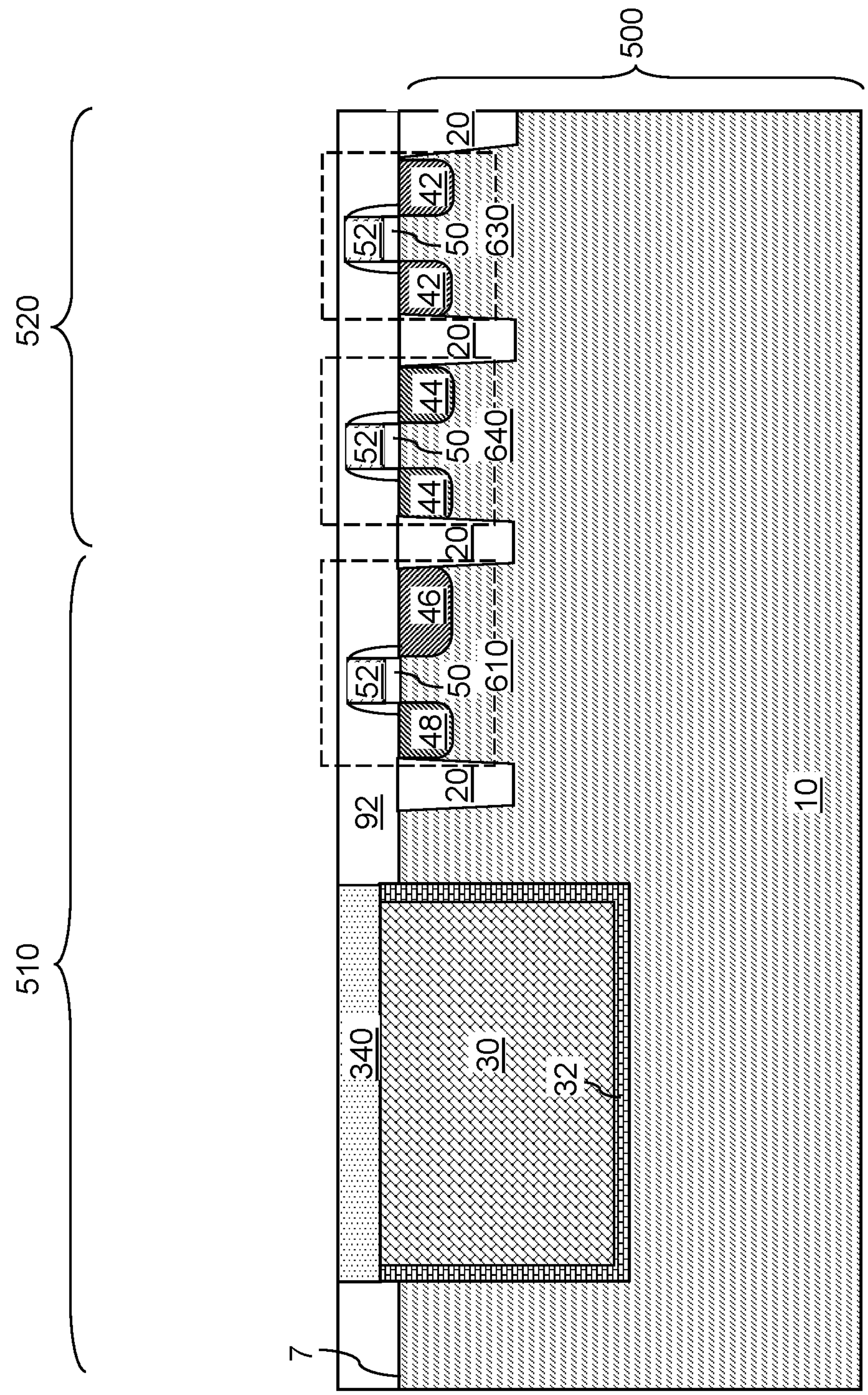

Referring to FIG. 7E, the processing steps of FIG. 2H may be performed to form a passivation silicon region 340. In one embodiment, the passivation silicon region 340 may have a top surface within a horizontal plane including the top surface of the dielectric mask layer 92.

Figure 7F:
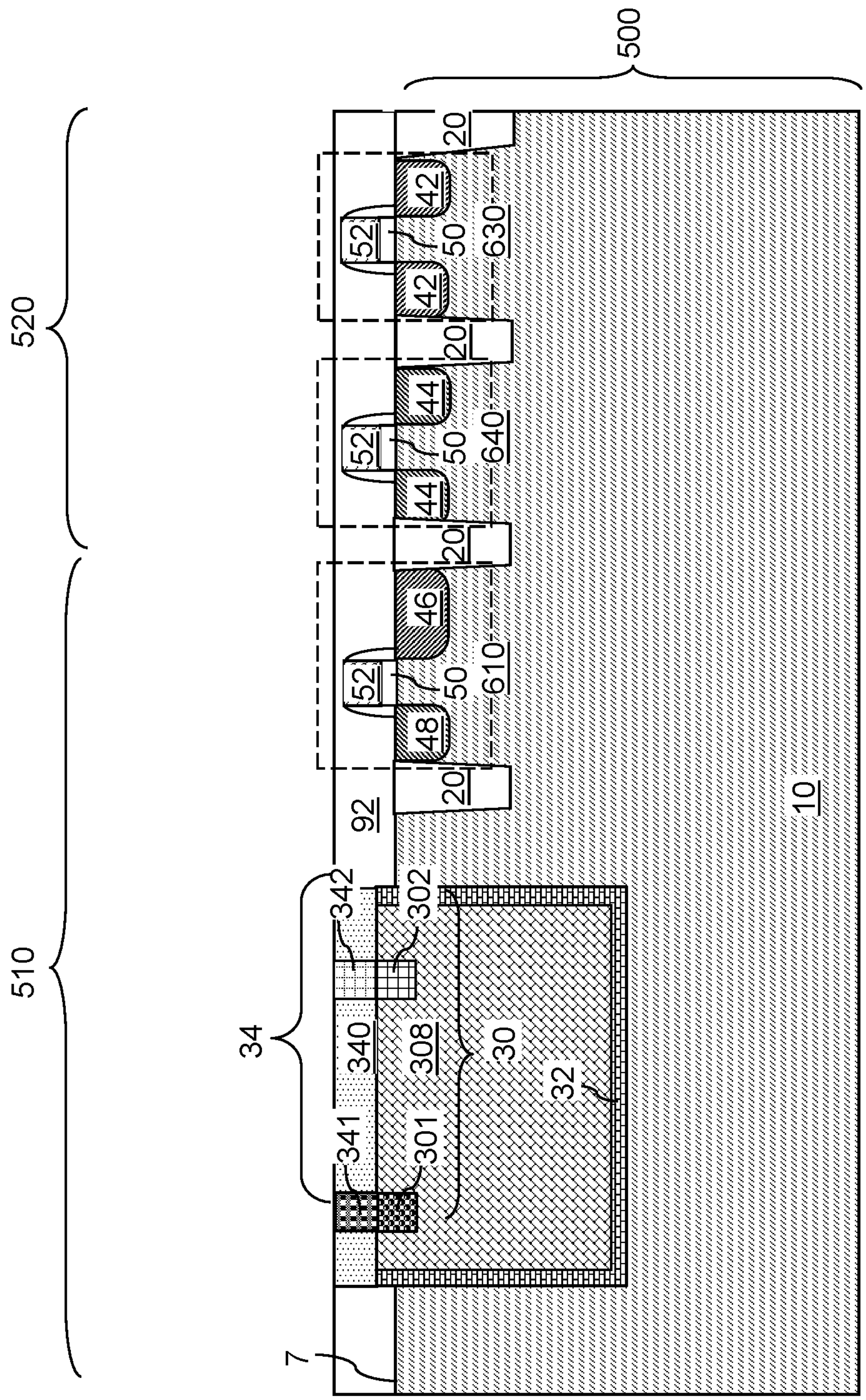

Referring to FIG. 7F, the processing steps of FIG. 5D may be performed to form a first-conductivity-type silicon region 341, a first-conductivity-type germanium-containing region 301, a second-conductivity-type silicon region 342, and a second-conductivity-type germanium-containing region 302. The remaining portion of the passivation silicon region 340 may provide lateral isolation between the first-conductivity-type silicon region 341 and the second-conductivity-type silicon region 342. The combination of the passivation silicon region 340, the first-conductivity-type silicon region 341, and the second-conductivity-type silicon region 342 comprises a silicon capping structure 34, which is a silicon-containing capping structure. The combination of the intermediate germanium-containing region 308, the first-conductivity-type germanium-containing region 301, and the second-conductivity-type germanium-containing region 302 comprises the germanium-containing well 30. Alternatively, any of the p-i-n junction structures illustrated in FIGS. 6A-6D or the p-n junction structures illustrated in FIGS. 6E and 6F may be formed instead of the p-i-n junction illustrated in FIG. 7F. Generally, any p-i-n junction or any p-n junction described above may be formed in the trench 69.

Figure 7G:
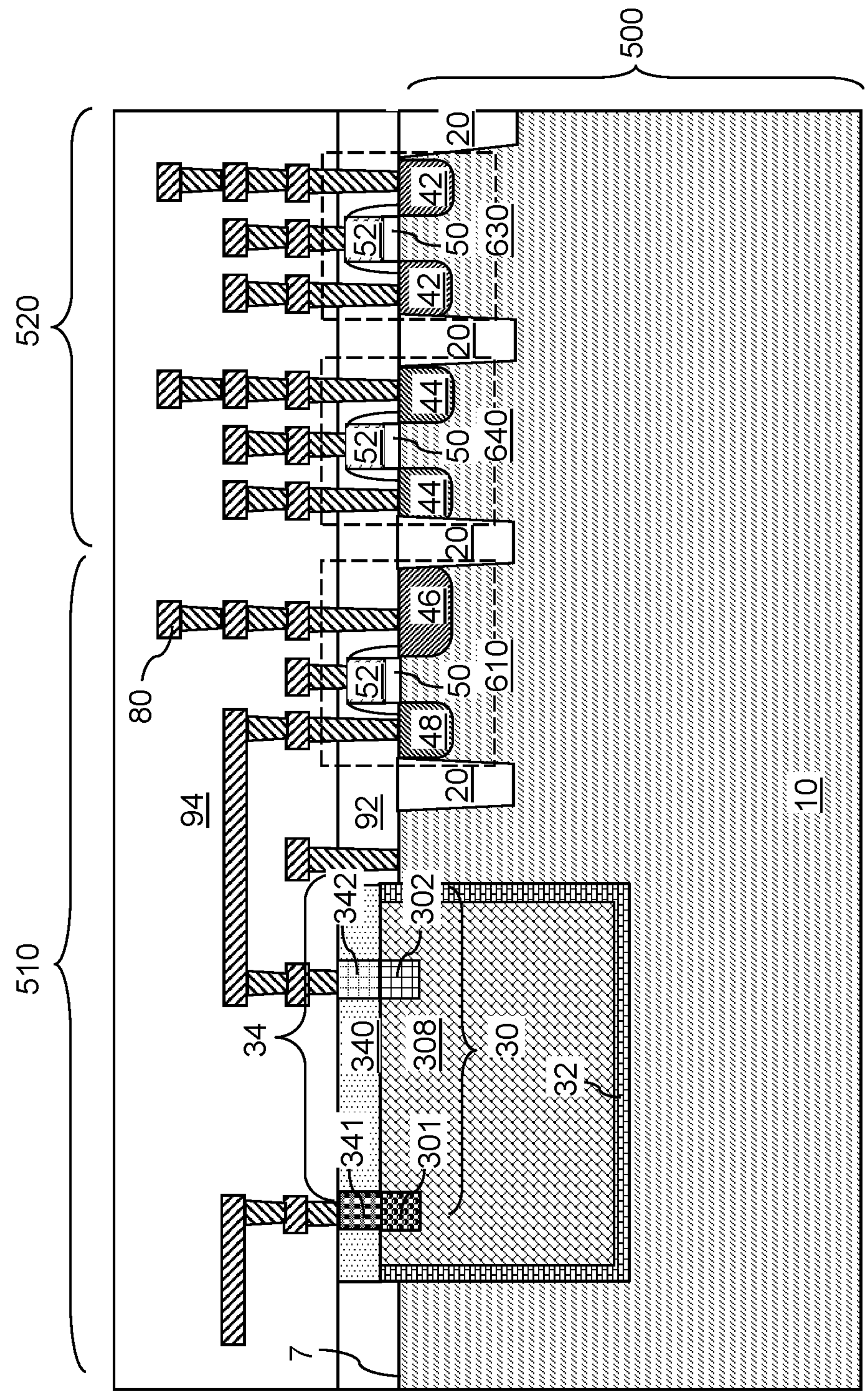

Referring to FIG. 7G, additional dielectric material layers 94 and metal interconnect structures 80 may be formed to provide electrical connection to and from the various nodes of the semiconductor devices and the photodetector. For example, the second-conductivity-type germanium-containing region 302 may be connected to the source region 48 of the transfer transistor 610 through a subset of the metal interconnect structures 80 and the second-conductivity-type silicon region 342. The first-conductivity-type germanium-containing region 301 may be suitably biased by a biasing circuit through another subset of metal interconnect structures 80.

Figure 7H:
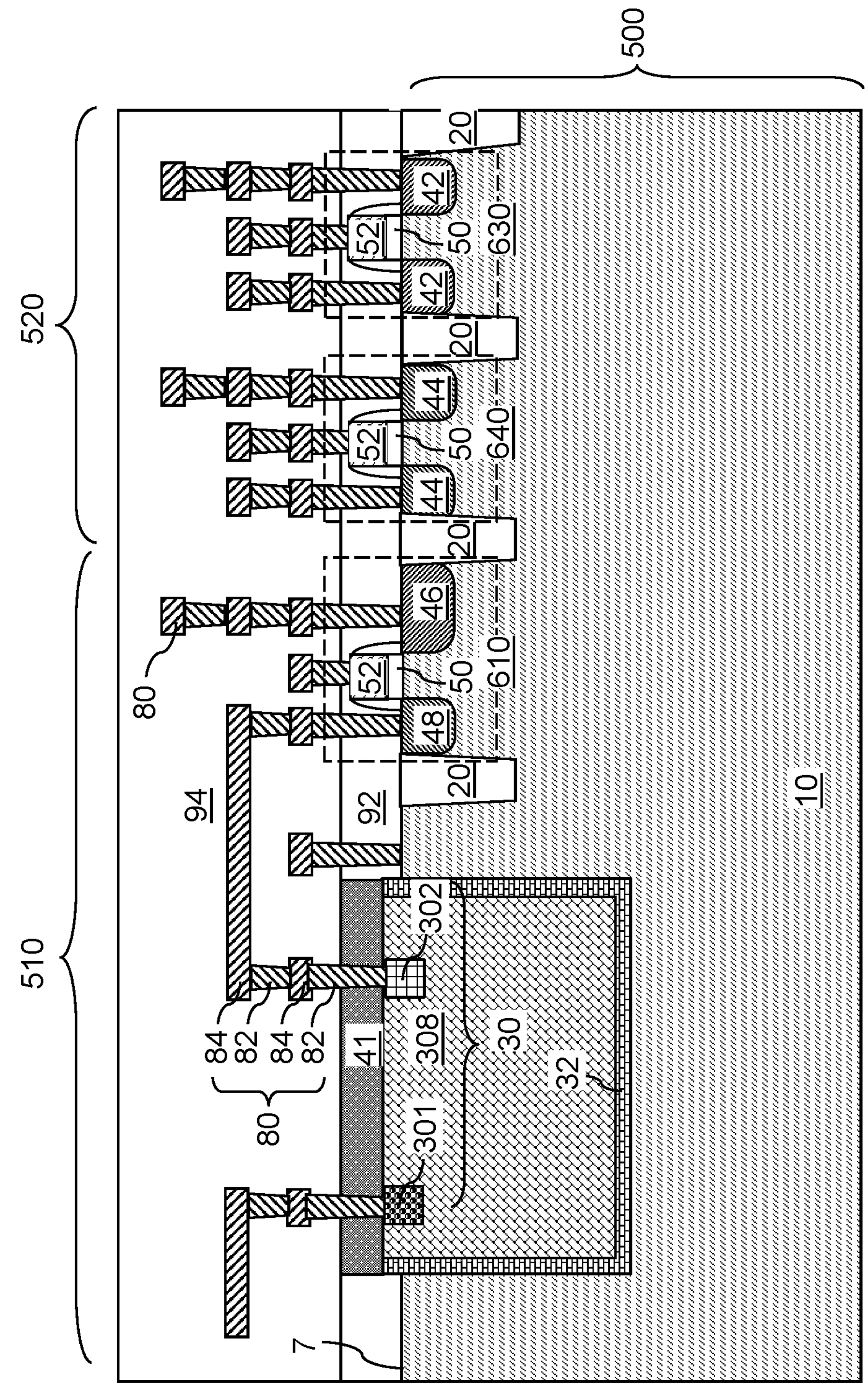
FIG. 7H is a vertical cross-sectional view of an alternative configuration of the fifth exemplary structure according to the fifth embodiment of the present disclosure.

FIG. 7H is a vertical cross-sectional view of an alternative configuration of the fifth exemplary structure according to the fifth embodiment of the present disclosure. Referring to FIG. 7H, an alternative configuration of the fifth exemplary structure may be derived from the fifth exemplary structure of FIG. 7G by forming a silicon nitride capping structure 41 in lieu of a silicon capping structure 34. In this embodiment, each of the first-conductivity-type germanium-containing region 301 and the second-conductivity-type germanium-containing region 302 may be directly contacted by a respective one of the metal interconnect structures 80, such as a respective metal via structure 82.

Generally, any type of photovoltaic junction may be formed within the germanium-containing well 30. The photovoltaic junction may be a vertical p-i-n junction, a lateral p-i-n junction, a vertical p-n junction, or a lateral p-n junction. Further, the configuration of a pinned diode using an pinning layer or the configuration of a single-photon avalanche diode (SPAD) may also be used. While specific embodiments of the photovoltaic junction formed within a germanium-containing well 30 are described herein, it is to be understood that the scope of the present disclosure is not limited by any particular configuration of a photovoltaic junction provided that a germanium-containing well 30 is used as a component of a photovoltaic junction.

The germanium-containing material of the germanium-containing well 30 may be doped germanium or a doped silicon-germanium alloy including germanium at an atomic percentage greater than 50%. The germanium-containing well 30 may be completely encapsulated by a combination of the first-conductivity-type silicon region 21 and the silicon-containing capping structure (34 or 41), or by a combination of the silicon liner 32 and the silicon-containing capping structure (34 or 41). Thus, physical contact between the germanium-containing well 30 and the dielectric material layers 90 or any other oxygen-containing component within the fourth or fifth exemplary structure may be avoided, and the germanium-containing well 30 may remain free of oxidation.

Referring to FIGS. 5A-7H and according to various embodiments of the present disclosure, a semiconductor structure including a photodetector is provided. The photodetector comprises: a germanium-containing well 30 embedded in a single crystalline silicon substrate (10, 110) and extending to a proximal horizontal surface 7 of the single crystalline silicon substrate (10, 110), wherein the germanium-containing well 30 includes germanium at an atomic percentage greater than 50%; and a silicon-containing capping structure (34 or 41) located on a top surface of the germanium-containing well 30 and including silicon atoms at an atomic percentage greater than 42%. The silicon-containing capping structure (34 or 41) may comprise a silicon capping structure 34 consisting essentially of doped silicon, or as a silicon nitride capping structure 41 consisting essentially of silicon nitride. The germanium-containing well 30 comprises a photovoltaic junction including a first-conductivity-type germanium-containing region 301 and a second-conductivity-type germanium-containing region 302.

In one embodiment, the photovoltaic junction comprises a p-i-n junction; and the germanium-containing well 30 comprises an intermediate germanium-containing region 308 having an atomic concentration of dopants in a range from $1.0\times10^{13}/cm^3$ to $1.0\times10^{17}/cm^3$ and contacting the first-conductivity-type germanium-containing region 301 and the second-conductivity-type germanium-containing region 302.

In one embodiment, the silicon capping structure 34 comprises: a first-conductivity-type silicon region 341 contacting the first-conductivity-type germanium-containing region 301; and a second-conductivity-type silicon region 342 contacting the second conductivity type germanium-containing region 302.

In one embodiment, the silicon capping structure 34 comprises an passivation silicon region 340 having an atomic concentration of dopants in a range from $1.0\times10^{13}/cm^3$ to $1.0\times10^{17}/cm^3$ and located between the first-conductivity-type silicon region 341 and the second-conductivity-type silicon region 342.

In one embodiment, the germanium-containing well 30 comprises a single crystalline germanium-containing semiconductor material in epitaxial alignment with the single crystalline silicon substrate (10, 110). In one embodiment, a proximal surface of the silicon-containing capping structure (34 or 41) is in contact with the germanium-containing well 30; and a distal surface of the silicon-containing capping structure (34 or 41) is vertically offset away from a horizontal plane including a proximal horizontal surface 7 of the single crystalline silicon substrate (10, 110).

In one embodiment, the photovoltaic junction comprises a p-n junction; and the first-conductivity-type germanium-containing region 301 contacts the second-conductivity-type germanium-containing region 302.

In one embodiment, the semiconductor structure may comprise a sensing circuit comprising field effect transistors located on the single crystalline silicon substrate (10, 110); and dielectric material layers {90, 190, (92, 94)} located on the proximal horizontal surface 7 of the single crystalline silicon substrate (10, 110) and containing metal interconnect structures 80. A subset of the metal interconnect structures 80 may provide an electrically conductive path between the second-conductivity-type germanium-containing region 302 and a source/drain region of one of the field effect transistors (such as a source region 48 of a transfer transistor 610).

In one embodiment, the semiconductor structure may comprise: first dielectric material layers 190 located on the proximal horizontal surface 7 of the single crystalline silicon substrate 110 and containing first metal interconnect structures 80 and first bonding pads 188; a semiconductor die 720 comprising a semiconductor substrate 210, a sensing circuit comprising field effect transistors that are located on the semiconductor substrate 210, and second dielectric material layers 290 located on the semiconductor substrate 210 and containing second metal interconnect structures 80 and second bonding pads 288 therein. The second bonding pads 288 may be bonded to a respective one of the first bonding pads 188, and a subset of the first metal interconnect structures 80 and the second metal interconnect structures 80 provides an electrically conductive path between the second-conductivity-type germanium-containing region 302 and a source/drain region of one of the field effect transistors in the sensing circuit (such as a source region 48 of a transfer transistor 610).

Figure 8:
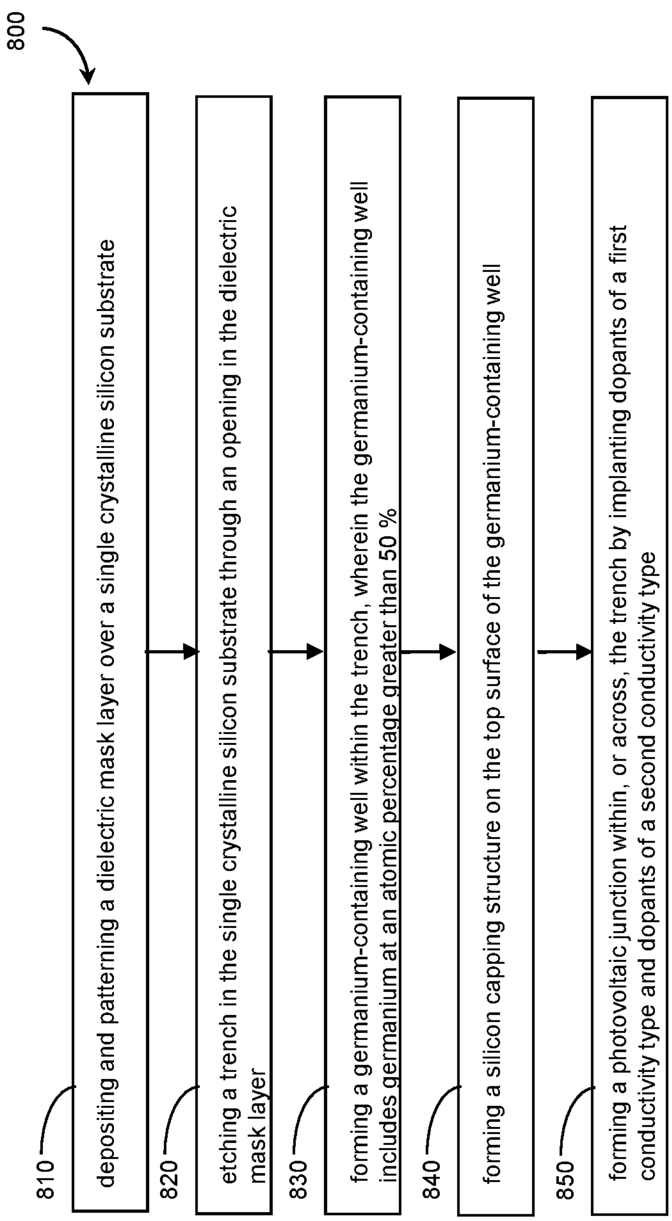
FIG. 8 is a first process flow diagram illustrating an exemplary process sequence for forming an image sensor according to an embodiment of the present disclosure.

Referring to FIG. 8, a first process flow diagram 800 illustrates an exemplary process sequence for forming an image sensor according to an embodiment of the present disclosure. Referring to step 810 and FIGS. 2B, 5A, and 7A, a dielectric mask layer (12, 92) may be deposited and patterned over a single crystalline silicon substrate (10, 110). Referring to step 820 and FIGS. 2B, 5A, and 7B, a trench 69 may be etched in the single crystalline silicon substrate (10, 110) through an opening in the dielectric mask layer (12, 92). Referring to step 830 and FIGS. 2C-2G, 3A, 3B, 4A, 4B, 5B, 5F, 6A-6F, 7C and 7D, and 7H, a germanium-containing well 30 may be formed within the trench 69. The germanium-containing well 30 includes germanium at an atomic percentage greater than 50%. In one embodiment, the germanium-containing well 30 may be single crystalline, and may be epitaxially aligned to the single crystalline silicon substrate (10, 110). Referring to step 840 and FIGS. 2H, 2L, 3A, 3B, 4A, 4B, 5C, 5F, 6A-6F, 7E, and 7H, a silicon-containing capping structure (34 or 41) may be formed on the top surface of the germanium-containing well 30. Referring to step 850 and FIGS. 2I-2L, 3A, 3B, 4A, 4B, 5D-5F, 6A-6F, and 7F-7H, a photovoltaic junction may be formed within, or across, the trench 69 by implanting dopants of a first conductivity type and dopants of a second conductivity type.

Figure 9:
FIG. 9 is a second process flow diagram illustrating an exemplary process sequence for forming an image sensor shown in FIG. 2K or in FIG. 2L.

Referring to FIG. 9, a second process flow diagram 950 illustrates an exemplary process sequence for forming an image sensor illustrated in FIG. 2K or in FIG. 2L. Referring to step 921 and FIG. 2A, a single crystalline silicon substrate 10 may be provided. Referring to step 922 and FIG. 2B, a patterned dielectric mask layer 12 may be formed on a top surface of the single crystalline silicon substrate 10, and a trench 69 may be formed in the upper portion of the single crystalline silicon substrate 10 employing the patterned dielectric mask layer 12 as an etch mask. Referring to step 923 and FIG. 2C, a first-conductivity-type silicon region 21 may be formed around the trench 69 within the single crystalline silicon substrate 10, for example, by ion implantation of dopants of a first conductivity type. Referring to step 924 and FIG. 2D, a silicon liner 32 may be optionally grown from physically exposed surfaces of the first-conductivity-type silicon region 21. Referring to step 925 and FIG. 2E, a germanium-containing material layer 30L may be formed in the trench 69 and over the single-crystalline silicon substrate 10. In one embodiment, an epitaxial deposition process may be performed to grow a single crystalline germanium-containing material inside the trench 69 to form the germanium-containing material layer 30L. Referring to step 926 and FIG. 2F, a germanium-containing well 30 may be formed by performing a planarization process on the germanium-containing material layer 30L. Referring to step 927 and FIG. 2G, the germanium-containing well 30 may be optionally vertically recessed. Referring to step 928 and FIGS. 2H and 2L, a silicon-containing capping structure (such as a passivation silicon region 340 illustrated in FIG. 2H or a silicon nitride capping structure 41 illustrated in FIG. 2L) may be formed on a top surface of the germanium-containing well 30. Referring to step 929 and FIGS. 2I and 2L, a second-conductivity-type germanium-containing region 302 may be formed by doping an upper portion of the germanium-containing well 30 with dopants of a second conductivity type. Referring to step 930 and FIGS. 2J and 2L, field effect transistors (610, 630, 640) may be formed in a photodetector region 510 and in a sensing circuit region 520 on the single crystalline silicon substrate 10. Referring to step 931 and FIGS. 2K and 2L, dielectric material layers 90 and metal interconnect structures 80 may be formed over the field effect transistors (610, 630, 640).

Figure 10:
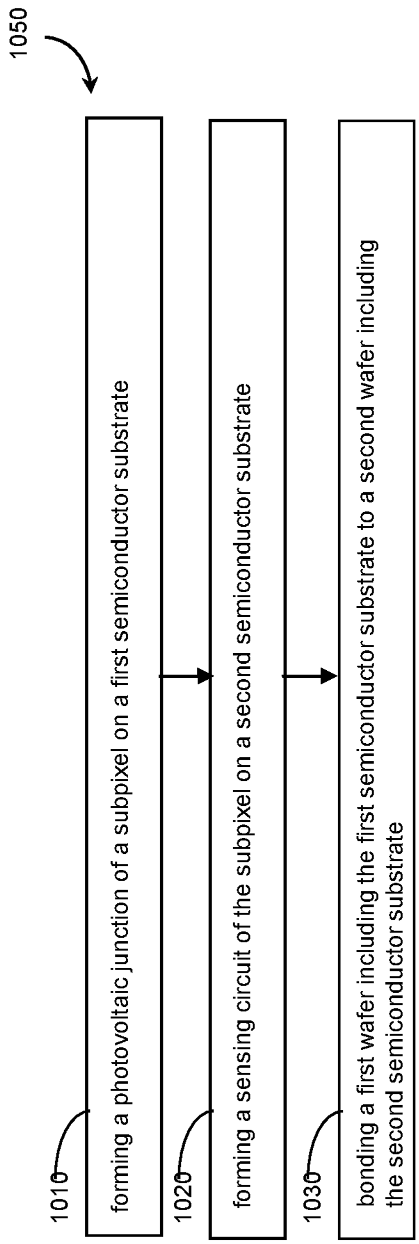
FIG. 10 is a third process flow diagram illustrating an exemplary process sequence for forming an image sensor shown in FIG. 3A or in FIG. 3B.

Referring to FIG. 10, a third process flow diagram 1050 illustrates an exemplary process sequence for forming an image sensor illustrated in FIG. 3A or in FIG. 3B. Referring to step 1010, a photovoltaic junction of a subpixel may be formed in a first semiconductor substrate 110 by performing the processing steps of FIGS. 2A-2I, 2K, and 2L, which correspond to the processing steps 921-929 and 930 in the second process flow diagram of FIG. 9. In this embodiment, field effect transistors (610, 630, 640) are not present on the first semiconductor substrate 110 as illustrated in FIGS. 3A and 3B. Referring to step 1020 and FIGS. 3A and 3B, the sensing circuit of the subpixel may be formed on a second semiconductor substrate 210, which may be a silicon substrate. The transfer transistor 610 for each photodetector may be formed on the second semiconductor substrate 210. Referring to step 1030 and FIGS. 3A and 3B, a first wafer including the first semiconductor substrate 110 and the first dielectric material layers 190 may be bonded to a second wafer including the second semiconductor substrate 210 and the second dielectric material layers 290 by wafer-to-wafer bonding. Subsequently, the first semiconductor substrate 110 may be thinned, and the bonded assembly can be subsequently diced. FIG. 3A illustrates an embodiment in which a silicon-containing capping structure comprises a passivation silicon region 340, and FIG. 3B illustrates an embodiment in which the silicon-containing capping structure comprises a silicon nitride capping structure 41.

Figure 11:
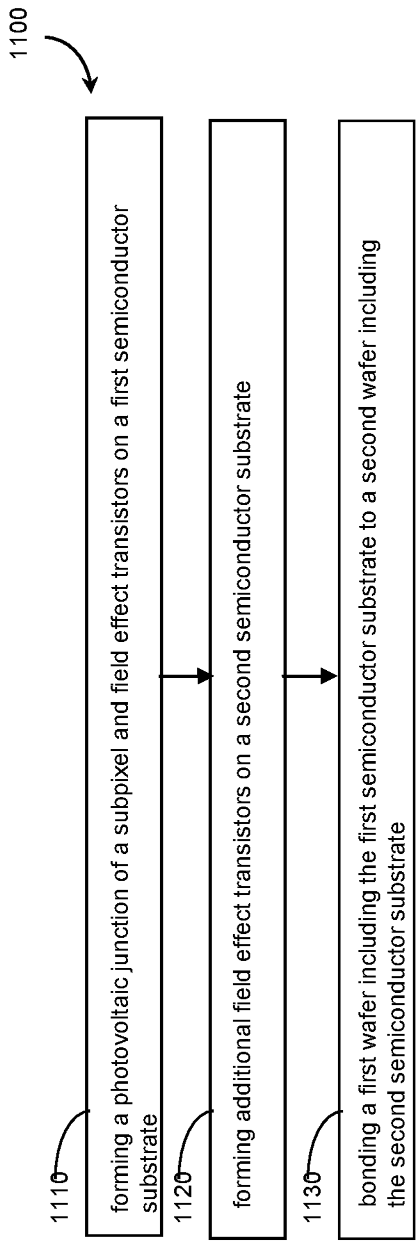
FIG. 11 is a fourth process flow diagram illustrating an exemplary process sequence for forming an image sensor shown in FIG. 4A or in FIG. 4B.

Referring to FIG. 11, a fourth process flow diagram 1100 illustrates an exemplary process sequence for forming an image sensor illustrated in FIG. 4A or in FIG. 4B. Referring to step 1110, a photovoltaic junction of a subpixel may be formed in a first semiconductor substrate 110 by performing the processing steps of FIGS. 2A-2L. In this case, field effect transistors are formed on the first semiconductor substrate 110 as illustrated in FIGS. 4A and 4B. Referring to step 1120 and FIGS. 4A and 4B, additional field effect transistors (630, 640) may be formed on a second semiconductor substrate 210, which may be a silicon substrate. The transfer transistor 610 for photodetector may be formed on the first semiconductor substrate 110, and field effect transistors for the sensing circuit can be formed on the first semiconductor substrate 110 and/or on the second semiconductor substrate 210. Referring to step 1130 and FIGS. 4A and 4B, a first wafer including the first semiconductor substrate 110 and the first dielectric material layers 190 may be bonded to a second wafer including the second semiconductor substrate 210 and the second dielectric material layers 290 by wafer-to-wafer bonding. Subsequently, the first semiconductor substrate 110 may be thinned, and the bonded assembly can be subsequently diced. FIG. 4A illustrates an embodiment in which a silicon-containing capping structure comprises a passivation silicon region 340, and FIG. 4B illustrates an embodiment in which the silicon-containing capping structure comprises a silicon nitride capping structure 41.

Figure 12:
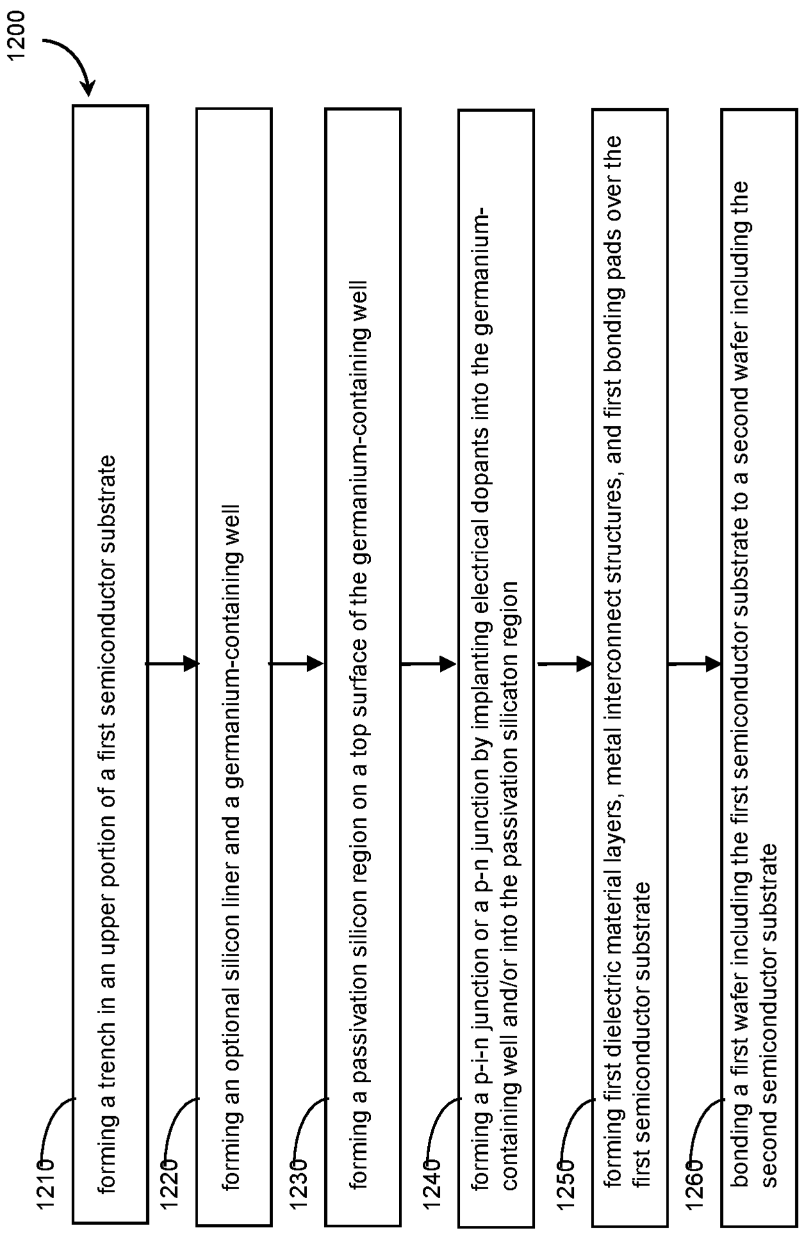
FIG. 12 is a fifth process flow diagram illustrating an exemplary process sequence for forming an image sensor shown in in FIGS. 5F and 6A-6F.

Referring to FIG. 12, a fifth process flow diagram 1200 illustrates an exemplary process sequence for forming an image sensor illustrated in in FIGS. 5F and 6A-6F. Referring to step 1210 and FIGS. 2A-2C, 5A, and 6A-6F, a trench 69 may be formed in an upper portion of a first semiconductor substrate 110 through an opening in a dielectric mask layer 12. A silicon liner 32 may be formed as illustrated in FIGS. 5F, 6C, 6E, or may be omitted as illustrated in FIGS. 6A, 6B, 6D, and 6F. Referring to step 1220 and FIGS. 2D, 2E, 2F, 2G, 5B, and 6A-6F, an optional silicon liner 32 and a germanium-containing well 30 can be formed. Referring to step 1230 and FIGS. 5C and 6A-6F, a passivation silicon region 340 can be formed on a top surface of the germanium-containing well 30 within an opening in the dielectric mask layer 12. Referring to step 1240 and FIGS. 5D and 6A-6F, electrical dopants can be implanted into upper portions of the germanium-containing well 30 and into the passivation silicon region 340 to form a p-i-n junction as illustrated in FIGS. 5D and 6A-6D, or to form a p-n junction as illustrated in FIGS. 6E and 6F. Referring to step 1250 and FIGS. 5E and 6A-6F, the dielectric mask layer 12 may be removed, and first dielectric material layers 190, metal interconnect structures 80, and first bonding pads 188 may be formed over the first semiconductor substrate 110. Referring to step 1260 and FIGS. 5F and 6A-6F, a first wafer including the first semiconductor substrate 110 and the first dielectric material layers 190 can be bonded to a second wafer including the second semiconductor substrate 210 and the second dielectric material layers 290 by wafer-to-wafer bonding. Subsequently, the first semiconductor substrate 110 may be thinned, and the bonded assembly can be subsequently diced.

Figure 13:
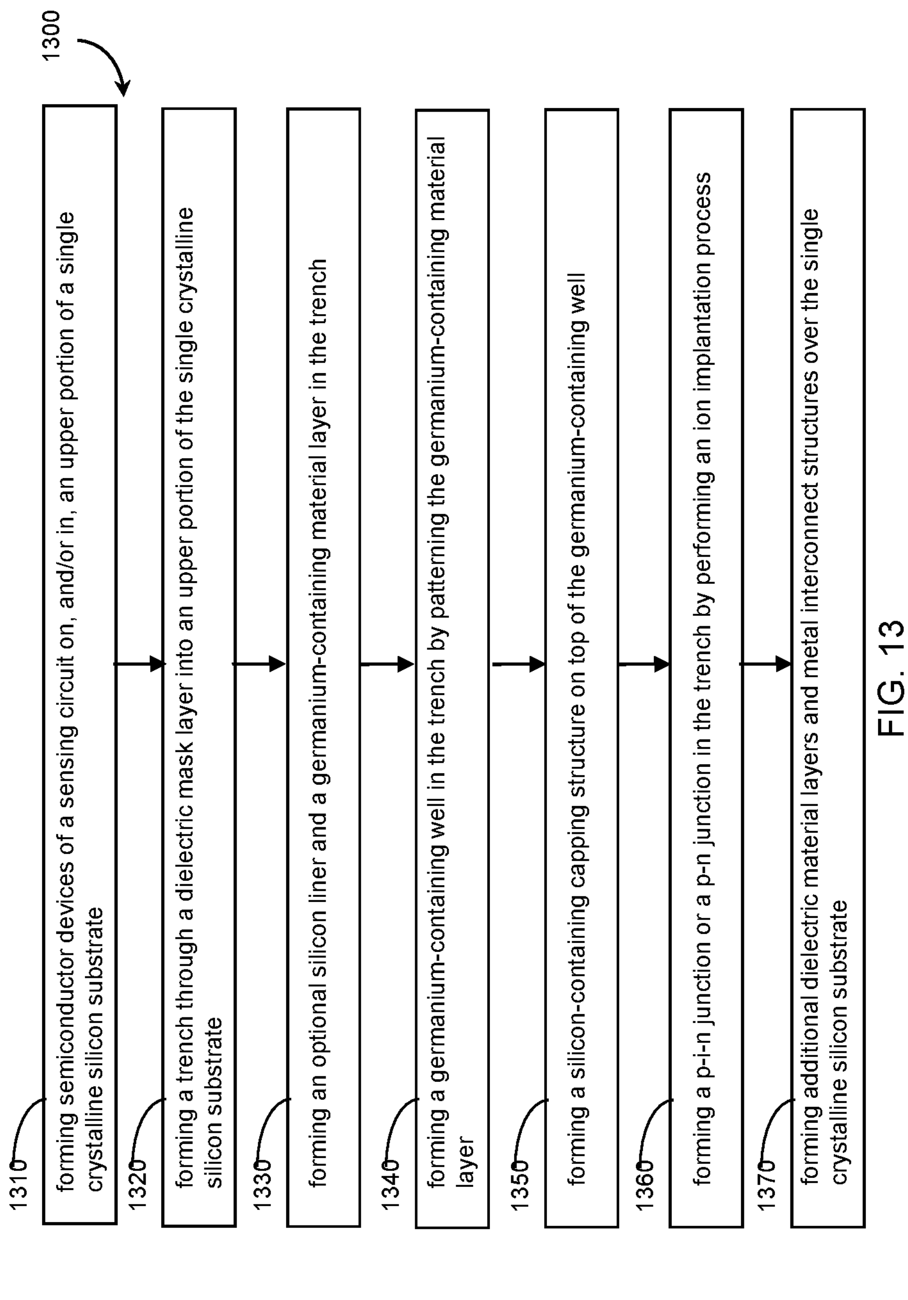
FIG. 13 is a sixth process flow diagram illustrating an exemplary process sequence for forming an image sensor shown in FIGS. 7G and 7H.

Referring to FIG. 13, a sixth process flow diagram 1300 illustrates an exemplary process sequence for forming an image sensor illustrated in FIGS. 7G and 7H. Referring to step 1310 and FIG. 7A, semiconductor devices of a sensing circuit may be formed on, and/or in, an upper portion of a single crystalline silicon substrate 10. Referring to step 1320 and FIG. 7B, a trench 69 may be formed through a dielectric mask layer 92 into an upper portion of the single crystalline silicon substrate 10. Referring to step 1330 and FIG. 7C, an optional silicon liner 32 and a germanium-containing material layer 30L can be formed in the trench 69. Referring to step 1340 and FIG. 7D, a germanium-containing well 30 may be formed in the trench 69 by patterning the germanium-containing material layer 30L. Referring to step 1350 and FIGS. 7E and 7H, a silicon-containing capping structure comprising a passivation silicon region 34 or a silicon nitride capping structure 41 can be formed on top of the germanium-containing well 30. Referring to step 1360 and FIGS. 7F and 7H, ion implantation processes may be performed to form a p-i-n junction or a p-n junction in the trench 69. Referring to step 1370 and FIGS. 7G and 7H, additional dielectric material layers 94 and metal interconnect structures 80 may be formed over the single crystalline silicon substrate 10 to provide electrical connection to and from the various nodes of the semiconductor devices and the photodetector.

The germanium-based photodetector of the present disclosure may provide high quantum efficiency in the infrared wavelength range. Further, the germanium-based photodetector of the present disclosure may provide higher operation speed and fast response for high-speed motion applications such as high-speed distance measurement compared to silicon-based photodetectors. The germanium-based photodetector of the present disclosure is integrated with standard CMOS logic devices (such as CMOS field effect transistors) to provide incorporation into a semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a photodetector, comprising:

forming a trench in a single crystalline silicon substrate;

performing an epitaxial deposition process that grows a germanium-containing well within the trench, wherein the germanium-containing well comprises a germanium-containing material that is in epitaxial alignment with the single crystalline silicon substrate;

vertically recessing an upper portion of the germanium-containing well in an upper portion of the trench;

forming a silicon-containing capping structure on a top surface of the germanium-containing well; and forming at least one photovoltaic junction within, or across, the trench by implanting dopants of a first conductivity type and dopants of a second conductivity type.

2. The method of claim 1, wherein:

dopants of the first conductivity type are implanted into a first portion of the germanium-containing well to form a first-conductivity-type germanium-containing region; and dopants of the second conductivity type are implanted into a second portion of the germanium-containing well to form a second-conductivity-type germanium-containing region.

3. The method of claim 2, wherein the at least one photovoltaic junction comprises a p-i-n junction or a p-n junction formed within the germanium-containing well.

4. The method of claim 1, wherein:

dopants of the first conductivity type are implanted through a sidewall and a bottom surface of the trench to form a first-conductivity-type silicon region within the single crystalline silicon substrate; and dopants of the second conductivity type are implanted into a portion of the germanium-containing well to form a second-conductivity-type germanium-containing region.

5. The method of claim 4, wherein the at least one photovoltaic junction comprises a p-i-n junction or a p-n junction formed across the germanium-containing well and the single crystalline silicon substrate.

6. The method of claim 1, further comprising:

forming a sensing circuit on the single crystalline silicon substrate or on a semiconductor substrate that is different from the single crystalline silicon substrate; and electrically connecting a second-conductivity-type germanium-containing region and the sensing circuit by forming metal interconnect structures on the second-conductivity-type germanium-containing region and the sensing circuit.

7. The method of claim 1, further comprising:

forming a first-conductivity-type silicon region contacting the first-conductivity-type germanium-containing region in a first region of the silicon-containing capping structure; and forming a second-conductivity-type silicon region contacting the second conductivity type germanium-containing region in a second region of the silicon-containing capping structure.

8. The method of claim 7, wherein a passivation silicon region having an atomic concentration of dopants in a range from $1.0\times10^{13}/cm^3$ to $1.0\times10^{17}/cm^3$ is located between the first-conductivity-type silicon region and the second-conductivity-type silicon region after formation of the first-conductivity-type silicon region and the second-conductivity-type silicon region.

9. The method of claim 1, further comprising forming a single crystalline silicon liner on sidewalls and a bottom surface of the trench, wherein:

the single crystalline silicon liner is epitaxially aligned to the single crystalline silicon substrate; and the germanium-containing well is formed on an inner sidewall of the single crystalline silicon liner.

10. The method of claim 1, wherein the at least one photovoltaic junction comprises two or more p-n junctions containing two or more p-doped germanium-containing regions and two or more n-doped germanium-containing regions.

11. A method of forming a semiconductor structure, the method comprising:

forming a trench in an upper portion of a single crystalline silicon substrate;

forming a first-conductivity-type silicon region around the trench within the single crystalline silicon substrate;

forming a germanium-containing well in the trench;

forming a silicon-containing capping structure on a top surface of the germanium-containing well;

forming a second-conductivity-type germanium-containing region by doping an upper portion of the germanium-containing well with dopants of a second conductivity type; and forming field effect transistors in a photodetector region and in a sensing circuit region on the single crystalline silicon substrate.

12. The method of claim 11, further comprising:

epitaxially depositing a germanium-containing material in the trench, wherein the germanium-containing material is epitaxially aligned to the single crystalline silicon substrate; and vertically recessing the germanium-containing material, wherein a remaining portion of the germanium-containing material comprises the germanium-containing well.

13. The method of claim 11, further comprising growing a silicon liner comprising single crystalline silicon from sidewalls and a bottom surface of the trench, wherein the germanium-containing well is formed inside the silicon liner.

14. The method of claim 11, further comprising forming dielectric material layers and metal interconnect structures over the field effect transistors, wherein the metal interconnect structures comprise metal via structures that are electrically connected to a respective one of the first-conductivity-type silicon region and the second-conductivity-type germanium-containing region.

15. A method of forming a photodetector, comprising:

depositing and patterning a dielectric mask layer over a single crystalline silicon substrate;

etching a trench in the single crystalline silicon substrate through an opening in the dielectric mask layer;

performing an epitaxial deposition process that grows a germanium-containing material, whereby a germanium-containing well is formed within the trench;

forming a silicon-containing capping structure on a top surface of the germanium-containing well; and forming a photovoltaic junction within, or across, the trench by implanting dopants of a first conductivity type and dopants of a second conductivity type.

16. The method of claim 15, wherein a portion of the germanium-containing material that grows within the trench is formed with epitaxial alignment with the single crystalline silicon substrate within the trench.

17. The method of claim 16, further comprising:

removing excess portions of the germanium-containing material from above a horizontal plane including a top surface of the dielectric mask layer; and the method comprises vertically recessing a remaining portion of the germanium-containing material within the opening in the dielectric mask layer.

18. The method of claim 15, further comprising:

forming a first-conductivity-type germanium-containing region by implanting dopants of the first conductivity type into a first portion of the germanium-containing well; and forming a second-conductivity-type germanium-containing region by implanting dopants of the second conductivity type into a second portion of the germanium-containing well.

19. The method of claim 18, wherein the photovoltaic junction comprises a p-i-n junction or a p-n junction formed within the germanium-containing well.

20. The method of claim 15, further comprising:

forming a first-conductivity-type silicon region by implanting dopants of the first conductivity type through a sidewall and a bottom surface of the trench into the single crystalline silicon substrate; and forming a second-conductivity-type germanium-containing region by implanting dopants of the second conductivity type into a portion of the germanium-containing well, wherein the photovoltaic junction comprises a p-i-n junction or a p-n junction that is formed across the germanium-containing well and the single crystalline silicon substrate.

* * * * *